(12) United States Patent
Fujita

(10) Patent No.: US 8,705,292 B2
(45) Date of Patent: Apr. 22, 2014

(54) NONVOLATILE MEMORY CIRCUIT WITH AN OXIDE SEMICONDUCTOR TRANSISTOR FOR REDUCING POWER CONSUMPTION AND ELECTRONIC DEVICE

(75) Inventor: Masashi Fujita, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 125 days.

(21) Appl. No.: 13/466,842

(22) Filed: May 8, 2012

(65) Prior Publication Data
US 2012/0287702 A1 Nov. 15, 2012

(30) Foreign Application Priority Data
May 13, 2011 (JP) ................................. 2011-107831

(51) Int. Cl.
*G11C 11/34* (2006.01)
(52) U.S. Cl.
USPC ............................ 365/188; 365/227; 365/228
(58) Field of Classification Search
USPC .......................... 365/188, 174, 227, 228, 226
See application file for complete search history.

(56) References Cited

U.S. PATENT DOCUMENTS

| | | | |
|---|---|---|---|
| 3,775,693 A | 11/1973 | Proebsting | |
| 4,800,303 A | 1/1989 | Graham et al. | |
| 5,039,883 A | 8/1991 | On | |
| 5,218,607 A | 6/1993 | Saito et al. | |
| 5,731,856 A | 3/1998 | Kim et al. | |
| 5,744,864 A | 4/1998 | Cillessen et al. | |
| 5,980,092 A | 11/1999 | Merryman et al. | |
| 6,049,883 A | 4/2000 | Tjandrasuwita | |
| 6,078,194 A | 6/2000 | Lee | |
| 6,127,702 A | 10/2000 | Yamazaki et al. | |
| 6,204,695 B1 | 3/2001 | Alfke et al. | |
| 6,281,710 B1 | 8/2001 | Poirier et al. | |
| 6,294,274 B1 | 9/2001 | Kawazoe et al. | |
| 6,479,329 B2 | 11/2002 | Nakajima et al. | |

(Continued)

FOREIGN PATENT DOCUMENTS

| | | |
|---|---|---|
| EP | 0 404 061 A2 | 12/1990 |
| EP | 1 737 044 A1 | 12/2006 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

Primary Examiner — Andrew Q Tran
(74) Attorney, Agent, or Firm — Fish & Richardson P.C.

(57) ABSTRACT

To provide a nonvolatile memory circuit having a novel structure. A first memory circuit, a second memory circuit, a first switch, a second switch, and a phase inverter circuit are included. The first memory circuit includes a first transistor formed using an oxide semiconductor film, a second transistor, a third transistor, and a capacitor. The first transistor formed using an oxide semiconductor film and the capacitor are used to form the nonvolatile memory circuit. Reductions in number of power supply lines and signal lines which are connected to the memory circuit and transistors used in the memory circuit allow a reduction in circuit scale of the nonvolatile memory circuit.

15 Claims, 31 Drawing Sheets

(56) References Cited

U.S. PATENT DOCUMENTS

| | | | |
|---|---|---|---|
| 6,563,174 B2 | 5/2003 | Kawasaki et al. | |
| 6,573,754 B2 | 6/2003 | Menczigar et al. | |
| 6,727,522 B1 | 4/2004 | Kawasaki et al. | |
| 6,788,567 B2 | 9/2004 | Fujimori | |
| 6,822,478 B2 | 11/2004 | Elappuparackal | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,076,748 B2 | 7/2006 | Kapoor et al. | |
| 7,105,868 B2 | 9/2006 | Nause et al. | |
| 7,211,825 B2 | 5/2007 | Shih et al | |
| 7,269,780 B2 | 9/2007 | Arima et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,582 B2 | 8/2009 | Lee et al. | |
| 7,674,650 B2 | 3/2010 | Akimoto et al. | |
| 7,732,819 B2 | 6/2010 | Akimoto et al. | |
| 8,422,272 B2 * | 4/2013 | Inoue et al. | 365/149 |
| 8,582,348 B2 * | 11/2013 | Inoue et al. | 365/149 |
| 2001/0013796 A1 | 8/2001 | Li et al. | |
| 2001/0046027 A1 | 11/2001 | Tai et al. | |
| 2002/0036529 A1 | 3/2002 | Furusawa et al. | |
| 2002/0056838 A1 | 5/2002 | Ogawa | |
| 2002/0132454 A1 | 9/2002 | Ohtsu et al. | |
| 2003/0036529 A1 | 2/2003 | Christianson et al. | |
| 2003/0052730 A1 | 3/2003 | Hoshi et al. | |
| 2003/0129853 A1 | 7/2003 | Nakajima et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0105302 A1 | 6/2004 | Fujimori | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0038582 A1 | 2/2006 | Peeters | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0119394 A1 | 6/2006 | Dronavalli | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0024318 A1 | 2/2007 | Mamidipaka | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0161165 A1 | 7/2007 | Liu et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0206959 A1 | 8/2008 | Takayama et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0027083 A1 | 1/2009 | Kimura et al. | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0256784 A1 | 10/2009 | Ahn | |
| 2009/0278122 A1 | 11/2009 | Hosono et al. | |
| 2009/0280600 A1 | 11/2009 | Hosono et al. | |
| 2009/0310734 A1 | 12/2009 | Umezaki | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0010493 A1 | 1/2011 | Kimura et al. | |
| 2011/0062992 A1 | 3/2011 | Okazaki et al. | |
| 2011/0069047 A1 | 3/2011 | Koyama et al. | |
| 2011/0084731 A1 | 4/2011 | Kawae | |
| 2011/0089975 A1 | 4/2011 | Yamazaki et al. | |
| 2011/0090184 A1 | 4/2011 | Yamazaki et al. | |
| 2011/0101332 A1 | 5/2011 | Yamazaki et al. | |
| 2011/0102018 A1 | 5/2011 | Shionoiri et al. | |
| 2011/0121878 A1 | 5/2011 | Kato et al. | |
| 2011/0156027 A1 | 6/2011 | Yamazaki et al. | |
| 2011/0285372 A1 | 11/2011 | Takahashi et al. | |
| 2011/0285426 A1 | 11/2011 | Takahashi et al. | |
| 2011/0285442 A1 | 11/2011 | Saito | |
| 2012/0032785 A1 | 2/2012 | Kamata | |
| 2012/0057396 A1 | 3/2012 | Yamazaki et al. | |
| 2012/0140550 A1 | 6/2012 | Endo et al. | |
| 2012/0170355 A1 | 7/2012 | Ohmaru et al. | |

FOREIGN PATENT DOCUMENTS

| | | |
|---|---|---|
| EP | 2 226 847 A2 | 9/2010 |
| JP | 58-205226 A | 11/1983 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-078836 A | 3/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |

(56) References Cited

FOREIGN PATENT DOCUMENTS

| | | |
|---|---|---|
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Miyasaka, M, "SUFTLA Flexible Microelectronics on Their Way to Business," SID Digest '07 : SID International Symposium Digest of Technical Papers, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Orita, M et al., "Amorphous transparent conductive oxide InGaO3(ZnO)m (m<4):a Zn4s conductor," Philosophical Magazine, 2001, vol. 81, No. 5, pp. 501-515.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

(56) References Cited

OTHER PUBLICATIONS

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Rhyne; "Fundamentals of Digital Systems Design"; 1973; pp. 70-71; N.J.
Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center (with full English translation).
Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.
Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.
Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.
Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.
Sanhun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.
Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09: SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.
Hayashi, R et al., "42.1: Invited Paper: Improved Amorphous In-Ga-Zn-O TFTs," SID Digest '08: SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID, 2007, vol. 15, No. 1, pp. 17-22.
Hosono: H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper: Transparent Amorphous Oxide Semiconductors for High Performance TFT," SID Digest '07: SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.
Ikeda., T et al., "Full-Functional System Liquid Crystal Display Using CG-Silicon Technology," SID Digest '04: SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Jin, D et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214TH ECS Meeting, 2008, No. 2317, 1 page.
Kimizuka, N. et al., "Spinel, YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu, or Zn] at Temperatures Over 1000° C," Journal of Solid State Chemistry, 1985, vol. 60, pp. 382-384.
Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

(56) References Cited

OTHER PUBLICATIONS

Lee, H et al., "Current Status of, Challenges to, and Perspective View of AM-OLED," IDW '06: Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C et al., "Modulated Structures of Homologous Compounds InMO3(ZnO)m (M=In, Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl, Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasak, M, "SUFTLA Flexible Microelectronics on their Way to Business, " SID Digest '07: SID International Symposium Digest of Technical Papers, 2007, vol. 38, pp. 1673-1676.

Mo, Y et al., "Amorphous Oxide TFT Backplanes for Large Size AMOLED Displays," IDW '08: Proceedings of the 6th International Display Workshops, Dec. 3, 2008, pp. 581-584.

Nakamura, "Synthesis of Homologous Compound with New Long-Period Structure, " NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors." Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09: SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4): a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09: Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08: SID International Symposium Digest of Technical Papers, May 20, 2008, vol. 39, pp. 633-636.

Takahashi, M et al., "Theoretical Analysis of Igzo Transparent Amorphous Oxide Semiconductor," IDW '08: Proceedings of the 15th International Display Workshops, Dec. 3, 2008, pp. 1637-1640.

Tsuda, K et al., "Ultra Low Power Consumption Technologies for Mobile TFT-LCDs," IDW '02: Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

FIG. 22A
FIG. 22B
FIG. 22C
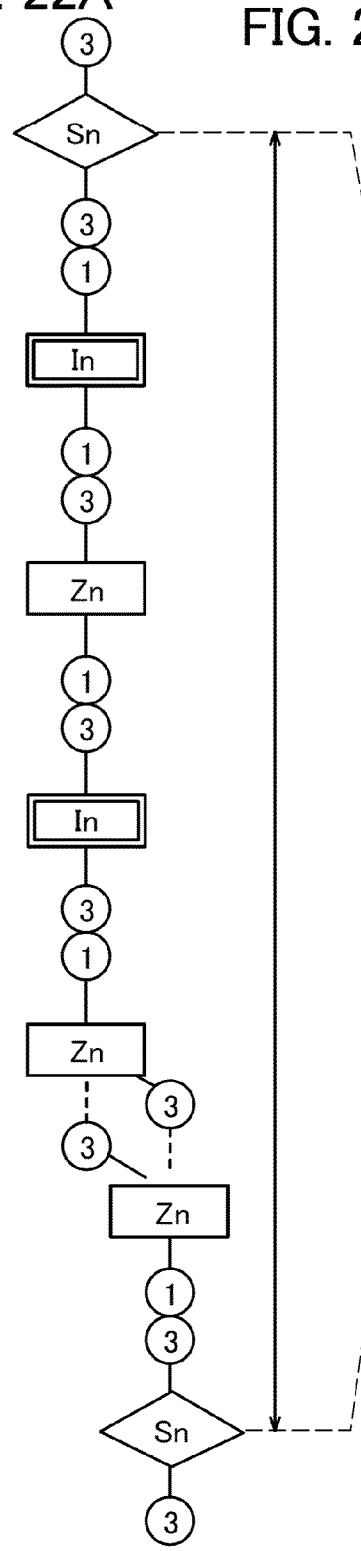
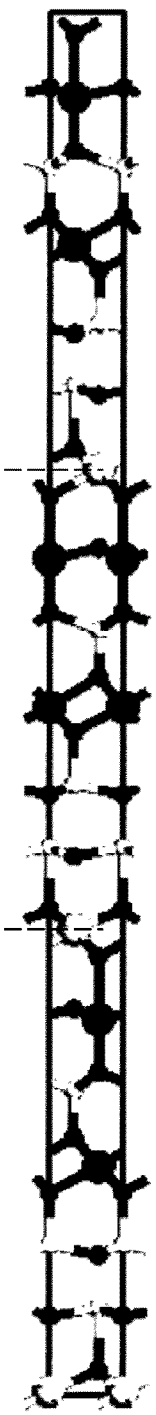
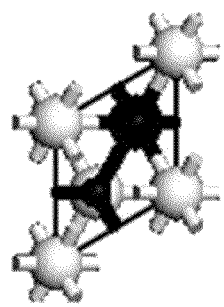
- In
- Sn
- Zn
- O

FIG. 23A  FIG. 23B
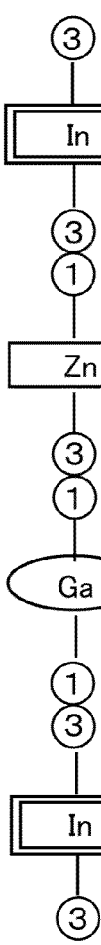
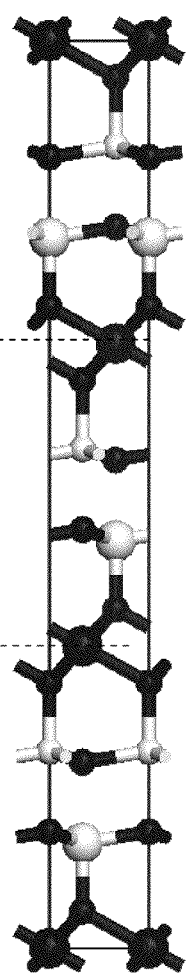
FIG. 23C
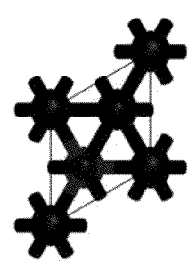
● In
○ Ga
○ Zn
● O

US 8,705,292 B2

NONVOLATILE MEMORY CIRCUIT WITH AN OXIDE SEMICONDUCTOR TRANSISTOR FOR REDUCING POWER CONSUMPTION AND ELECTRONIC DEVICE

BACKGROUND OF THE INVENTION

1. Field of the Invention

The present invention relates to a nonvolatile memory circuit that does not lose a stored logical state even after the power is turned off. The present invention also relates to an electronic device including the memory circuit.

2. Description of the Related Art

Signal processing circuits such as central processing units (CPUs) vary in structure depending on the intended use. A signal processing circuit generally has a main memory for storing data or program and other memory circuits such as a register and a cache memory.

In a memory circuit such as a register or a cache memory, data reading and data writing need to be performed at higher speed than in a main memory. Thus, in general, a flip-flop circuit is used as a register, and a static random access memory (SRAM) or the like is used as a cache memory. In other words, such a register, a cache memory, and the like are volatile memory circuits which lose data after the application of source voltage is stopped.

In order to reduce power consumption, a method has been suggested in which the application of source voltage to a signal processing circuit is temporarily stopped while input/output of data is not conducted. In the method, a nonvolatile memory circuit is located on the periphery of a volatile memory circuit such as a register or a cache memory, and the data is temporarily stored in the nonvolatile memory circuit. Thus, the register, the cache memory, or the like in the signal processing circuit holds the data even while the application of source voltage is stopped (see Patent Document 1, for example).

In the case where the application of source voltage to a signal processing circuit is stopped for a long time, data in a volatile memory circuit is transferred to an external storage device such as a hard disk or a flash memory before the application of source voltage is stopped, so that the data can be prevented from being lost.

REFERENCE

[Patent Document 1] Japanese Published Patent Application No. H10-078836

SUMMARY OF THE INVENTION

In the signal processing circuit disclosed in Patent Document 1, a ferroelectric is used for a storage element included in a nonvolatile memory circuit. In a storage element including a ferroelectric, the repetition of data writing might cause ferroelectric material fatigue, leading to a writing error or the like. As a result, the number of times of rewriting is limited. In addition, the data processing speed (hereinafter also referred to as access speed), for example, the speed of reading and writing data is low.

In the case where a flash memory is used for a nonvolatile memory circuit, a high voltage is applied to generate a tunnel current, whereby injection or release of electrons is performed. Therefore, there are problems such as significant deterioration of storage elements due to the repetition of data rewriting, so that the number of times of rewriting is limited. In addition, the access speed is low.

In the case where a flip-flop circuit is used for a register which is one of volatile memory circuits, the circuit scale becomes large. Further, when the flip-flop circuit is formed using transistors, the number of transistors used for the memory circuit is large.

In view of the above problems, an object of one embodiment of the present invention is to provide a memory circuit having a novel structure where a stored logic state is maintained even after the power is turned off. Another object of one embodiment of the present invention is to provide a nonvolatile memory circuit with a small circuit scale by reduction in number of power supply lines and signal lines which are connected to the memory circuit and transistors used in the memory circuit.

One embodiment of the present invention includes a first memory circuit, a second memory circuit, a first switch, a second switch, and a phase inverter circuit. The first memory circuit includes a first transistor formed using an oxide semiconductor film, a second transistor, a third transistor, and a capacitor. The first transistor formed using an oxide semiconductor film and the capacitor are used to form the nonvolatile memory circuit. Reductions in number of power supply lines and signal lines which are connected to the memory circuit and transistors used in the memory circuit allow a reduction in circuit scale of the nonvolatile memory circuit. Details thereof will be described below.

One embodiment of the present invention is a memory circuit including a first memory circuit, a second memory circuit, a first switch, a second switch, and a phase inverter circuit. The first memory circuit includes a first transistor, a second transistor, a third transistor, and a capacitor. The first transistor is formed using an oxide semiconductor. One of a source electrode and a drain electrode of the first transistor is connected to a first signal line to which a first control signal is input. The other of the source electrode and the drain electrode of the first transistor is connected to one electrode of the capacitor and a gate electrode of the second transistor. The other electrode of the capacitor is grounded. A gate electrode of the first transistor is connected to a second signal line to which a second control signal is input. An input terminal of the phase inverter circuit is connected to the second signal line. An output terminal of the phase inverter circuit is connected to an input terminal of the first switch. A first terminal of the phase inverter circuit is connected to a power supply line to which source voltage is applied. A second terminal of the phase inverter circuit is grounded. A first terminal of the first switch is connected to the power supply line. A second terminal of the first switch is connected to one of a source electrode and a drain electrode of the second transistor. The other of the source electrode and the drain electrode of the second transistor is grounded. A gate electrode of the third transistor is connected to a gate electrode of the second transistor. One of a source electrode and a drain electrode of the third transistor is connected to the power supply line. The other of the source electrode and the drain electrode of the third transistor is connected to an output terminal of the first switch. A first terminal of the second switch is connected to the output terminal of the phase inverter circuit. A second terminal of the second switch is connected to the second signal line. The output terminal of the first switch is connected to the second memory circuit through the second switch.

One embodiment of the present invention is a memory circuit including a first memory circuit, a second memory circuit, a first switch, a second switch, and a phase inverter circuit. The first memory circuit includes a first transistor, a capacitor, a second transistor, and a third transistor. The first switch includes a fourth transistor and a fifth transistor. The first transistor is formed using an oxide semiconductor. One of a source electrode and a drain electrode of the first transistor is connected to a first signal line to which a first control signal is input. The other of the source electrode and the drain electrode of the first transistor is connected to one electrode of the capacitor and a gate electrode of the second transistor. The other electrode of the capacitor is grounded. A gate electrode of the first transistor is connected to a second signal line to which a second control signal is input. An input terminal of the phase inverter circuit is connected to the second signal line. An output terminal of the phase inverter circuit is connected to a gate electrode of the fourth transistor and a gate electrode of the fifth transistor. A first terminal of the phase inverter circuit is connected to a power supply line to which source voltage is applied. A second terminal of the phase inverter circuit is grounded. One of a source electrode and a drain electrode of the fourth transistor is connected to the power supply line. The other of the source electrode and the drain electrode of the fourth transistor is connected to one of a source electrode and a drain electrode of the fifth transistor. The other of the source electrode and the drain electrode of the fifth transistor is connected to one of a source electrode and a drain electrode of the second transistor. The other of the source electrode and the drain electrode of the second transistor is grounded. A gate electrode of the third transistor is connected to a gate electrode of the second transistor. One of a source electrode and a drain electrode of the third transistor is connected to the power supply line. The other of the source electrode and the drain electrode of the third transistor is connected to the other of the source electrode and the drain electrode of the fourth transistor and the one of the source electrode and the drain electrode of the fifth transistor. A first terminal of the second switch is connected to the output terminal of the phase inverter circuit. A second terminal of the second switch is connected to the second signal line. The other of the source electrode and the drain electrode of the fourth transistor and the one of the source electrode and the drain electrode of the fifth transistor are connected to the second memory circuit through the second switch.

In any of the above structures, the first transistor may be formed using an oxide semiconductor material containing In, Ga, and Zn or an oxide semiconductor material containing In, Sn, and Zn.

One embodiment of the present invention is an electronic device including the memory circuit having the above structure.

The use of the nonvolatile memory circuit having the novel structure permits long-time retention of data in a memory circuit even after the stop of the supply of source voltage. Thus, a normally-off driving method can be performed. Consequently, power consumption of the memory circuit can be reduced significantly.

Further, reductions in number of power supply lines and signal lines which are connected to the nonvolatile memory circuit having the novel structure and transistors used in the memory circuit allow a reduction in circuit scale of the nonvolatile memory circuit.

BRIEF DESCRIPTION OF THE DRAWINGS

In the accompanying drawings:

FIGS. 22A to 22C illustrate a structure of an oxide material according to one embodiment of the present invention;

FIGS. 23A to 23C illustrate a structure of an oxide material according to one embodiment of the present invention;

DETAILED DESCRIPTION OF THE INVENTION

Figure 1:
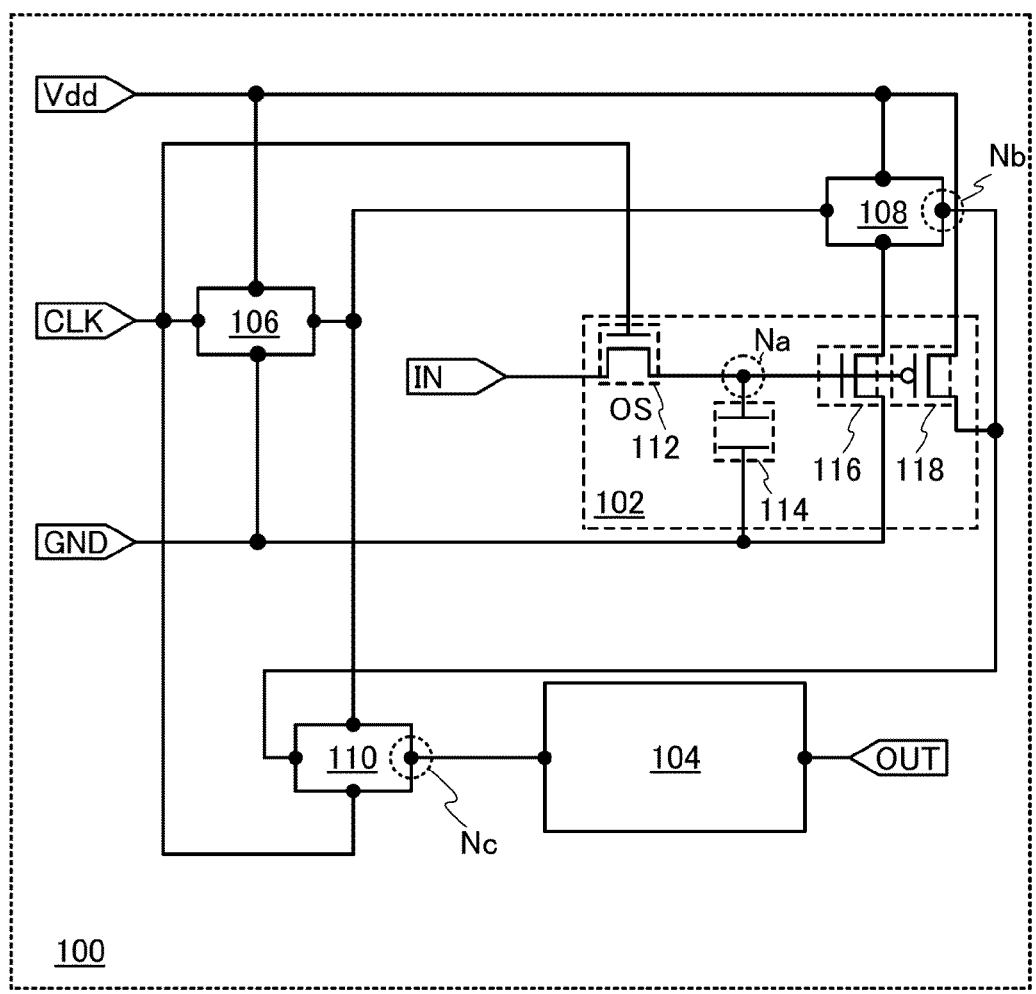
FIG. 1 illustrates a configuration of a memory circuit.

Embodiments will be described below with reference to the accompanying drawings. Note that the present invention is not limited to the following description and it is easily understood by those skilled in the art that the mode and details can be modified in various ways without departing from the spirit and scope of the present invention. Therefore, the present invention is not construed as being limited to description of the embodiments described below.

Functions of a "source" and a "drain" are sometimes replaced with each other when a transistor of opposite polarity is used or when the direction of a current flow is changed in circuit operation, for example. Therefore, the terms "source" and "drain" can be replaced with each other in this specification.

Note that a voltage refers to a potential difference between a given potential and a reference potential (e.g., a ground potential) in many cases. Accordingly, voltage, potential, and a potential difference can be referred to as potential, voltage, and a voltage difference, respectively, in this specification.

The terms "over" and "below" do not necessarily mean "directly on" and "directly under", respectively, in the description of a positional relation between components. For example, the expression "a gate electrode over a gate insulating layer" can mean the case where there is an additional component between the gate insulating layer and the gate electrode.

The position, the size, the range, or the like of each component illustrated in drawings and the like is not accurately represented in some cases for the sake of simplification. Therefore, the disclosed invention is not necessarily limited to the position, the size, the range, or the like disclosed in the drawings and the like.

The ordinal numbers such as "first", "second", and "third" are used in order to avoid confusion among components.

(Embodiment 1)

One embodiment of the present invention will be described with reference to FIG. 1. FIG. 1 illustrates an example of a circuit configuration of a memory circuit 100 according to one embodiment of the present invention.

<Circuit Configuration of Memory Circuit>

The memory circuit 100 in FIG. 1 includes a first memory circuit 102, a second memory circuit 104, a first switch 108, a second switch 110, and a phase inverter circuit 106. The first memory circuit 102 includes a first transistor 112, a capacitor 114, a second transistor 116, and a third transistor 118.

The first transistor 112 is formed using an oxide semiconductor. One of a source electrode and a drain electrode of the first transistor 112 is connected to a first signal line to which a first control signal (IN) is input, and the other is connected to one electrode of the capacitor 114 and a gate electrode of the second transistor 116. The other electrode of the capacitor 114 is grounded.

As the first transistor 112 is formed using an oxide semiconductor (OS), the first transistor 112 in FIG. 1 is denoted by "OS".

In addition, in FIG. 1, a connection portion of the capacitor 114 and the other of the source electrode and the drain electrode of the first transistor 112 is represented by a node a (Na). When the first transistor 112 is turned off, a potential supplied to the node a (Na) and the one electrode of the capacitor 114 can be held.

The first transistor 112 in which a channel formation region is formed using an oxide semiconductor has a significantly low off-state current. The off-state current of the first transistor 112 formed using the oxide semiconductor is smaller than or equal to one hundred thousandth of the off-state current of a transistor formed using a silicon semiconductor or the like; thus, loss of charge accumulated at the node a (Na) due to a leakage current of the first transistor 112 is negligible. That is, the first transistor 112 formed using an oxide semiconductor makes it possible to obtain a nonvolatile memory circuit which can store data even without being supplied with power.

A gate electrode of the first transistor 112 is connected to a second signal line to which a second control signal (CLK) is input.

An input terminal of the phase inverter circuit 106 is connected to the second signal line to which the second control signal (CLK) is input. An output terminal of the phase inverter circuit 106 is connected to an input terminal of the first switch 108. A first terminal of the phase inverter circuit 106 is connected to a power supply line to which a source voltage (Vdd) is applied. A second terminal of the phase inverter circuit 106 is grounded. The term "grounded" means that, for example, a terminal is electrically connected to a ground line (GND) in this specification.

The phase inverter circuit 106 outputs a clock inversion signal (CLKB) which is the inversion of the clock signal (CLK) input. An inversion signal is at a low-level potential (also referred to as a low potential) when the potential of a signal input is a high-level potential (also referred to as a high potential), and is at a high-level potential when the potential of a signal input is a low-level potential.

The input terminal of the first switch 108 is connected to the output terminal of the phase inverter circuit 106. The output terminal of the first switch 108 is connected to an input terminal of the second switch 110. A first terminal of the first switch 108 is connected to the power supply line to which the source voltage (Vdd) is applied. A second terminal of the first switch 108 is connected to one of a source electrode and a drain electrode of the second transistor 116. The other of the source electrode and the drain electrode of the second transistor 116 is grounded.

The first switch 108 is given the clock inversion signal (CLKB). When the clock inversion signal (CLKB) is at a low-level potential, precharging of the source voltage (Vdd) is performed on a node b (Nb). Meanwhile, when the clock inversion signal (CLKB) is at a high-level potential, the node b (Nb) depends on the state of the node a (Na). For example, when the node a (Na) is at a low-level potential, the second transistor 116 is turned off and the node b (Nb) remains in the previous potential state. When the node a (Na) is at a high-level potential, the second transistor 116 is turned on and the node b (Nb) is at a low-level potential.

A gate electrode of the third transistor 118 is connected to the gate electrode of the second transistor 116. One of a source electrode and a drain electrode of the third transistor 118 is connected to a power supply line, and the other of the source electrode and the drain electrode of the third transistor 118 is connected to the output terminal of the first switch 108.

A first terminal of the second switch 110 is connected to the output terminal of the phase inverter circuit 106. A second terminal of the second switch 110 is connected to the second signal line to which the second control signal (CLK) is input. The output terminal of the first switch 108 is connected to the second memory circuit 104 through the second switch 110. The second memory circuit 104 is connected to a third signal line from which an output signal (OUT) is output.

The second switch 110 is given the clock signal (CLK) and the clock inversion signal (CLKB). When the clock signal (CLK) is at a low-level potential and the inversion clock signal (CLKB) is at a high-level potential, the second switch 110 is turned on.

In FIG. 1, a connection portion of the first switch 108 and the second switch 110 is represented by the node b (Nb), and a connection portion of the second switch 110 and the second memory circuit 104 is represented by a node c (Nc).

<Driving Method of Memory Circuit>

Figure 2:
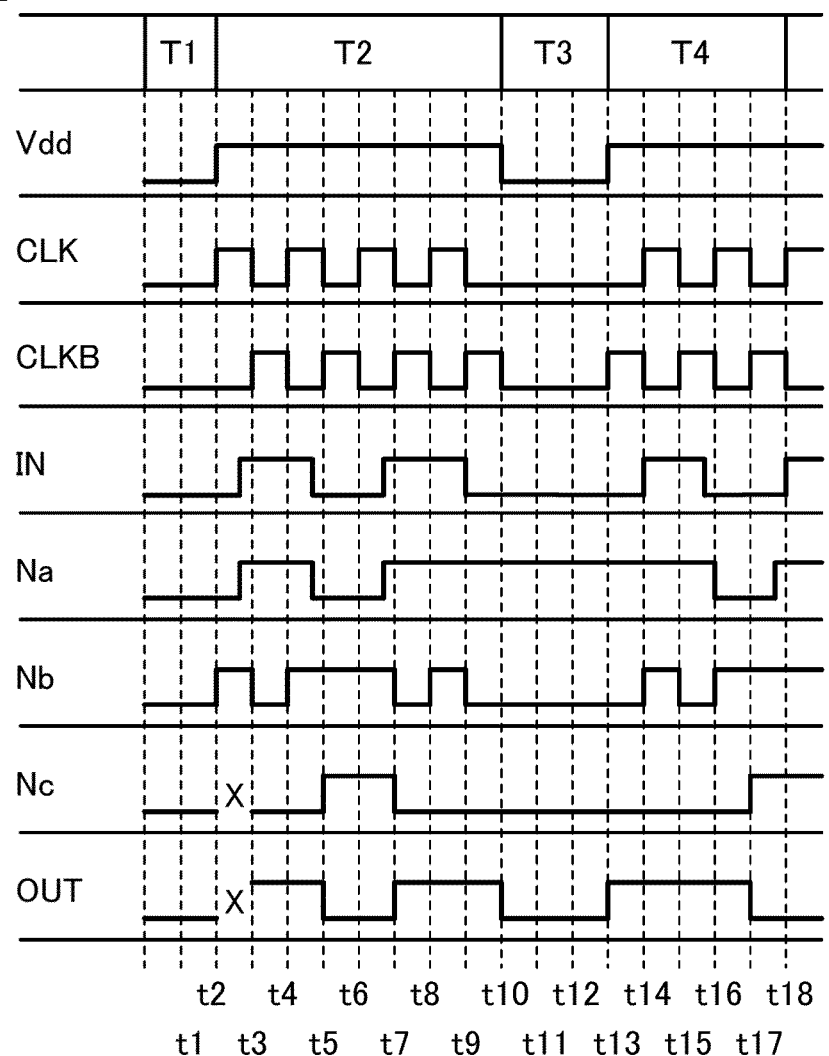
FIG. 2 is a timing chart showing a driving method of a memory circuit.
Figure 3:
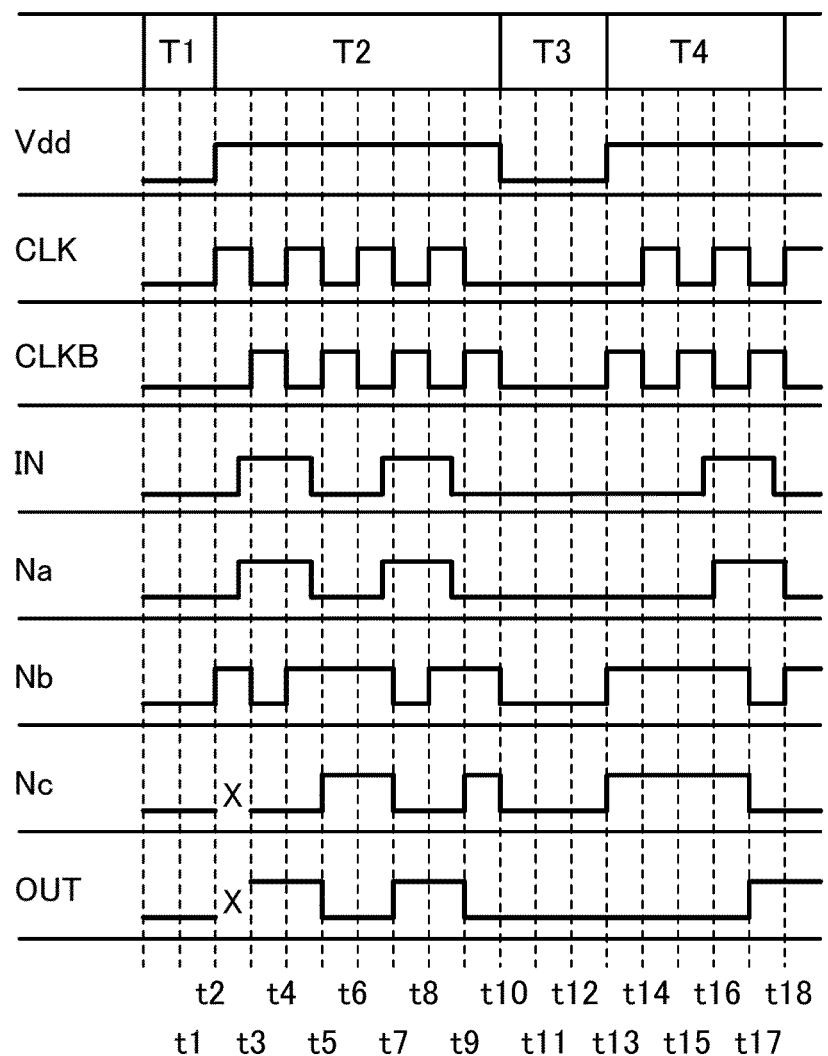
FIG. 3 is a timing chart showing a driving method of a memory circuit.

Here, methods for driving the memory circuit 100 in FIG. 1 will be described with reference to FIG. 2 and FIG. 3. In examples of the methods for driving the memory circuit 100, after source voltage is applied, the application of source voltage is stopped to reduce power consumption, and the application of source voltage is resumed. FIG. 2 and FIG. 3 are timing charts each showing the method for driving the memory circuit 100. FIG. 2 is a timing chart in the case where data stored after the application of source voltage is at a high-level potential, and FIG. 3 is a timing chart in the case where data stored after the application of source voltage is at a low-level potential.

In the timing charts in FIG. 2 and FIG. 3, Vdd represents a source voltage (Vdd); CLK represents a clock signal (CLK), a second control signal; CLKB represents a clock inversion signal (CLKB); IN represents an input signal (IN), a first control signal; Na represents a signal (Na) at the node a; Nb represents a signal (Nb) at the node b; Nc represents a signal (Nc) at the node c; and OUT represents an output signal (OUT) from an output terminal. The case where Vdd is 0 V (corresponding to a low-level potential in the charts) corresponds to the case where source voltage is not applied.

In FIG. 2 and FIG. 3, a first period (denoted as T1 in the charts) is a period of an initial state before the application of the source voltage; a second period (denoted as T2 in the charts) is a period in which normal operation is performed after the application of the source voltage; a third period (denoted as T3 in the charts) is a period in which the application of the source voltage is being stopped; and a fourth period (denoted as T4 in the charts) is a period in which the application of the source voltage is resumed. In FIG. 2, times in the first to fourth periods (T1 to T4) are represented by times t1 to t18.

In FIG. 2 and FIG. 3, X represents an indeterminate signal potential. An indeterminate signal potential means that the potential of the node c (Nc) and an output potential (OUT) can be either a high-level potential or a low-level potential because the second switch 110 is off directly after power is supplied.

First, the case where data stored after the application of source voltage is at a high-level potential will be described with reference to the timing chart in FIG. 2.

<Initial State Period and Normal Operation Period>

First, in order to make the shift from the first period (T1) to the second period (T2) in FIG. 2, the clock signal (CLK) and the clock inversion signal (CLKB) whose potentials are periodically changed between high levels and low levels are input while the source voltage (Vdd) is applied (a source voltage of higher than 0 V is applied) (at time t2). Note the clock signal (CLK) may rise earlier than the source voltage (Vdd) because unstable operation might possibly be caused when the clock signal (CLK) rises at the same time as the source voltage (Vdd).

The source voltage (Vdd) is applied to the phase inverter circuit 106, the first switch 108, and the one of the source electrode and the drain electrode of the third transistor 118. The clock signal (CLK) is input to the input terminal of the phase inverter circuit 106, the gate electrode of the first transistor 112, and the second terminal of the second switch 110. The clock inversion signal (CLKB) is output from the output terminal of the phase inverter circuit 106.

Then, the input signal (IN) is input to the one of the source electrode and the drain electrode of the first transistor 112 from the first signal line (in a period between the time t2 and time t3).

The potential of the node a (Na) depends on the input signal (IN) input to the one of the source electrode and the drain electrode of the first transistor 112 and the clock signal (CLK) input to the gate electrode of the first transistor 112. In the basic operation, when the clock signal (CLK) is at a high-level potential, the first transistor 112 is turned on, so that the input signal (IN) is input to the node a (Na). Note that when the clock signal (CLK) is at a low-level potential, the node a (Na) can hold the input signal (IN) in the state directly before the clock signal (CLK) falls, with the use of the first transistor 112 and the capacitor 114.

For example, in a period between the time t3 and time t4, the clock signal (CLK) is at a low-level potential, and the node a (Na) holds a high-level potential which is in the state directly before the clock signal (CLK) falls. On the other hand, in a period between the time t4 and time t5, the clock signal (CLK) is at a high-level potential and the input of the input signal (IN) is stopped, so that a low-level potential is supplied to the node a (Na).

In FIG. 2, before the power is turned off, the clock signal (CLK) and the input signal (IN) are each made to be at a high-level potential. After that, when the clock signal (CLK) is at a low-level potential, the input of the input signal (IN) is stopped (the input signal (IN) is made to be at a low-level potential) and a high-level potential is supplied to the node a (Na) (in a period between time t6 and time t9).

The potential of the node b (Nb) depends on the potentials of the clock inversion signal (CLKB), the source voltage (Vdd), and the node a (Na). For example, when the clock inversion signal (CLKB) is at a low-level potential, the first switch 108 is in a precharge state, so that the node b (Nb) is at the same potential as the source voltage (Vdd). On the other hand, when the clock inversion signal (CLKB) is at a high-level potential, the precharge state of the first switch 108 is completed, and the potential of the node b (Nb) depends on the state of the node a (Na). When the node a (Na) is at a high-level potential, the second transistor 116 is turned on, so that the node b (Nb) is at a low-level potential (in the period between the time t3 and the time t4).

The potential of the node c (Nc) depends on the state of the second switch 110 and the potential of the node b (Nb). For example, when the second switch 110 is on, the node c (Nc) is at the same potential as the node b (Nb), whereas when the second switch 110 is off, the node c (Nc) is kept in the previous state. The second switch 110 is turned on when the clock signal (CLK) is at a low-level potential and the clock inversion signal (CLKB) is at a high-level potential.

The second memory circuit 104 outputs an inversion signal of a signal of the node c (Nc) as the output signal (OUT).

<Operation Before Stop of Supply of Source Voltage>

The third period (T3) is a period during which the source voltage (Vdd) is not supplied. Thus, in a period between time t9 and time t10 in the second period (T2), operation before the power is turned off is performed.

In the operation before the power is turned off, the clock signal (CLK) and the clock inversion signal (CLKB) are fixed at a low-level potential and a high-level potential, respectively. The potential of the node a (Na) is held by the first transistor 112 and the capacitor 114.

<Operation of Stop of Supply of Source Voltage>

The third period (denoted as T3 in the chart) is a period during which the source voltage is not supplied. At the time t10, the application of the source voltage (Vdd) is stopped, so that all the potentials except the potential of the node a (Na) are each made to be at a low level. Even after the application of the source voltage (Vdd) is stopped, only the node a (Na) is kept at a high-level potential supplied before the application of the source voltage (Vdd) is stopped. Here, the leakage current of the first transistor 112 is significantly low; thus, a change in the signal (potential) held by the node a (Na) and the capacitor 114 can be suppressed.

<Operation of Resumption of Supply of Source Voltage>

The fourth period (denoted as T4 in the chart) is a period in which the application of the source voltage is resumed. After the application of the source voltage (Vdd) is resumed, the clock signal (CLK) and the clock inversion signal (CLKB) which are fixed at a low-level potential and a high-level potential, respectively, when the application of the source voltage (Vdd) is stopped are supplied (at time t13).

Then, data stored at the node a (Na) is read out. The node (Na) becomes at a high-level potential held before the application of source voltage is stopped. The potential of the node b (Nb) depends on the state of the node a (Na) as the clock inversion signal (CLKB) is at a high-level potential. The node a (Na) is at a high-level potential and thus the node b (Nb) is at a low-level potential. The second switch 110 is given a high-level potential of the clock inversion signal (CLKB) and thus is turned on, so that the node c (Nc) becomes at the same potential as the node b (Nb). The output signal (OUT) is an inversion signal of a signal of the node c (Nc); thus, a high-level potential is output (in a period between time t13 and time t14).

After that, the fixation of the levels (signal potentials) of the clock signal (CLK) fixed at a low-level potential and the clock inversion signal (CLKB) is cleared. In other words, the clock signal (CLK) and the clock inversion signal (CLKB) are returned to normal signals whose potentials are periodically changed between high levels and low levels. The input signal (IN) is made to be at a high-level potential to resume the writing of data to the node a (Na) (at time t14).

The above is the description of the driving method in the case where data stored after source voltage is supplied is at a high-level potential.

Next, the case where data stored after the source voltage is supplied is at a low-level potential will be described with reference to the timing chart in FIG. 3. Note that description of portions similar to those in the timing chart in FIG. 2 will be omitted.

<Initial State Period and Normal Operation Period>

First, in order to make the shift from the first period (T1) to the second period (T2) in FIG. 3, the clock signal (CLK) and the clock inversion signal (CLKB) whose potentials are periodically changed between high levels and low levels are input while the source voltage (Vdd) is applied (a source voltage of higher than 0 V is applied) (at time t2). Note the clock signal (CLK) may rise earlier than the source voltage (Vdd) because unstable operation might possibly be caused when the clock signal (CLK) rises at the same time as the source voltage (Vdd).

The source voltage (Vdd) is applied to the phase inverter circuit 106, the first switch 108, and the one of the source electrode and the drain electrode of the third transistor 118. The clock signal (CLK) is input to the input terminal of the phase inverter circuit 106, the gate electrode of the first transistor 112, and the second terminal of the second switch 110. The clock inversion signal (CLKB) is output from the output terminal of the phase inverter circuit 106.

Then, the input signal (IN) is input to the one of the source electrode and the drain electrode of the first transistor 112 from the first signal line (in a period between the time t2 and time t3).

The potential of the node a (Na) depends on the input signal (IN) input to the one of the source electrode and the drain electrode of the first transistor 112 and the clock signal (CLK) input to the gate electrode of the first transistor 112. In the basic operation, when the clock signal (CLK) is at a high-level potential, the first transistor 112 is turned on, so that the input signal (IN) is input to the node a (Na). Note that when the clock signal (CLK) is at a low-level potential, the node a (Na) can hold the input signal (IN) in the state directly before the fall with the use of the first transistor 112 and the capacitor 114.

Note that in FIG. 3, when the clock signal (CLK) is at a high-level potential before the power is turned off, the input of the input signal (IN) is stopped and a low-level potential is supplied to the node a (Na) (in a period between time t8 and time t9).

The potential of the node b (Nb) depends on the potentials of the clock inversion signal (CLKB), the source voltage (Vdd), and the node a (Na). For example, when the clock inversion signal (CLKB) is at a low-level potential, the first switch 108 is in a precharge state, so that the node b (Nb) is at the same potential as the source voltage (Vdd). On the other hand, when the clock inversion signal (CLKB) is at a high-level potential, the precharge state of the first switch 108 is completed, and the potential of the node b (Nb) depends on the state of the node a (Na). When the node a (Na) is at a high-level potential, the second transistor 116 is turned on, so that the node b (Nb) is at a low-level potential.

The potential of the node c (Nc) depends on the state of the second switch 110 and the potential of the node b (Nb). For example, when the second switch 110 is on, the node c (Nc) is at the same potential as the node b (Nb), whereas when the second switch 110 is off, the node c (Nc) is kept in the previous state. The second switch 110 is turned on when the clock signal (CLK) is at a low-level potential and the clock inversion signal (CLKB) is at a high-level potential.

The second memory circuit 104 outputs an inversion signal of a signal of the node c (Nc) as the output signal (OUT).

<Operation Before Stop of Supply of Source Voltage>

The third period (T3) is a period during which the source voltage (Vdd) is not supplied. Thus, in a period between time t9 and time t10 in the second period (T2), operation before the power is turned off is performed.

In the operation before the power is turned off, the clock signal (CLK) and the clock inversion signal (CLKB) are fixed at a low-level potential and a high-level potential, respectively. The potential of the node a (Na) is held by the first transistor 112 and the capacitor 114.

<Operation of Stop of Supply of Source Voltage>

The third period (denoted as T3 in the chart) is a period during which source voltage is not supplied. At the time t10, the application of the source voltage (Vdd) is stopped, so that all the potentials are each made to be at a low level. Note that in FIG. 3, data stored at the node a (Na) is also at a low-level potential.

<Operation of Resumption of Supply of Source Voltage>

The fourth period (denoted as T4 in the chart) is a period in which the application of source voltage is resumed. After the application of the source voltage (Vdd) is resumed, the clock signal (CLK) and the clock inversion signal (CLKB) which are fixed at a low-level potential and a high-level potential, respectively, when the application of the source voltage (Vdd) is stopped are supplied (at time t13).

Then, data stored at the node a (Na) is read out. The node (Na) becomes at a low-level potential held before the application of the source voltage (Vdd) is stopped. The clock inversion signal (CLKB) is at a high-level potential and thus the potential of the node b (Nb) depends on the state of the node a (Na). The node b (Nb) is at a high-level potential as the node a (Na) is at a low-level potential. The second switch 110 is given a high-level potential of the clock inversion signal (CLKB) and thus is turned on, so that the node c (Nc) becomes at the same potential as the node b (Nb). The output signal (OUT) is an inversion signal of a signal of the node c (Nc); thus, a low-level potential is output (in a period between time t13 and time t14).

Next, the fixation of the levels (signal potentials) of the clock signal (CLK) and the clock inversion signal (CLKB) is cleared (at time t4). In other words, the clock signal (CLK) and the clock inversion signal (CLKB) are returned to normal signals whose potentials are periodically changed between high levels and low levels.

After that, the input signal (IN) is made to be at a high-level potential to resume the writing of data to the node a (Na) (in a period between time t15 and time t16).

The above is the description of the driving method in the case where data stored after source voltage is supplied is at a low-level potential, which is shown in the timing chart in FIG. 3.

As described above, in the memory circuit described in this embodiment, the first memory circuit 102 has the structure illustrated in FIG. 1 and thus can be nonvolatile. Further, when the number of power supply lines and signal lines which are connected to the memory circuit is reduced, the circuit scale of the nonvolatile memory circuit can be small.

By applying such a memory circuit to a storage device such as a register or a cache memory, data in the storage device can be prevented from being erased owing to the stop of the application of source voltage. In addition, after the application of source voltage is resumed, the memory circuit can return to the state which is the same as that before the power supply is stopped, in a short time. Therefore, the power supply can be stopped even for a short time when the whole memory circuit or one or a plurality of logic circuits included in the memory circuit is in a standby state. Accordingly, it is possible to provide a memory circuit whose power consumption can be suppressed and a driving method of the memory circuit whose power consumption can be suppressed.

This embodiment can be implemented in appropriate combination with any of the other embodiments.

(Embodiment 2)

In this embodiment, a configuration example of the memory circuit 100 described in Embodiment 1 will be specifically described with reference to FIG. 4. Note that common reference numerals are used for parts which are the same as those in Embodiment 1, and description of the parts will be omitted.

Figure 4:
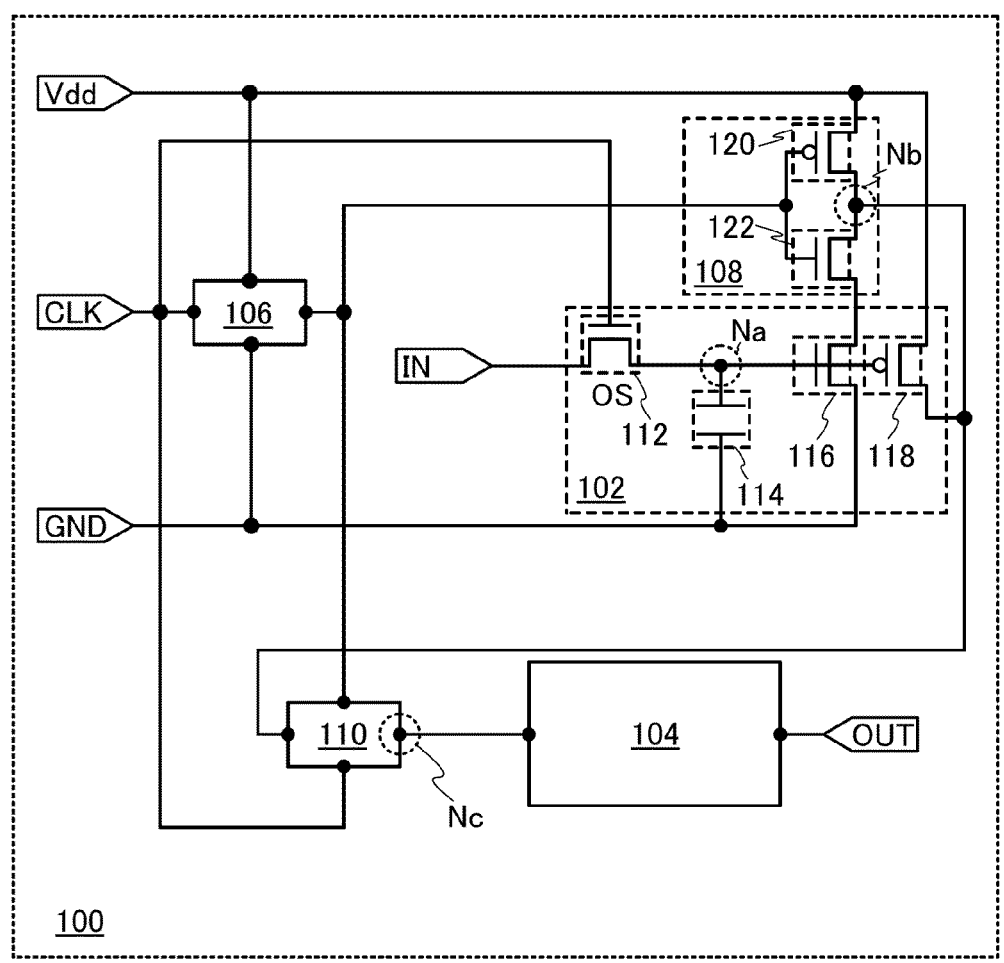
FIG. 4 illustrates a configuration of a memory circuit.

The memory circuit 100 in FIG. 4 includes the first memory circuit 102, the second memory circuit 104, the first switch 108, the second switch 110, and the phase inverter circuit 106.

In this embodiment, an example is described in which transistors are used in the first switch 108 and connection of circuit elements such as the first switch 108 is similar to that in FIG. 1.

The first switch 108 includes a fourth transistor 120 and a fifth transistor 122, and a gate electrode of the fourth transistor 120 is connected to a gate electrode of the fifth transistor 122. One of a source electrode and a drain electrode of the fourth transistor 120 is connected to the power supply line to which the source voltage (Vdd) is applied. The other of the source electrode and the drain electrode of the fourth transistor 120 is connected to one of a source electrode and a drain electrode of the fifth transistor 122. The other of the source electrode and the drain electrode of the fifth transistor 122 is connected to one of the source electrode and the drain electrode of the second transistor 116. The other of the source electrode and the drain electrode of the second transistor 116 is grounded.

The gate electrode of the fourth transistor 120 and the gate electrode of the fifth transistor 122 are given the clock inversion signal (CLKB). When the clock inversion signal (CLKB) is at a low-level potential, the fourth transistor 120 is turned on, so that precharging of the source voltage (Vdd) is performed on the node b (Nb). Meanwhile, when the clock inversion signal (CLKB) is at a high-level potential, the fourth transistor 120 is turned off and the fifth transistor 122 is turned on, so that the potential of the node b (Nb) depends on the state of the node a (Na). For example, when the node a (Na) is at a low-level potential, the second transistor 116 is turned off and the node b (Nb) remains in the previous potential state. Meanwhile, when the node a (Na) is at a high-level potential, the second transistor 116 is turned on and the node b (Nb) is at a low-level potential.

As described in this embodiment, the circuit configuration described above may be used for the first switch 108.

As described above, in the memory circuit described in this embodiment, the first memory circuit 102 has the structure illustrated in FIG. 4 and thus can be nonvolatile. Further, when the number of power supply lines and signal lines which are connected to the memory circuit is reduced, the circuit scale of the nonvolatile memory circuit can be small.

By applying such a memory circuit to a storage device such as a register or a cache memory, data in the storage device can be prevented from being erased owing to the stop of the application of source voltage. In addition, after the application of source voltage is resumed, the memory circuit can return to the state which is the same as that before the power supply is stopped, in a short time. Therefore, the power supply can be stopped even for a short time when the whole memory circuit or one or a plurality of logic circuits included in the memory circuit is in a standby state. Accordingly, it is possible to provide a memory circuit whose power consumption can be suppressed and a driving method of the memory circuit whose power consumption can be suppressed.

This embodiment can be implemented in appropriate combination with any of the other embodiments.

(Embodiment 3)

In this embodiment, a configuration example of the memory circuit 100 described in Embodiments 1 and 2 will be specifically described with reference to FIG. 5. Note that common reference numerals are used for parts which are the same as those in Embodiments 1 and 2, and description of the parts will be omitted.

Figure 5:
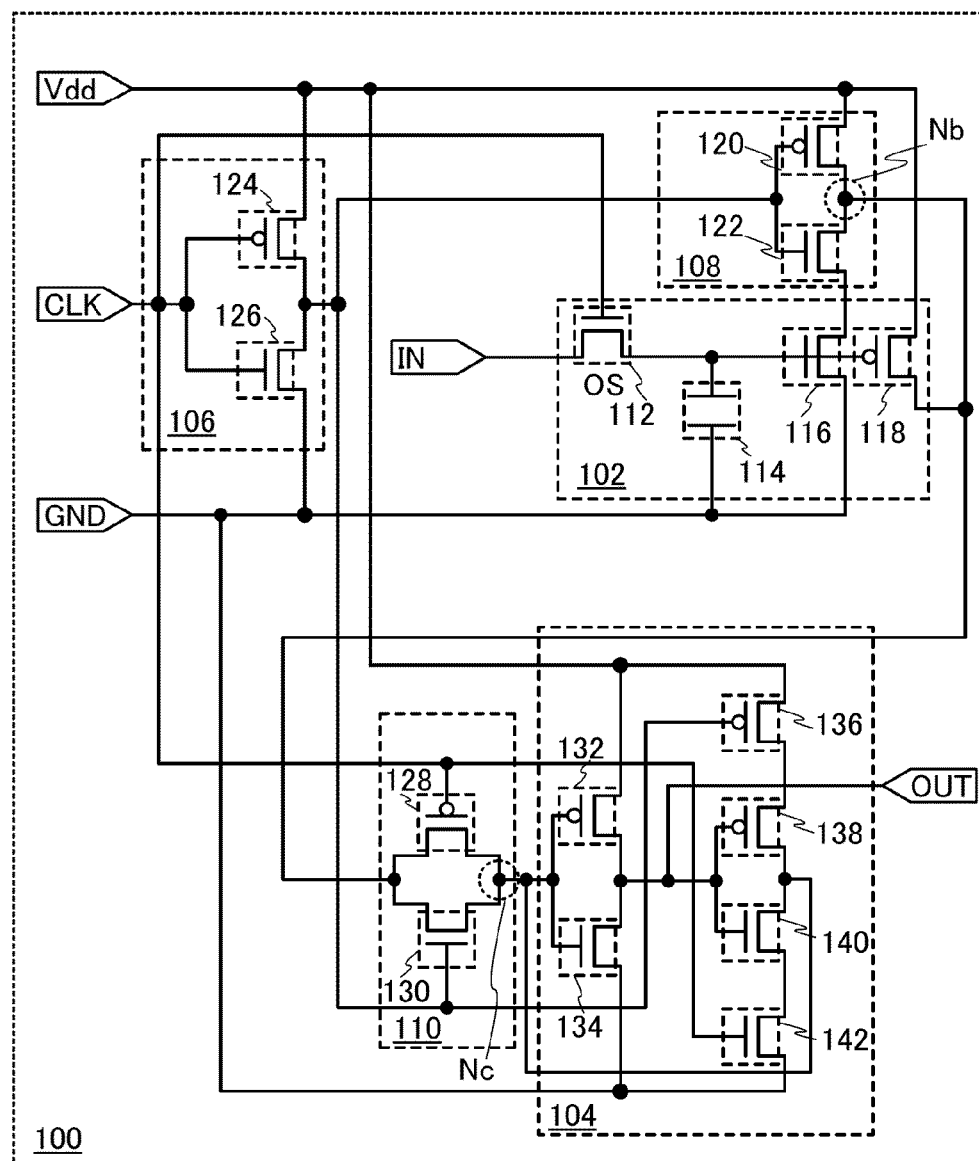
FIG. 5 illustrates a configuration of a memory circuit.

The memory circuit 100 in FIG. 5 includes the first memory circuit 102, the second memory circuit 104, the first switch 108, the second switch 110, and the phase inverter circuit 106.

In this embodiment, an example is described in which transistors are used in the first switch 108, the second switch 110, the phase inverter circuit 106, and the second memory circuit 104, and connection of these circuit elements is similar to those in FIGS. 1 and 4.

The first switch 108 includes the fourth transistor 120 and the fifth transistor 122, and the gate electrode of the fourth transistor 120 is connected to the gate electrode of the fifth transistor 122. One of the source electrode and the drain electrode of the fourth transistor 120 is connected to the power supply line. The other of the source electrode and the drain electrode of the fourth transistor 120 is connected to one of the source electrode and the drain electrode of the fifth transistor 122. The other of the source electrode and the drain electrode of the fifth transistor 122 is connected to one of the source electrode and the drain electrode of the second transistor 116. The other of the source electrode and the drain electrode of the second transistor 116 is grounded.

The second switch 110 includes a transistor 128 and a transistor 130. A gate electrode of the transistor 128 is connected to the second signal line to which the second control signal (CLK) is input. A gate electrode of the transistor 130 is connected to the output terminal of the phase inverter circuit 106. One of a source electrode and a drain electrode of the transistor 128 is connected to one of a source electrode and a drain electrode of the transistor 130. The other of the source electrode and the drain electrode of the transistor 128 is connected to the other of the source electrode and the drain electrode of the transistor 130.

The phase inverter circuit 106 includes a transistor 124 and a transistor 126. A gate electrode of the transistor 124 is connected to a gate electrode of the transistor 126 and the second signal line to which the second control signal (CLK) is input. One of a source electrode and a drain electrode of the transistor 124 is connected to the power supply line to which the source voltage (Vdd) is applied. The other of the source electrode and the drain electrode of the transistor 124 is connected to one of a source electrode and a drain electrode of the transistor 126. The other of the source electrode and the drain electrode of the transistor 126 is grounded.

The memory circuit 104 includes a transistor 132, a transistor 134, a transistor 136, a transistor 138, a transistor 140, and a transistor 142. A gate electrode of the transistor 132 is connected to a gate electrode of the transistor 134 and the output terminal of the second switch 110. One of a source electrode and a drain electrode of the transistor 132 is connected to the power supply line to which the source voltage (Vdd) is applied. The other of the source electrode and the drain electrode of the transistor 132 is connected to one of a source electrode and a drain electrode of the transistor 134. The other of the source electrode and the drain electrode of the transistor 134 is grounded.

A gate electrode of the transistor 136 is connected to the output terminal of the phase inverter circuit 106. A gate electrode of the transistor 142 is connected to the second signal line to which the second control signal (CLK) is input. A gate electrode of the transistor 138 is connected to a gate electrode of the transistor 140, the other of the source electrode and the drain electrode of the transistor 132, the one of the source electrode and the drain electrode of the transistor 134, and the third signal line from which the output signal (OUT) is output.

One of a source electrode and a drain electrode of the transistor 136 is connected to the power supply line to which the source voltage (Vdd) is applied. The other of the source electrode and the drain electrode of the transistor 136 is connected to one of a source electrode and a drain electrode of the transistor 138. The other of the source electrode and the drain electrode of the transistor 138 is connected to one of a source electrode and a drain electrode of the transistor 140. The other of the source electrode and the drain electrode of the transistor 140 is connected to one of a source electrode and a drain electrode of the transistor 142. The other of the source electrode and the drain electrode of the transistor 142 is grounded.

Figure 6:
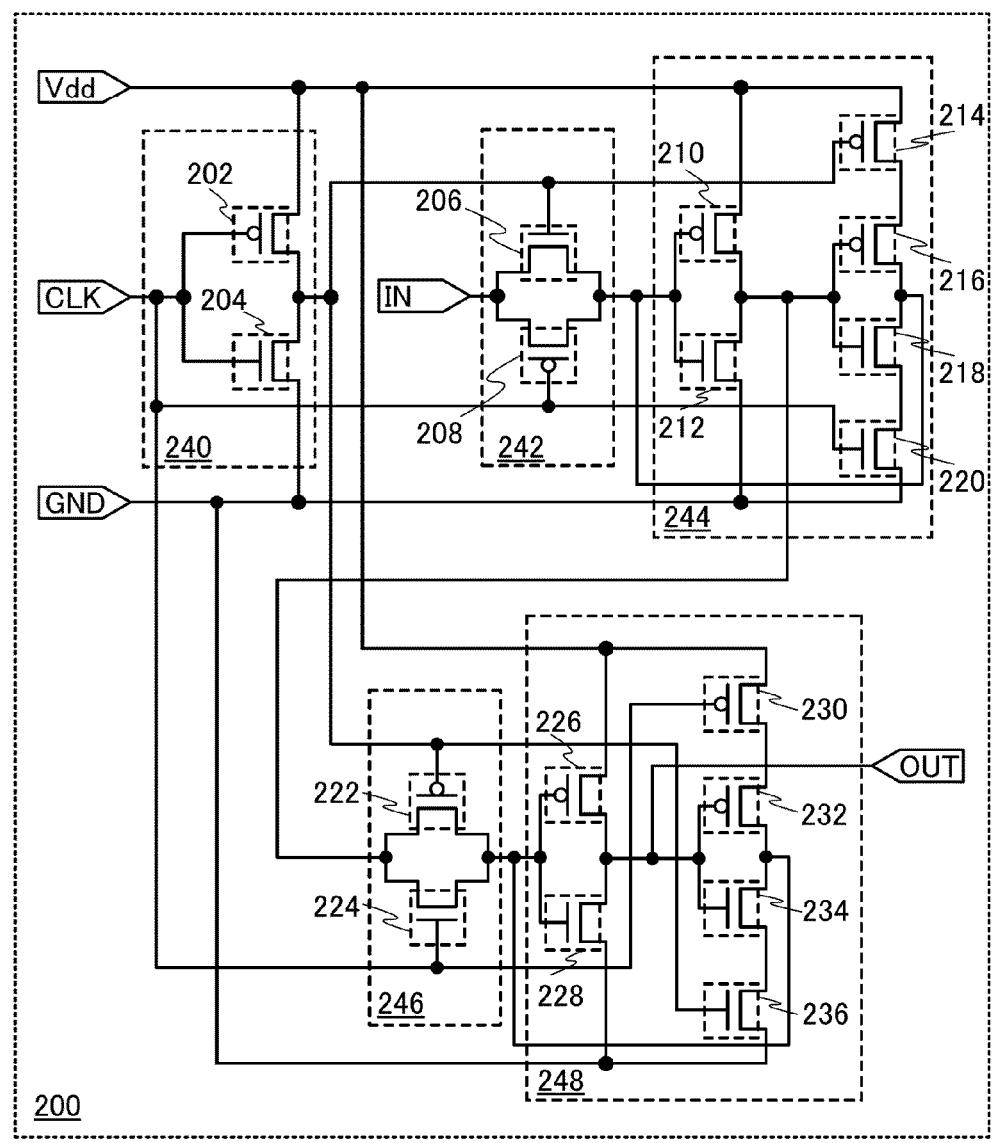
FIG. 6 illustrates a configuration of a memory circuit.

Here, FIG. 6 illustrates a circuit configuration where the first transistor 112 formed using an oxide semiconductor is not used in the first memory circuit 102, as a comparative example.

Note that a memory circuit 200 in FIG. 6 includes transistors except for transistors formed using oxide semiconductors and thus is volatile.

The memory circuit 200 includes a phase inverter circuit 240, a first switch 242, a second switch 246, a first memory circuit 244, and a second memory circuit 248.

The phase inverter circuit 240 includes a transistor 202 and a transistor 204. A gate electrode of the transistor 202 is connected to a gate electrode of the transistor 204 and the second signal line to which the second control signal (CLK) is input. One of a source electrode and a drain electrode of the transistor 202 is connected to the power supply line to which the source voltage (Vdd) is applied. The other of the source electrode and the drain electrode of the transistor 202 is connected to one of a source electrode and a drain electrode of the transistor 204. The other of the source electrode and the drain electrode of the transistor 204 is grounded.

The first switch 242 includes a transistor 206 and a transistor 208. A gate electrode of the transistor 206 is connected to an output terminal of the phase inverter circuit 240. A gate electrode of the transistor 208 is connected to the second signal line to which the second control signal (CLK) is input. One of a source electrode and a drain electrode of the transistor 206 is connected to one of a source electrode and a drain electrode of the transistor 208 and a first signal line to which the input signal (IN) that is a first control signal is input. The other of the source electrode and the drain electrode of the transistor 206 is connected to the other of the source electrode and the drain electrode of the transistor 208.

The first memory circuit 244 includes the transistor 210, the transistor 212, a transistor 214, a transistor 216, a transistor 218, and a transistor 220. A gate electrode of the transistor 210 is connected to a gate electrode of the transistor 212 and an output terminal of the first switch 242. One of a source electrode and a drain electrode of the transistor 210 is connected to the power supply line to which the source voltage (Vdd) is applied. The other of the source electrode and the drain electrode of the transistor 210 is connected to one of a source electrode and a drain electrode of the transistor 212. The other of the source electrode and the drain electrode of the transistor 212 is grounded.

A gate electrode of the transistor 214 is connected to the output terminal of the phase inverter circuit 240. A gate electrode of the transistor 220 is connected to the second signal line to which the second control signal (CLK) is input. A gate electrode of the transistor 216 is connected to a gate electrode of the transistor 218, the other of the source electrode and a drain electrode of the transistor 210, and the one of the source electrode and the drain electrode of the transistor 212.

One of a source electrode and a drain electrode of the transistor 214 is connected to the power supply line. The other of the source electrode and the drain electrode of the transistor 214 is connected to one of a source electrode and a drain electrode of the transistor 216. The other of the source electrode and the drain electrode of the transistor 216 is connected to one of a source electrode and a drain electrode of the transistor 218. The other of the source electrode and the drain electrode of the transistor 218 is connected to one of a source electrode and a drain electrode of the transistor 220. The other of the source electrode and the drain electrode of the transistor 220 is grounded.

The second switch 246 includes a transistor 222 and a transistor 224. A gate electrode of the transistor 222 is connected to the output terminal of the phase inverter circuit 240. A gate electrode of the transistor 224 is connected to the second signal line to which the second control signal (CLK) is input. One of a source electrode and a drain electrode of the transistor 222 is connected to one of a source electrode and a drain electrode of the transistor 224, the other of the source electrode and the drain electrode of a transistor 210, and one of a source electrode and a drain electrode of a transistor 212. The other of the source electrode and the drain electrode of the transistor 222 is connected to the other of the source electrode and the drain electrode of the transistor 224.

The second memory circuit 248 includes a transistor 226, a transistor 228, a transistor 230, a transistor 232, a transistor 234, and a transistor 236. A gate electrode of the transistor 226 is connected to a gate electrode of the transistor 228 and an output terminal of the second switch 246. One of a source electrode and a drain electrode of the transistor 226 is connected to the power supply line to which the source voltage (Vdd) is applied. The other of the source electrode and the drain electrode of the transistor 226 is connected to one of a source electrode and a drain electrode of the transistor 228. The other of the source electrode and the drain electrode of the transistor 228 is grounded.

A gate electrode of the transistor 230 is connected to the second signal line to which the second control signal (CLK) is input. A gate electrode of the transistor 236 is connected to the output terminal of the phase inverter circuit 240. A gate electrode of the transistor 232 is connected to a gate electrode of the transistor 234, the other of the source electrode and a drain electrode of the transistor 226, the one of the source electrode and the drain electrode of the transistor 228, and the third signal line from which the output signal (OUT) is output.

One of a source electrode and a drain electrode of the transistor 230 is connected to the power supply line. The other of the source electrode and the drain electrode of the transistor 230 is connected to one of a source electrode and a drain electrode of the transistor 232. The other of the source electrode and the drain electrode of the transistor 232 is connected to one of a source electrode and a drain electrode of the transistor 234. The other of the source electrode and the drain electrode of the transistor 234 is connected to one of a source electrode and a drain electrode of the transistor 236. The other of the source electrode and the drain electrode of the transistor 236 is grounded.

Thus, the memory circuit 200 in FIG. 6 includes the 18 transistors. In contrast, the memory circuit 100 in FIG. 5 includes 14 transistors, one transistor formed using an oxide semiconductor, and one capacitor, whereby the circuit scale can be small. Further, with the use of a transistor formed using an oxide semiconductor, a nonvolatile memory circuit can be formed.

As described above, in the memory circuit described in this embodiment, the first memory circuit 102 has the structure illustrated in FIG. 5 and thus can be nonvolatile. Further, when the number of power supply lines and signal lines which are connected to the memory circuit is reduced and the number of transistors used in the memory circuit is reduced, the circuit scale of the nonvolatile memory circuit can be small.

By applying such a memory circuit to a storage device such as a register or a cache memory, data in the storage device can be prevented from being erased owing to the stop of the application of source voltage. In addition, after the application of source voltage is resumed, the memory circuit can return to the state which is the same as that before the power supply is stopped, in a short time. Therefore, the power supply can be stopped even for a short time when the whole memory circuit or one or a plurality of logic circuits included in the memory circuit is in a standby state. Accordingly, it is possible to provide a memory circuit whose power consumption can be suppressed and a driving method of the memory circuit whose power consumption can be suppressed.

This embodiment can be implemented in appropriate combination with any of the other embodiments.

(Embodiment 4)

In this embodiment, a memory processing unit including the memory circuit described in any of Embodiments 1 to 3 and a plurality of circuits connected to the memory circuit will be described with reference to FIG. 7.

Figure 7:
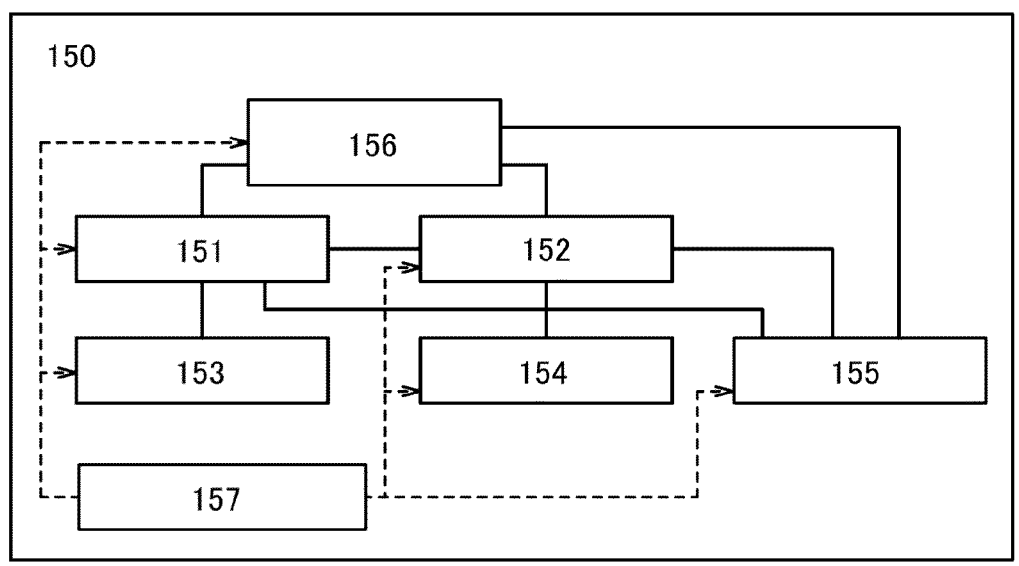
FIG. 7 illustrates a configuration of a memory processing unit.

FIG. 7 illustrates an example of a memory processing unit according to this embodiment. A memory processing unit 150 includes, at least, one or a plurality of arithmetic circuits and one or a plurality of memory circuits. Specifically, the memory processing unit 150 illustrated in FIG. 7 includes an arithmetic circuit 151, an arithmetic circuit 152, a memory circuit 153, a memory circuit 154, a memory circuit 155, a control circuit 156, and a power supply control circuit 157.

The arithmetic circuits 151 and 152 each include, as well as a logic circuit which carries out simple logic arithmetic processing, an adder, a multiplier, various arithmetic circuits, and the like. The memory circuit 153 functions as a register for temporarily holding data when the arithmetic processing is carried out in the arithmetic circuit 151. The memory circuit 154 functions as a register for temporarily holding data when the arithmetic processing is carried out in the arithmetic circuit 152.

In addition, the memory circuit 155 can be used as a main memory and can store a program executed by the control circuit 156 as data or can store data from the arithmetic circuit 151 and the arithmetic circuit 152.

The control circuit 156 is a circuit which performs centralized control of operations of the arithmetic circuit 151, the arithmetic circuit 152, the memory circuit 153, the memory circuit 154, and the memory circuit 155 which are included in the memory processing unit 150.

When the memory circuit 100 described in any of Embodiments 1 to 3 is used for the memory circuit 153, the memory circuit 154, and the memory circuit 155, data can be held even when the application of source voltage to the memory circuit 153, the memory circuit 154, and the memory circuit 155 is stopped. In the above manner, the application of the source voltage to the entire memory processing unit 150 can be stopped, whereby power consumption can be suppressed. Alternatively, the application of the source voltage to one or more of the memory circuit 153, the memory circuit 154, and the memory circuit 155 can be stopped, whereby power consumed by the memory processing unit 150 can be reduced. In addition, before the application of the source voltage is stopped, data can be written at high speed, and after the application of the source voltage is resumed, the memory processing unit 150 can return to the state which is the same as that before the application of the source voltage is stopped, in a short time.

In addition, when the application of the source voltage to the memory circuit 153, the memory circuit 154, and the memory circuit 155 is stopped, the application of the source voltage to the control circuit 156 or the arithmetic circuit 151 or 152 which transmits/receives data to/from the memory circuit 153, the memory circuit 154, and the memory circuit 155 may also be stopped. For example, when the arithmetic circuit 151 and the memory circuit 153 are not operated, the application of the source voltage to the arithmetic circuit 151 and the memory circuit 153 may be stopped.

In addition, the power supply control circuit 157 controls the level of the source voltage which is supplied to the arithmetic circuit 151, the arithmetic circuit 152, the memory circuit 153, the memory circuit 154, the memory circuit 155, and the control circuit 156 which are included in the memory processing unit 150. Further, in the case where the application of the source voltage is stopped, a switching element for stopping the application of the source voltage may be provided for the power supply control circuit 157, or for each of the arithmetic circuit 151, the arithmetic circuit 152, the memory circuit 153, the memory circuit 154, the memory circuit 155, and the control circuit 156.

Note that a memory circuit which functions as a cache memory may be provided between the memory circuit 155 that is a main memory and each of the arithmetic circuit 151, the arithmetic circuit 152, and the control circuit 156. Provision of the cache memory allows reduction of access to the main memory, so that the speed of the signal processing such as arithmetic processing can be increased. The use of the above memory circuit also for a storage device functioning as a cache memory leads to a reduction in power consumption of the memory processing unit 150. In addition, before the application of the source voltage is stopped, data can be written at high speed, and after the application of the source voltage is resumed, the memory processing unit 150 can return to the state which is the same as that before the source voltage is stopped, in a short time.

In the memory circuit described in this embodiment, the number of power supply lines and signal lines which are connected to the memory circuit is reduced and the number of transistors used in the memory circuit is reduced, whereby the circuit scale can be small.

This embodiment can be implemented in appropriate combination with any of the other embodiments.

(Embodiment 5)

In this embodiment, description will be given of a configuration of a CPU that is one of memory circuits, according to one embodiment of the present invention.

Figure 8:
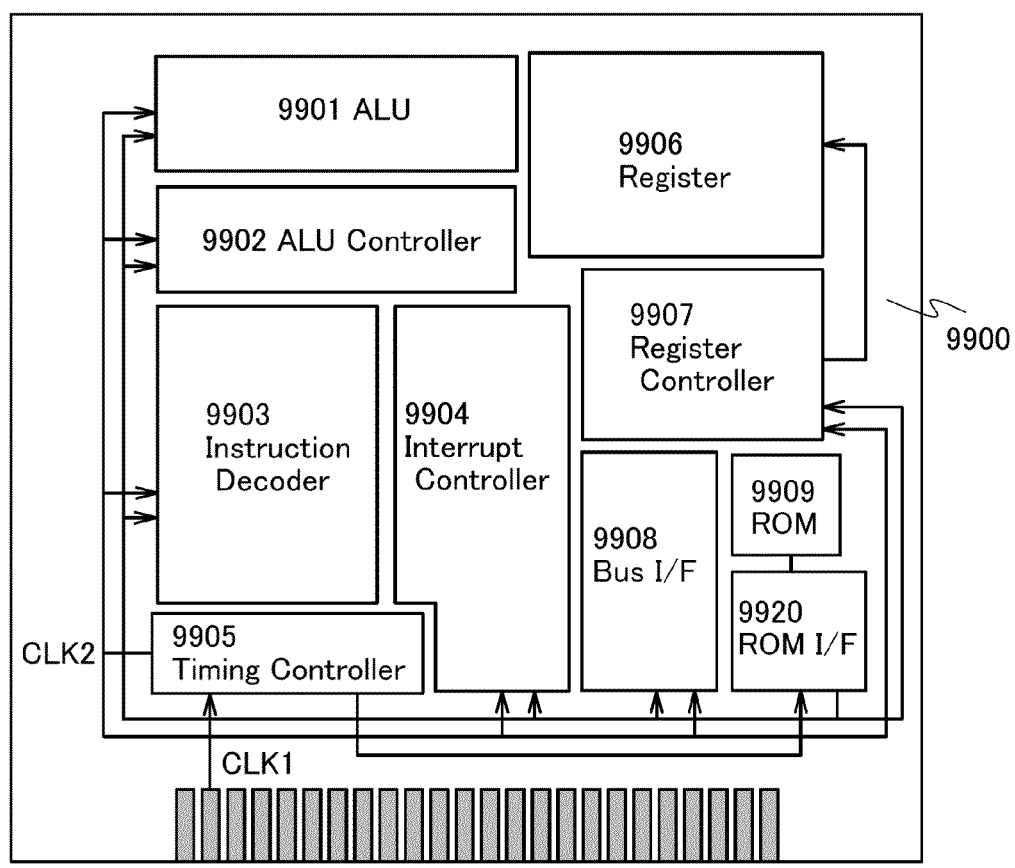
FIG. 8 illustrates a configuration of a CPU.

FIG. 8 illustrates the configuration of the CPU according to this embodiment. The CPU illustrated in FIG. 8 mainly includes, over a substrate 9900, an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920.

The ROM 9909 and the ROM I/F 9920 may be provided over another chip. It is needless to say that the CPU in FIG. 8 is only an example in which the configuration is simplified, and actual CPUs have various configurations depending on the application.

An instruction input to the CPU through the Bus I/F 9908 is input to the instruction decoder 9903 and decoded therein, and then, is input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit depending on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and inputs the clock signal CLK2 to the above circuits.

In the CPU of this embodiment, a memory circuit having the structure described in any of the above embodiments is provided in the register 9906. The register controller 9907 can temporarily hold data in the memory circuit in the register 9906, in response to an instruction from the ALU 9901.

In such a manner, even in the case where the operation of the CPU is temporarily stopped and the application of the source voltage is stopped, data can be held and power consumption can be reduced. Specifically, for example, while a user of a personal computer does not input data to an input device such as a keyboard, the operation of a CPU can be stopped, so that the power consumption can be reduced.

Although the CPU is described as an example in this embodiment, the memory circuit according to one embodiment of the present invention is not limited to the CPU and can be applied to an LSI such as a microprocessor, an image processing circuit, a digital signal processor (DSP), or a field programmable gate array (FPGA).

This embodiment can be implemented in appropriate combination with any of the other embodiments.

(Embodiment 6)

In this embodiment, a method for manufacturing a transistor which can be used in the memory circuit 100 in FIG. 1 according to Embodiment 1 will be described. The description will be given taking the first transistor 112, the capacitor 114, and the second transistor 116, which are illustrated in FIG. 1, as examples with reference to FIGS. 9A to 9C, FIGS. 10A to 10C, and FIGS. 11A to 11C. Note that the other elements included in the memory circuit 100 can also be formed similarly to the first transistor 112, the capacitor 114, and the second transistor 116.

In this embodiment, the manufacturing method will be described below taking, as an example, the case where a material of the second transistor 116 is single crystal silicon.

Figure 9A:
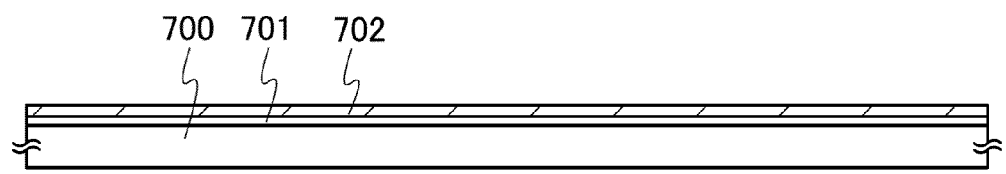
FIGS. 9A to 9C illustrate a method for forming a transistor which can be used for a memory circuit.

First, an insulating film 701 and a semiconductor film 702 separated from a single crystal semiconductor substrate are formed over a substrate 700 as illustrated in FIG. 9A.

Although there is no particular limitation on a material which can be used for the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where a glass substrate is used and the temperature at which the heat treatment is to be performed later is high, a glass substrate whose strain point is higher than or equal to 730° C. is preferably used.

Note that a specific example of a method for forming the single crystal semiconductor film 702 will be briefly described. First, an ion beam including ions which are accelerated by an electric field is delivered to a bond substrate which is the single crystal semiconductor substrate and a fragile layer which is weakened due to local disorder of the crystal structure is formed in a region at a certain depth from a surface of the bond substrate. The depth at which the fragile layer is formed can be adjusted by the acceleration energy and the incident angle of the ion beam. Then, the bond substrate and the substrate 700 over which an insulating film 701 is formed are attached to each other so that the insulating film 701 is provided therebetween. The attachment is performed as follows. After the bond substrate and the substrate 700 overlap with each other, a pressure of, approximately, greater than or equal to 1 N/cm$^2$ and less than or equal to 500 N/cm$^2$, preferably greater than or equal to 11 N/cm$^2$ and less than or equal to 20 N/cm$^2$ is applied to part of the bond substrate and part of the substrate 700. When the pressure is applied, bonding between the bond substrate and the insulating film 701 starts from the parts, resulting in the bonding in the entire surface where the bond substrate and the insulating film 701 are in close contact with each other. Subsequently, heat treatment is performed, whereby microvoids that exist in the fragile layer are combined and thus increase in volume. As a result, the single crystal semiconductor film which is part of the bond substrate is separated from the bond substrate along the fragile layer. The heat treatment is performed at a temperature not exceeding the strain point of the substrate 700.

Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film, which has not been patterned, or may be added to the semiconductor film 702 obtained by patterning. Alternatively, the impurity element for controlling the threshold voltage may be added to the bond substrate. Still alternatively, the impurity element may be added to the bond substrate in order to roughly control the threshold voltage, and the impurity element may be further added to the semiconductor film, which has not been patterned, or the semiconductor film 702 obtained by patterning, in order to finely control the threshold voltage.

Note that although an example in which a single crystal semiconductor film is used is described in this embodiment, one embodiment of the present invention is not limited thereto. For example, a polycrystalline, microcrystalline, or amorphous semiconductor film which is formed over the insulating film 701 by a vapor deposition method may be used. Alternatively, the above semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be used in combination. When a highly heat-resistant substrate such as a quartz substrate is used, it is possible to combine any of the following crystallization methods: a thermal crystallization method using an electrically heated oven, a lamp annealing crystallization method using infrared light, a crystallization method using a catalytic element, and a high-temperature annealing method in which the temperature is approximately 950° C.

Figure 9B:
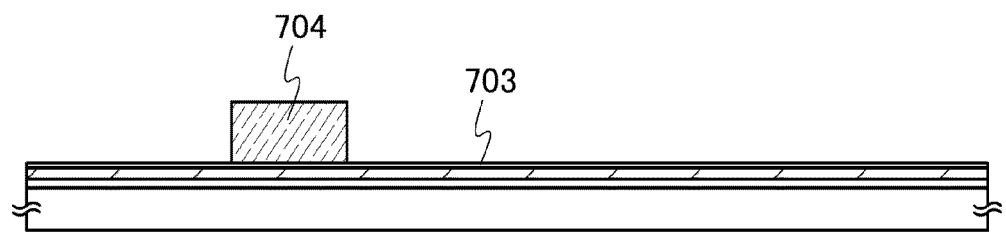

Next, as illustrated in FIG. 9B, a gate insulating film 703 is formed over the semiconductor film 702.

The gate insulating film 703 can be formed by oxidizing or nitriding a surface of the semiconductor film 702 by high-density plasma treatment, heat treatment, or the like. The high-density plasma treatment is performed using, for example, a mixed gas of a rare gas such as He, Ar, Kr, or Xe, and a gas such as oxygen, nitrogen oxide, ammonia, nitrogen, hydrogen, or the like. In this case, by exciting plasma by introduction of microwaves, high-density plasma with a low electron temperature can be generated. By oxidizing or nitriding the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed in contact with the semiconductor film.

The gate insulating film 703 may be formed to have a single-layer structure or a layered structure using a film including silicon oxide, silicon nitride oxide, silicon oxynitride, silicon nitride, hafnium oxide, lanthanum oxide, aluminum oxide, tantalum oxide, yttrium oxide, hafnium silicate ($HfSi_xO_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by a plasma CVD method, a sputtering method, or the like.

Note that, in this specification, an oxynitride refers to a material in which the oxygen content is higher than the nitrogen content, and a nitride oxide refers to a material in which the nitrogen content is higher than the oxygen content.

The range of the thickness of the gate insulating film 703 can be, for example, greater than or equal to 1 nm and less than or equal to 100 nm, preferably greater than or equal to 10 nm and less than or equal to 50 nm. In this embodiment, a single-layer insulating film including silicon oxide is formed as the gate insulating film 703 by a plasma CVD method.

Next, as illustrated in FIG. 9B, a gate insulating electrode 704 is formed.

The gate electrode 704 can be formed in such a manner that a conductive film is formed and then is processed (patterned and etched) to have a predetermined shape. The conductive film can be formed by a PE-CVD method, a sputtering method, an evaporation method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing the above metal or a compound containing the above metal may be used. Alternatively, the gate electrode 704 may be formed using a semiconductor such as polycrystalline silicon doped with an impurity element imparting conductivity to the semiconductor film, such as phosphorus.

Note that although the gate electrode 704 is formed using a single-layer conductive film in this embodiment, one embodiment of the present invention is not limited to this structure. The gate electrode 704 may be formed of a plurality of conductive films stacked.

In addition, the gate electrode 704 may be formed in such a manner that a conductive film is formed and then is etched by an inductively coupled plasma (ICP) etching method under appropriately controlled conditions (e.g., the amount of power applied to a coiled electrode layer, the amount of power applied to an electrode layer on the substrate side, and the electrode temperature on the substrate side) to have a desired tapered shape. In addition, angles and the like of the tapered shapes may also be controlled by the shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 9C:
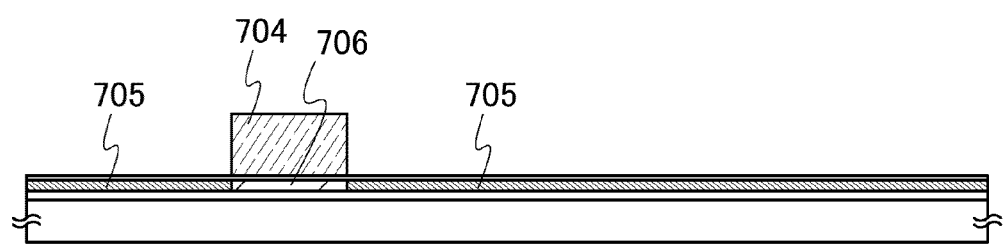

Next, as illustrated in FIG. 9C, when an impurity element which imparts one conductivity is added to the semiconductor film 702 with the gate electrode 704 used as a mask, a channel formation region 706 overlapping with the gate electrode 704 and a pair of impurity regions 705 between which the channel formation region 706 is interposed are formed in the semiconductor film 702.

In this embodiment, the case where an impurity element which imparts n-type conductivity (e.g., phosphorus) is added to the semiconductor film 702 is described.

Figure 10A:
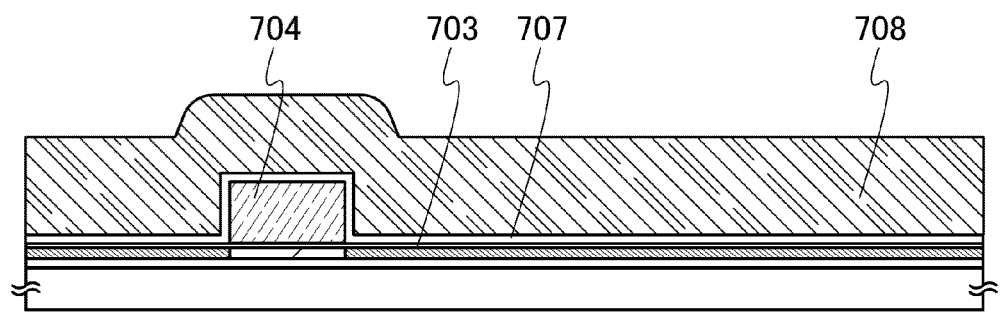
FIGS. 10A to 10C illustrate a method for forming a transistor which can be used for a memory circuit.

Next, as illustrated in FIG. 10A, insulating films 707 and 708 are formed so as to cover the gate insulating film 703 and the gate electrode 704. Specifically, an inorganic insulating film of silicon oxide, silicon nitride, silicon nitride oxide, silicon oxynitride, aluminum nitride, aluminum nitride oxide, or the like can be used as the insulating films 707 and 708. In particular, the insulating films 707 and 708 are preferably formed using a low dielectric constant (low-k) material because capacitance due to overlapping of electrodes or wirings can be sufficiently reduced. Note that a porous insulating film including such a material may be used as the insulating films 707 and 708. Since the porous insulating film has lower dielectric constant than a dense insulating film, parasitic capacitance due to electrodes or wirings can be further reduced.

In this embodiment, an example is described in which silicon oxynitride is used for the insulating film 707 and silicon nitride oxide is used for the insulating film 708. In addition, in this embodiment, although the insulating films 707 and 708 are formed over the gate electrode 704, according to one embodiment of the present invention, only one insulating film may be formed over the gate electrode 704, or three or more insulating films may be stacked.

Figure 10B:
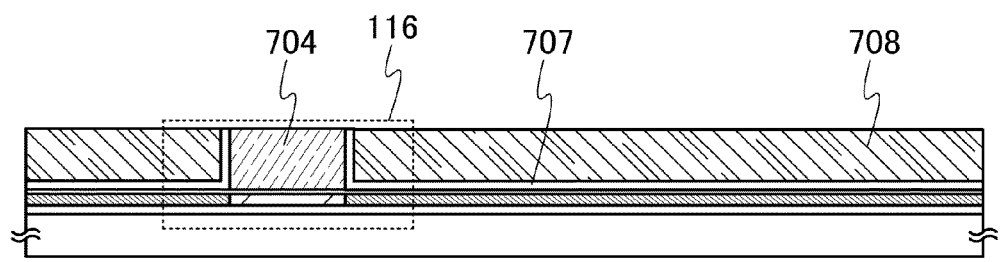

Next, as illustrated in FIG. 10B, the insulating films 707 and 708 are subjected to CMP (chemical mechanical polishing) treatment or etching, so that a surface of the gate electrode 704 is exposed. Note that in order to improve the characteristics of the first transistor 112 which is to be formed later, surfaces of the insulating films 707 and 708 are preferably planarized as much as possible.

Through the above process, the second transistor 116 can be formed.

Figure 10C:
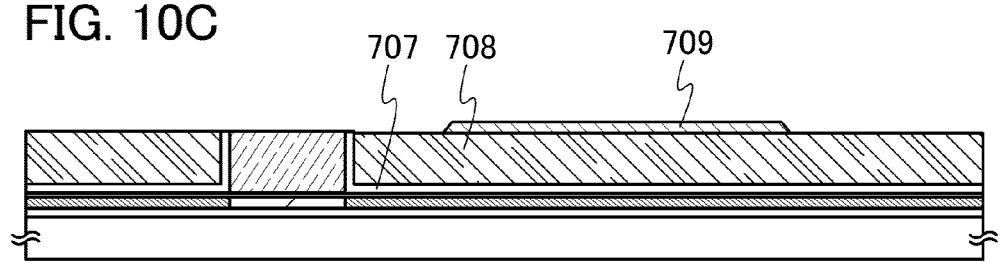

Next, methods for manufacturing the first transistor 112 and the capacitor 114 will be described. First, as illustrated in FIG. 10C, an oxide semiconductor film 709 is formed over the insulating film 708.

The oxide semiconductor film 709 can be formed by processing an oxide semiconductor film formed over the gate electrode 704, the insulating films 707 and 708 into a desired shape. The range of the thickness of the oxide semiconductor film is greater than or equal to 2 nm and less than or equal to 200 nm, preferably greater than or equal to 3 nm and less than or equal to 50 nm. The oxide semiconductor film is formed by a sputtering method using a metal oxide target. Moreover, the oxide semiconductor film can be formed by a sputtering method in a rare gas (e.g., argon) atmosphere, an oxygen atmosphere, or a mixed atmosphere of a rare gas (e.g., argon) and oxygen.

The oxide semiconductor film preferably contains at least indium (In) or zinc (Zn). In particular, In and Zn are preferably contained. As a stabilizer for reducing change in electric characteristics of a transistor including the oxide semiconductor film, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

For the oxide semiconductor film, for example, the following can be used: indium oxide, tin oxide, zinc oxide, a two-component metal oxide such as an In—Zn-based oxide, a Sn—Zn-based oxide, an Al—Zn-based oxide, a Zn—Mg—based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In-Lu-Zn-based oxide, or a four-component metal oxide such as an In—Sn—Ga—Zn-based oxide, an In-Hf—Ga—Zn-based oxide, an In—Al—Ga—Zn-based oxide, an In—Sn—Al—Zn-based oxide, an In—Sn-Hf-Zn-based oxide, or an In-Hf—Al—Zn-based oxide.

Note that here, for example, an "In—Ga—Zn-based oxide" means an oxide containing In, Ga, and Zn and there is no particular limitation on the ratio of In, Ga, and Zn. Further, the In—Ga-Z-based oxide may contain a metal element other than In, Ga, and Zn.

For example, an In—Ga—Zn-based oxide with an atomic ratio of In:Ga:Zn=1:1:1 (=1/3:1/3:1/3) or In: Ga: Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In: Sn: Zn=2:1:3 (=1/3:1/6:1/2), or In: Sn: Zn=2:1:5 (=1/4:1/8:5/8), or any of oxides whose composition is in the neighborhood of the above compositions may be used.

Note that one embodiment of the present invention is not limited thereto, and a material having appropriate composition depending on semiconductor characteristics (mobility, threshold, variation, and the like) may be used. Further, it is preferable to appropriately set the carrier concentration, the impurity concentration, the defect density, the atomic ratio of a metal element and oxygen, the interatomic distance, the density, or the like in order to obtain necessary semiconductor characteristics.

In this embodiment, an In—Ga—Zn-based oxide semiconductor thin film having a thickness of 30 nm which is obtained by a sputtering method using a metal oxide target containing indium (In), gallium (Ga), and zinc (Zn) (also referred to as an IGZO target) is used as the oxide semiconductor film. As the IGZO target, for example, a target having an atomic ratio of In:Ga:Zn=1:1:0.5, 1:1:1, or 1:1:2 can be used. The filling rate of the target containing In, Ga, and Zn is greater than or equal to 90% and less than or equal to 100%, preferably greater than or equal to 95% and less than 100%. With the use of such a target with a high filling rate, a dense oxide semiconductor film is formed.

Alternatively, an In—Sn—Zn-based oxide semiconductor thin film obtained by a sputtering method using a metal oxide target containing indium (In), tin (Sn), and zinc (Zn) (indium tin zinc oxide) may be used as the oxide semiconductor film. In the case of using an In—Sn—In—Mg-based material as the oxide semiconductor, a target having an atomic ratio of In:Sn:Zn=1:2:2, 2:1:3, 1:1:1, or 4:9:7 can be used.

In this embodiment, the substrate is held in a treatment chamber kept at reduced pressure, an argon gas and an oxygen gas from which hydrogen and moisture have been removed are introduced into the treatment chamber from which remaining moisture is being removed, and the oxide semiconductor film is formed with the use of the IGZO target. Note that a highly purified gas is preferably used as a sputtering gas. Specifically, in the argon gas, it is preferable that the purity be 9N (99.9999999%), the dew point be −121° C., the content of $H_2O$ be lower than or equal to 0.1 ppb, and the content of $H_2$ be lower than or equal to 0.5 ppb. In the oxygen gas, it is preferable that the purity be 8N (99.999999%), the dew point be −112° C., the content of $H_2O$ be lower than or equal to 1 ppb, and the content of $H_2$ be lower than or equal to 1 ppb. The use of such highly purified gases makes it possible to reduce the concentration of impurities in the oxide semiconductor film formed.

An entrapment vacuum pump is preferably used in order to remove moisture remaining in the treatment chamber. For example, a cryopump, an ion pump, or a titanium sublimation pump can be used. An evacuation unit may be a turbo molecular pump provided with a cold trap. In the treatment chamber that is evacuated with the cryopump, a hydrogen atom, a compound containing a hydrogen atom such as water ($H_2O$), (more preferably, also a compound containing a carbon atom), and the like are removed, whereby the impurity concentration in the oxide semiconductor film formed in the treatment chamber can be reduced.

Moreover, when the leakage rate of the treatment chamber is set to lower than or equal to $1\times10^{-10}$ Pa·m$^3$/second, entry of impurities such as an alkali metal and hydride into the oxide semiconductor film that is being formed by a sputtering method can be suppressed. Further, when the above entrapment vacuum pump is used as an evacuation system, counter flow of an impurities such as an alkali metal, a hydrogen atom, a hydrogen molecule, water, a hydroxyl group, and hydride from the evacuation system can be suppressed.

The substrate temperature may be higher than or equal to 100° C. and lower than or equal to 600° C., preferably higher than or equal to 200° C. and lower than or equal to 400° C. in film formation. By forming the oxide semiconductor film in a state where the substrate is heated, the concentration of an impurity contained in the formed oxide semiconductor film can be reduced. In addition, damage due to sputtering can be reduced.

It is preferable to form the oxide semiconductor film in a state where the substrate is heated because the defect density of the oxide semiconductor film formed can be reduced. The defect density of the oxide semiconductor film influences the field-effect mobility of a transistor. Here, the field-effect mobility of a transistor will be described below.

The actually measured field-effect mobility of an insulated gate transistor can be lower than its original mobility because of a variety of reasons; this phenomenon occurs not only in the case of using an oxide semiconductor film. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor film are $\mu_0$ and $\mu$, respectively, and a potential barrier (such as a grain boundary) exists in the semiconductor film, the field-effect mobility $\mu$ can be expressed by the following equation.

$$\mu = \mu_0 \exp\left(-\frac{E}{kT}\right) \quad \text{[EQUATION 1]}$$

Here, E represents the height of the potential barrier, k represents the Boltzmann constant, and T represents the absolute temperature. When the potential barrier is assumed to be attributed to a defect, the height of the potential barrier can be expressed by the following equation according to the Levinson model.

$$E = \frac{e^2 N^2}{8\varepsilon n} = \frac{e^3 N^2 t}{8\varepsilon C_{ox} V_g} \quad \text{[EQUATION 2]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor film is less than or equal to 30 nm, the thickness of the channel may be regarded as being the same as the thickness of the semiconductor film. The drain current $I_d$ in a linear region can be expressed by the following equation.

$$I_d = \frac{W\mu V_g V_d C_{ox}}{L}\exp\left(-\frac{E}{kT}\right) \quad \text{[EQUATION 3]}$$

Here, L represents the channel length and W represents the channel width, and L and W are each 10 μm here. In addition, $V_d$ represents the drain voltage. When dividing both sides of the above equation by $V_g$ and then taking logarithms of both sides, the following equation can be obtained.

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad \text{[EQUATION 4]}$$

The right side of Equation 4 is a function of $V_g$. From Equation 4, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor film in which the ratio of indium (In), tin (Sn), and zinc (Zn) is 1:1:1 is approximately $1\times10^{12}$/cm$^2$.

On the basis of the defect density obtained in this manner, or the like, $\mu_0$ can be calculated to be 120 cm$^2$/Vs from Equation 1 and Equation 2. The measured mobility of an In—Sn—Zn-based oxide including a defect is approximately 40 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at the interface between a channel and a gate insulating film affects the transport property of the transistor. In other words, the mobility $\mu_1$ at a position that is a distance x away from the interface between the channel and the gate insulating film can be expressed by the following equation.

$$\frac{1}{\mu_1} = \frac{1}{\mu_0} + \frac{D}{B}\exp\left(-\frac{x}{l}\right) \quad \text{[EQUATION 5]}$$

Here, D represents the electric field in the gate direction, and B and l are constants. B and l can be obtained from actual measurement results; according to the above measurement results, B is $4.75\times10^7$ cm/s and l is 10 nm (the depth to which the influence of interface scattering reaches). When D is increased (i.e., when the gate voltage is increased), the second term of Equation 5 is increased and accordingly the mobility $\mu_1$ is decreased.

Figure 16:
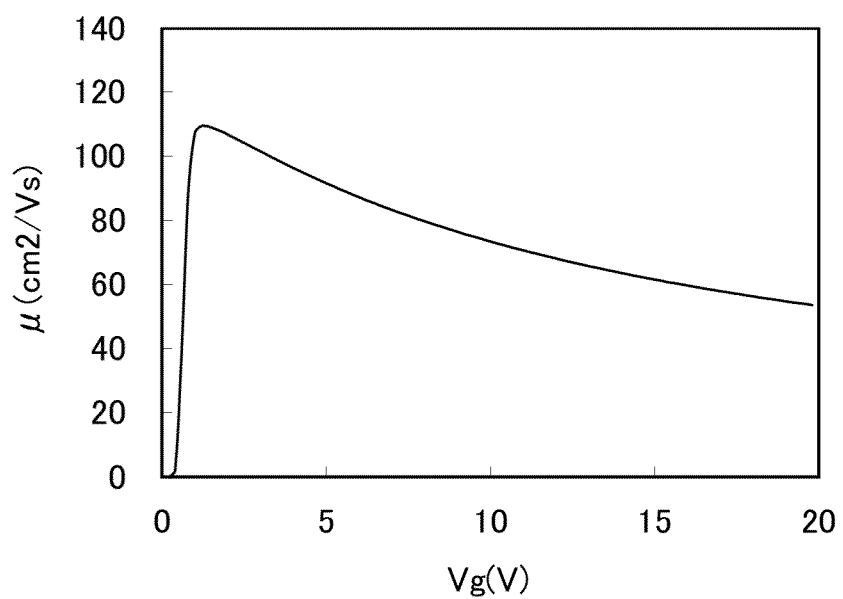
FIG. 16 shows gate voltage dependence of mobility, which is obtained by calculation.

Calculation results of the mobility $\mu_2$ of a transistor in which a channel includes an ideal oxide semiconductor without a defect inside the semiconductor are shown in FIG. 16. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 16, the mobility has a peak of more than 100 cm$^2$/Vs at a gate voltage $V_g$ that is a little over 1 V and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors which are manufactured using an oxide semiconductor having such a mobility are shown in FIGS. 17A to 17C, FIGS. 18A to 18C, and FIGS. 19A to 19C. FIGS. 20A and 20B illustrate cross-sectional structures of the transistors used for the calculation. The transistors illustrated in FIGS. 20A and 20B each include a semiconductor region 503a and a semiconductor region 503c which have n$^+$-type conductivity in an oxide semiconductor film. The resistivities of the semiconductor region 503a and the semiconductor region 503c are 2×10$^{-3}$ Ωcm.

The transistor illustrated in FIG. 20A is formed over a base insulating film 501 and an embedded insulating film 502 which is embedded in the base insulating film 501 and formed of aluminum oxide. The transistor includes the semiconductor region 503a, the semiconductor region 503c, an intrinsic semiconductor region 503b serving as a channel formation region therebetween, and a gate electrode 505. The width of the gate electrode 505 is 33 nm.

A gate insulating film 504 is formed between the gate electrode 505 and the semiconductor region 503b. In addition, a sidewall insulating film 506a and a sidewall insulating film 506b are formed on both side surfaces of the gate electrode 505, and an insulating film 507 is formed over the gate electrode 505 so as to prevent a short circuit between the gate electrode 505 and another wiring. The sidewall insulating film has a width of 5 nm. A source electrode 508a and a drain electrode 508b are provided in contact with the semiconductor region 503a and the semiconductor region 503c, respectively. Note that the channel width of this transistor is 40 nm.

The transistor of FIG. 20B is the same as the transistor of FIG. 20A in that it is formed over the base insulating film 501 and the embedded insulating film 502 formed of aluminum oxide and that it includes the semiconductor region 503a, the semiconductor region 503c, the intrinsic semiconductor region 503b provided therebetween, the gate electrode 505 having a width of 33 nm, the gate insulating film 504, the sidewall insulating film 506a, the sidewall insulating film 506b, the insulating film 507, the source electrode 508a, and the drain electrode 508b.

The transistor illustrated in FIG. 20A is different from the transistor illustrated in FIG. 20B in the conductivity type of semiconductor regions under the sidewall insulating film 506a and the sidewall insulating film 506b. In the transistor illustrated in FIG. 20A, the semiconductor regions under the sidewall insulating film 506a and the sidewall insulating film 506b are part of the semiconductor region 503a having n$^+$-type conductivity and part of the semiconductor region 503c having n$^+$-type conductivity, whereas in the transistor illustrated in FIG. 20B, the semiconductor regions under the sidewall insulating film 506a and the sidewall insulating film 506b are parts of the intrinsic semiconductor region 503b. In other words, a region having a width of $L_{off}$ which overlaps with neither the semiconductor region 503a (the semiconductor region 503c) nor the gate electrode 505 is provided. This region is called an offset region, and the width $L_{off}$ is called an offset length. As is seen from FIGS. 20A and 20B, the offset length is equal to the width of the sidewall insulating film 506a (the sidewall insulating film 506b).

Figure 17A:
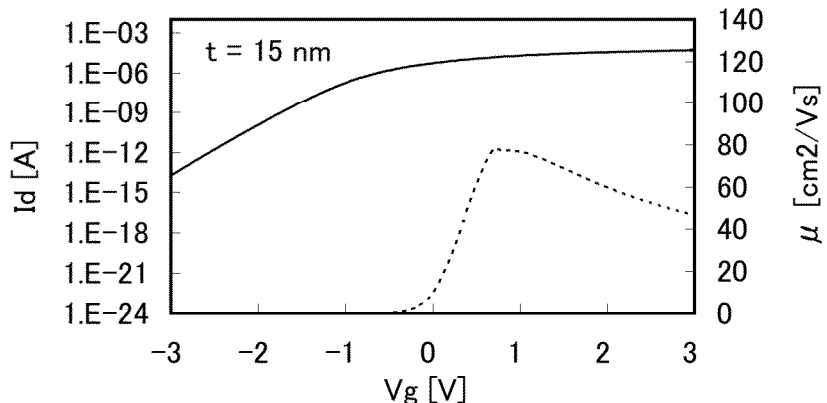
FIGS. 17A to 17C each show gate voltage dependence of drain current and mobility, which is obtained by calculation.
Figure 17B:
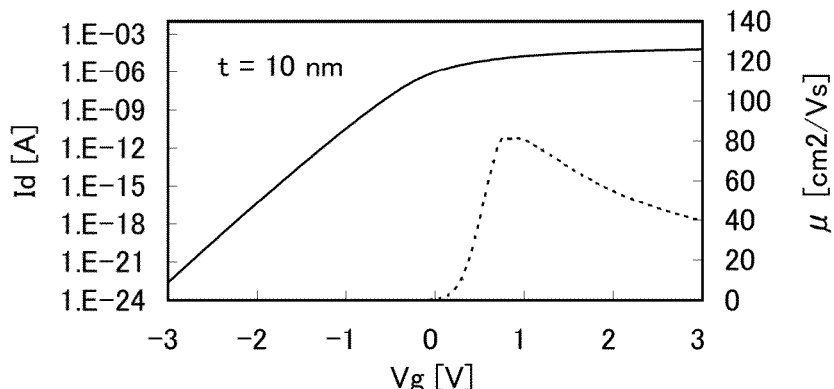
Figure 17C:
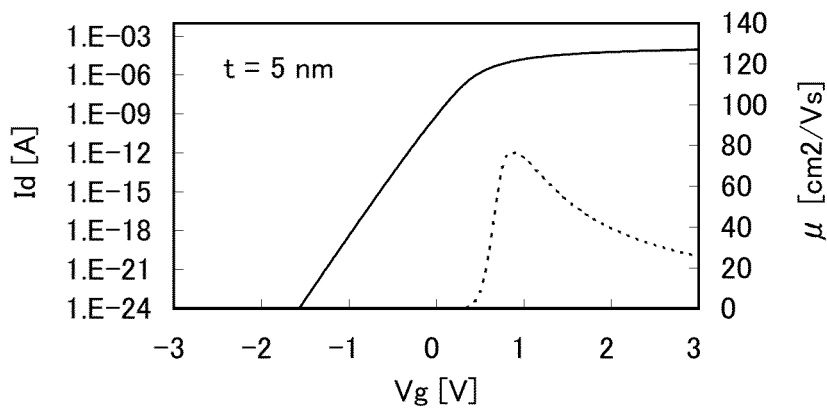

The other parameters used in calculation are as described above. For the calculation, device simulation software Sentaurus Device manufactured by Synopsys, Inc. was used. FIGS. 17A to 17C show the gate voltage ($V_g$: a potential difference between the gate and the source) dependence of the drain current ($I_d$, solid line) and the mobility (μ, dotted line) of the transistor having the structure illustrated in FIG. 20A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 17A shows the gate voltage dependence of the transistor in the case where the thickness of the gate insulating film is 15 nm, FIG. 17B shows that of the transistor in the case where the thickness of the gate insulating film is 10 nm, and FIG. 17C shows that of the transistor in the case where the thickness of the gate insulating film is 5 nm. As the thickness of the gate insulating film is smaller, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is sufficient for a transistor used in a memory circuit, at a gate voltage of around 1 V.

Figure 18A:
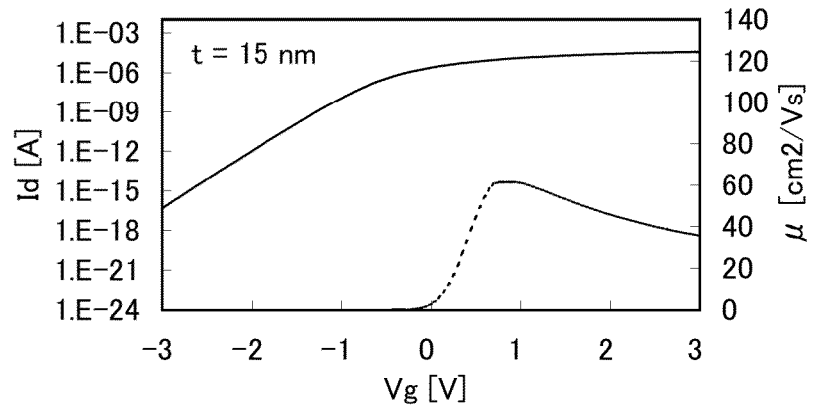
FIGS. 18A to 18C each show gate voltage dependence of drain current and mobility, which is obtained by calculation.
Figure 18B:
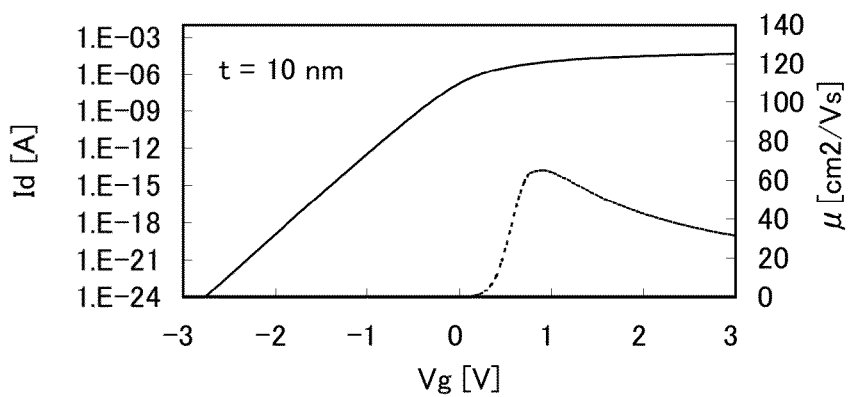
Figure 18C:
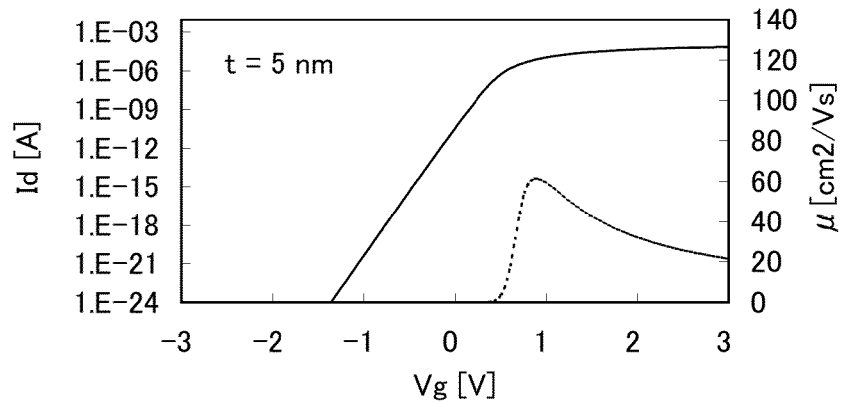

FIGS. 18A to 18C show the gate voltage $V_g$ dependence of the drain current $I_d$ (solid line) and the mobility μ (dotted line) of the transistor having the structure illustrated in FIG. 20B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 18A shows the gate voltage dependence of the transistor in the case where the thickness of the gate insulating film is 15 nm, FIG. 18B shows that of the transistor in the case where the thickness of the gate insulating film is 10 nm, and FIG. 18C shows that of the transistor in the case where the thickness of the gate insulating film is 5 nm.

Figure 19A:
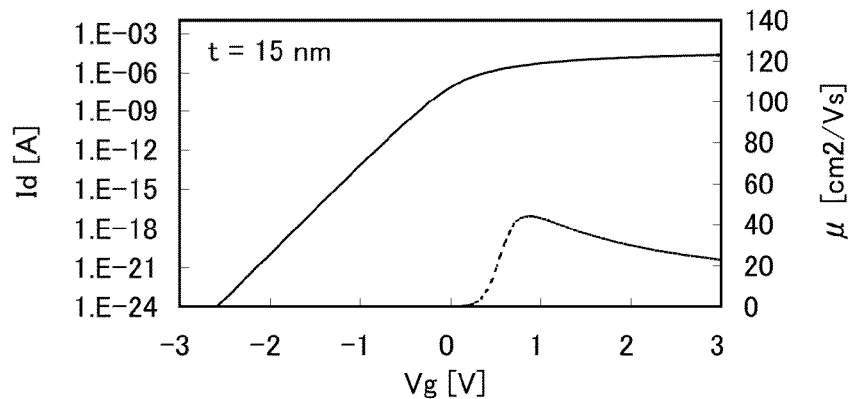
FIGS. 19A to 19C each show gate voltage dependence of drain current and mobility, which is obtained by calculation.
Figure 19B:
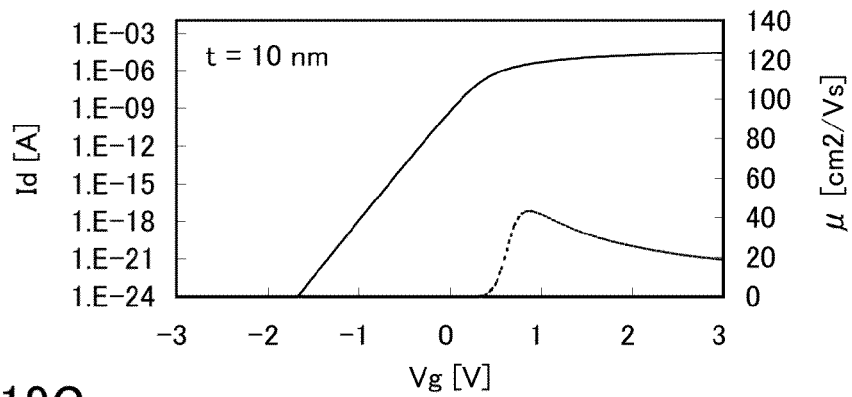
Figure 19C:
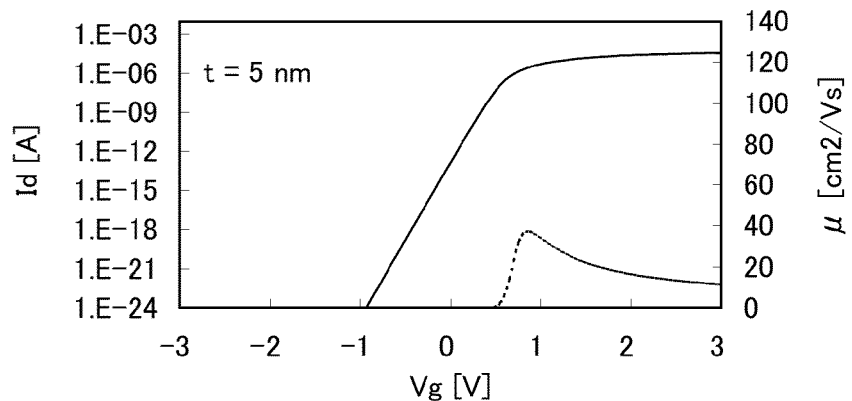
Figure 20A:
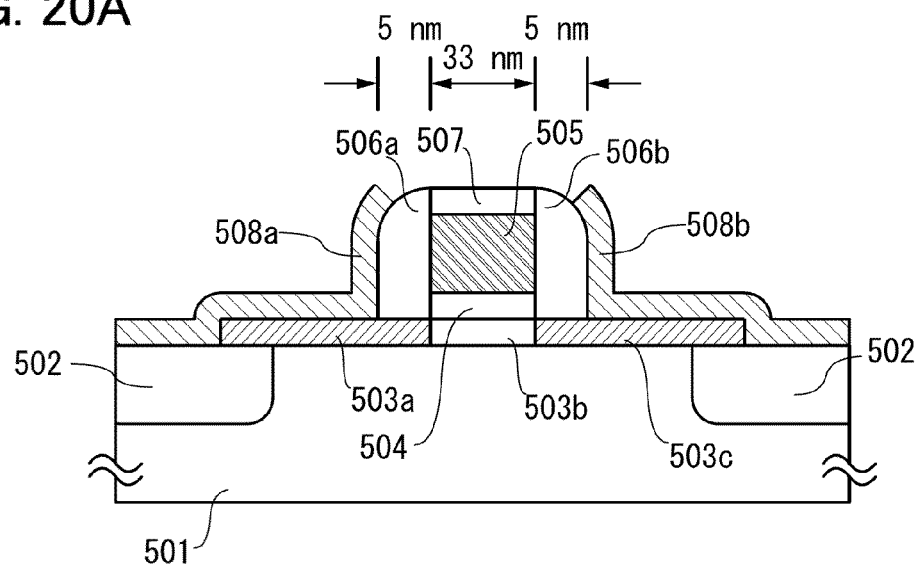
FIGS. 20A and 20B illustrate cross-sectional structures of transistors used for calculation.
Figure 20B:
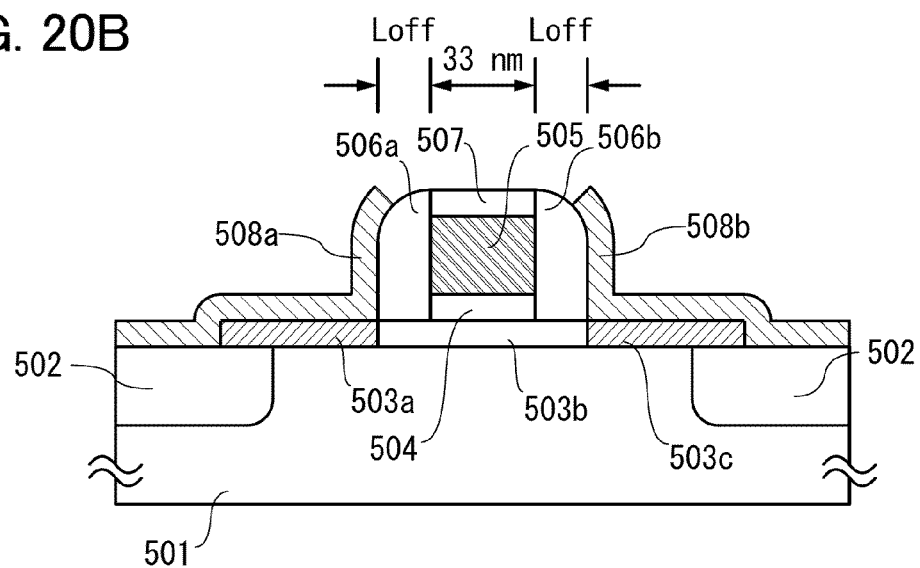

Further, FIGS. 19A to 19C show the gate voltage dependence of the drain current $I_d$ (solid line) and the mobility μ (dotted line) of the transistor having the structure illustrated in FIG. 20B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/Vs in FIGS. 17A to 17C, approximately 60 cm$^2$/Vs in FIGS. 18A to 18C, and approximately 40 cm$^2$/Vs in FIGS. 19A to 19C; thus, the peak of the mobility μ is lower as the offset length $L_{off}$ is longer. Further, the same applies to the off-state current. The on-state current is also decreased as the offset length $L_{off}$ is increased; however, the decrease in the on-state current is much more gradual than the decrease in the off-state current. The graphs show that the drain current exceeds 10 µA, which is sufficient for a transistor used in a memory circuit, at a gate voltage of around 1 V.

As one example of the film formation conditions of the oxide semiconductor film, the following conditions are employed: the substrate heating temperature is 200° C., the distance between the substrate and the target is 100 mm, the pressure is 0.6 Pa, the direct-current (DC) power is 0.5 kW, and the atmosphere is an oxygen atmosphere (the oxygen flow rate is 100%).

In order that the oxide semiconductor film may contain hydrogen, a hydroxyl group, and moisture as little as possible, it is preferable that an impurity adsorbed on the substrate 700, such as moisture or hydrogen, is eliminated and removed by preheating the substrate 700 over which films up to and including the insulating films 707 and 708 are formed, in a preheating chamber of a sputtering apparatus, for pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable.

Note that etching for forming the oxide semiconductor film 709 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As a dry etching method, a parallel plate RIE (reactive ion etching) method or an ICP (inductively coupled plasma) etching method can be used. In order to etch the film so that it has a desired shape, the etching condition (the amount of electric power applied to a coil-shaped electrode, the amount of electric power applied to an electrode on the substrate side, the temperature of the electrode on the substrate side, or the like) is adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask for forming the oxide semiconductor film 709 may be formed by an inkjet method. Formation of the resist mask by an inkjet method needs no photomask; thus, manufacturing cost can be reduced.

Note that the oxide semiconductor film formed by sputtering or the like contains a large amount of moisture or hydrogen (including a hydroxyl group) as an impurity in some cases. Moisture and hydrogen each easily form a donor level and thus serves as an impurity in the oxide semiconductor. In one embodiment of the present invention, in order to reduce impurities such as moisture or hydrogen in the oxide semiconductor film (dehydrate or dehydrogenate the oxide semiconductor film), the oxide semiconductor film 709 is subjected to heat treatment under a reduced-pressure atmosphere, an inert gas atmosphere of nitrogen, a rare gas, or the like, an oxygen gas atmosphere, or the like.

By performing the heat treatment on the oxide semiconductor film 709, moisture or hydrogen in the oxide semiconductor film 709 can be eliminated. Specifically, the heat treatment may be performed at a temperature higher than or equal to 250° C. and lower than or equal to 750° C., preferably at a temperature higher than or equal to 400° C. and lower than the strain point of the substrate. For example, the heat treatment may be performed at 500° C. for approximately more than or equal to 3 minutes and less than or equal to 6 minutes. When an RTA method is used for the heat treatment, dehydration or dehydrogenation can be performed in a short time; therefore, the treatment can be performed even at a temperature higher than the strain point of a glass substrate.

In this embodiment, an electrical furnace that is one of heat treatment apparatuses is used.

Note that a heat treatment apparatus is not limited to an electrical furnace, and may include a device for heating an object to be processed by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon, is used.

It is preferable that in the heat treatment, moisture, hydrogen, and the like are not contained in nitrogen or a rare gas such as helium, neon, or argon. It is preferable that the purity of nitrogen or a rare gas such as helium, neon, or argon, which is introduced into a heat treatment apparatus, is set to be 6N (99.9999%) or higher, preferably 7N (99.99999%) or higher (that is, the impurity concentration is 1 ppm or lower, preferably 0.1 ppm or lower).

Through the above steps, the concentration of hydrogen in the oxide semiconductor film 709 can be reduced. The concentration of hydrogen in the oxide semiconductor film 709 is $5 \times 10^{19}/cm^3$ or less, preferably $5 \times 10^{18}/cm^3$ or less.

Note that it is preferable to further perform heat treatment in an oxidation atmosphere after the heat treatment for dehydration or dehydrogenation is performed. Oxygen vacancies caused in oxide semiconductor film 709 in the heat treatment for dehydration or dehydrogenation can be filled with oxygen when the heat treatment in an oxidation atmosphere is performed. Since oxygen can be thus supplied to the oxide semiconductor film 709, the heat treatment in an oxidation atmosphere can also be referred to as supply of oxygen. The supply of oxygen is performed at, for example, higher than or equal to 100° C. and lower than 350° C., preferably higher than or equal to 150° C. and lower than 250° C. Note that the heat treatment for dehydration or dehydrogenation and the heat treatment in an oxidation atmosphere are preferably performed in succession. When heat treatment for dehydration or dehydrogenation and the heat treatment in an oxidation atmosphere are successively performed, the productivity can be increased.

Note that the oxidation atmosphere refers to an atmosphere of an oxidation gas (e.g., an oxygen gas, an ozone gas, or a nitrogen oxide gas) and preferably does not contain hydrogen or the like. For example, the purity of the oxidation gas to be introduced is 8N (99.999999%) or higher, preferably 9N (99.9999999%) or higher. The oxidation atmosphere, as which an oxidation gas mixed with an inert gas may be used, contains an oxidation gas at least at a concentration of 10 ppm or more.

Note that the oxide semiconductor film may be amorphous or crystalline. As a crystalline oxide semiconductor film, a c-axis aligned crystalline oxide semiconductor (CAAC-OS) film can be used.

In a broad sense, a "CAAC-OS film" means a non-single-crystal material including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis.

The CAAC-OS film is not a single crystal film, but this does not mean that the CAAC-OS film is composed of only an amorphous component. Although the CAAC-OS film includes a crystallized portion (crystalline portion) or a crystallized region (crystalline region), a boundary between one crystalline portion and another crystalline portion or a boundary between one crystalline region and another crystalline region is not clear in some cases.

Note that nitrogen may be substituted for part of oxygen contained in the CAAC-OS film. The c-axes of individual crystalline portions included in the CAAC-OS film may be aligned in one direction (e.g., the direction parallel to the normal vector of the surface where the CAAC-OS film is formed or the normal vector of a surface of the CAAC-OS film).

As an example of such a CAAC-OS film, there is a material which is formed into a film shape and has a triangular or hexagonal atomic arrangement when observed from the direction perpendicular to a surface of the film, a surface of a substrate, or the interface between the film and the substrate, and in which metal atoms are arranged in a layered manner or metal atoms and oxygen atoms (or nitrogen atoms) are arranged in a layered manner when a cross section of the film is observed.

Here, an example of a crystal structure of the CAAC-OS film will be described in detail with reference to FIGS. 21A to 21E, FIGS. 22A to 22C, and FIGS. 23A to 23C. In FIGS. 21A to 21E, FIGS. 22A to 22C, and FIGS. 23A to 23C, the vertical direction corresponds to the c-axis direction and a plane perpendicular to the c-axis direction corresponds to the a-b plane, unless otherwise specified. When the expressions "upper half" and "lower half" are simply used, they refer to the upper half above the a-b plane and the lower half below the a-b plane (the upper half and the lower half with respect to the a-b plane). Further, in FIGS. 21A to 21E, O surrounded by a circle represents tetracoordinate O and a double circle represents tricoordinate O.

Figure 21A:
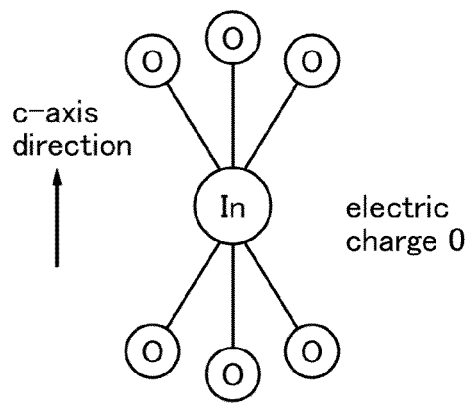
FIGS. 21A to 21E each illustrate a structure of an oxide material according to one embodiment of the present invention.

FIG. 21A illustrates a structure including one hexacoordinate In atom and six tetracoordinate oxygen (hereinafter referred to as tetracoordinate O) atoms proximate to the In atom. A structure including one metal atom and oxygen atoms proximate thereto is referred to as a small group. The structure in FIG. 21A is actually an octahedral structure, but is illustrated as a planar structure for simplicity. Note that three tetracoordinate O atoms exist in each of the upper half and the lower half in FIG. 21A. In the small group illustrated in FIG. 21A, electric charge is 0.

Figure 21D:
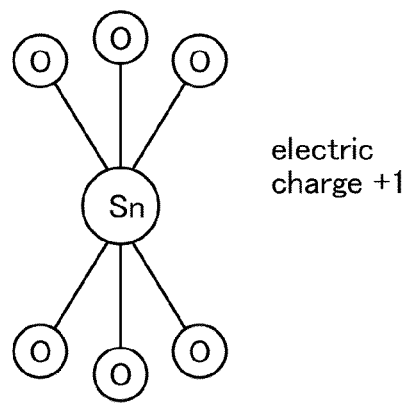
Figure 21B:
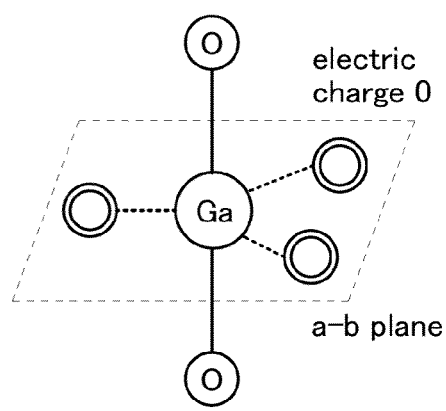

FIG. 21B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of the upper half and the lower half in FIG. 21B. An In atom can also have the structure illustrated in FIG. 21B because an In atom can have five ligands. In the small group illustrated in FIG. 21B, electric charge is 0.

Figure 21E:
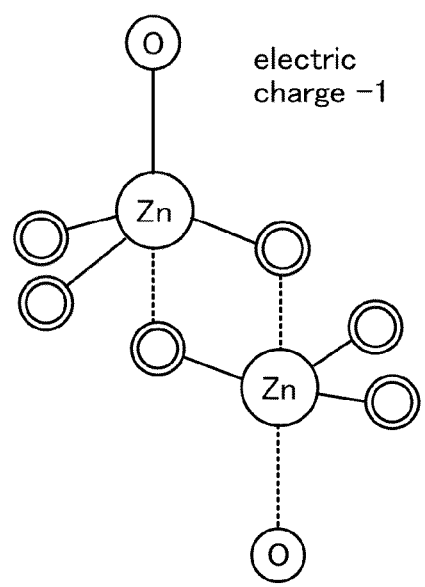
Figure 21C:
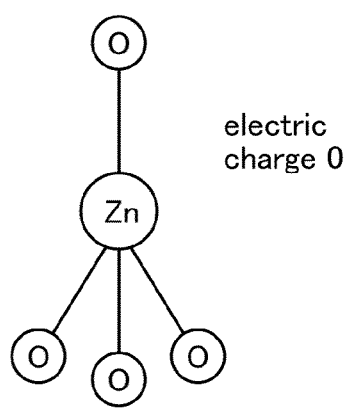

FIG. 21C illustrates a structure including one tetracoordinate Zn atom and four tetracoordinate O atoms proximate to the Zn atom. In FIG. 21C, one tetracoordinate O atom exists in the upper half and three tetracoordinate O atoms exist in the lower half Alternatively, three tetracoordinate O atoms may exist in the upper half and one tetracoordinate O atom may exist in the lower half in FIG. 21C. In the small group illustrated in FIG. 21C, electric charge is 0.

FIG. 21D illustrates a structure including one hexacoordinate Sn atom and six tetracoordinate O atoms proximate to the Sn atom. In FIG. 21D, three tetracoordinate O atoms exist in each of the upper half and the lower half In the small group illustrated in FIG. 21D, electric charge is +1.

FIG. 21E illustrates a small group including two Zn atoms. In FIG. 21E, one tetracoordinate O atom exists in each of the upper half and the lower half In the small group illustrated in FIG. 21E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 21A each have three proximate In atoms in the downward direction, and the three O atoms in the lower half each have three proximate In atoms in the upward direction. The one O atom in the upper half with respect to the pentacoordinate Ga atom in FIG. 21B has one proximate Ga atom in the downward direction, and the one O atom in the lower half has one proximate Ga atom in the upward direction. The one O atom in the upper half with respect to the tetracoordinate Zn atom in FIG. 21C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 22A illustrates a model of a medium group included in a layered structure of an In—Sn—In—Mg-based material. FIG. 22B illustrates a large group including three medium groups. Note that FIG. 22C illustrates an atomic arrangement in the case where the layered structure in FIG. 22B is observed from the c-axis direction.

In FIG. 22A, a tricoordinate O atom is omitted for simplicity, and a tetracoordinate O atom is illustrated by a circle; the number in the circle shows the number of tetracoordinate O atoms. For example, three tetracoordinate O atoms existing in each of the upper half and the lower half with respect to a Sn atom are denoted by circled 3. Similarly, in FIG. 22A, one tetracoordinate O atom existing in each of the upper half and the lower half with respect to an In atom is denoted by circled 1. FIG. 22A also illustrates a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half.

In the medium group included in the layered structure of the In—Sn—In—Mg-based material in FIG. 22A, in the order starting from the top, a Sn atom proximate to three tetracoordinate O atoms in each of the upper half and the lower half is bonded to an In atom proximate to one tetracoordinate O atom in each of the upper half and the lower half, the In atom is bonded to a Zn atom proximate to three tetracoordinate O atoms in the upper half, the Zn atom is bonded to an In atom proximate to three tetracoordinate O atoms in each of the upper half and the lower half through one tetracoordinate O atom in the lower half with respect to the Zn atom, the In atom is bonded to a small group that includes two Zn atoms and is proximate to one tetracoordinate O atom in the upper half, and the small group is bonded to a Sn atom proximate to three tetracoordinate O atoms in each of the upper half and the lower half through one tetracoordinate O atom in the lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracooridnate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 21E can be given. For example, with one small group including two Zn atoms, electric charge of one small group including a Sn atom can be cancelled, so that the total electric charge of the layered structure can be 0.

Specifically, when the large group illustrated in FIG. 22B is repeated, an In—Sn—In—Mg-based crystal ($In_2SnZn_3O_8$) can be obtained. Note that a layered structure of the obtained In—Sn—In—Mg-based crystal can be expressed by a composition formula, $In_2SnZn_2O_7(ZnO)_m$ (m is 0 or a natural number)

The above-described rule also applies to the following oxides: a four-component metal oxide such as an In—Sn—Ga—Zn-based oxide, three-component metal oxides such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In-Lu-Zn-based oxide, two-component metal oxides such as an In—Zn-based oxide, a Sn—Zn-based oxide, an Al—Zn-based oxide, a Zn—Mg—based oxide, a Sn—Mg-based oxide, an In—Mg-based oxide, and an In—Ga-based oxide, and the like.

As an example, FIG. 23A illustrates a model of a medium group included in a layered structure of an In—Ga—In—Mg-based material.

In the medium group included in the layered structure of the In—Ga—In—Mg-based material in FIG. 23A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 23B illustrates a large group including three medium groups. Note that FIG. 23C illustrates an atomic arrangement in the case where the layered structure in FIG. 23B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—In—Mg-based material, a large group can be formed using not only the medium group illustrated in FIG. 23A but also a medium group in which the arrangement of the In atom, the Ga atom, and the Zn atom is different from that in FIG. 23A.

In a CAAC-OS film, metal atoms and oxygen atoms are bonded in an orderly manner in comparison with an amorphous oxide semiconductor film. That is to say, in the case where an oxide semiconductor film is amorphous, the coordination numbers of oxygen atoms around a metal atom might vary between various metal atoms, but the coordination numbers of oxygen atoms around a metal atom are almost the same in a CAAC-OS film. Therefore, microscopic defects of oxygen can be reduced and instability and movement of electric charge that are due to attachment and detachment of hydrogen atoms (including hydrogen ions) or alkali metal atoms can be reduced.

A CAAC-OS film can be formed using even an extremely thin oxide semiconductor film (with a thickness of 5 nm, for example). The formation of such a CAAC-OS film with the above thickness allows the oxide semiconductor to have high reliability even when a transistor with a short L length (e.g., the L length is 30 nm) is manufactured.

Further, when a CAAC-OS film is formed, it is preferable to improve the flatness of a surface of a base film (here, the insulating film 708). The flatness of the surface is preferably the flatness of an insulating film flattened at the atomic level (also referred to as atomic layer flatness (ALF)); for example, the average surface roughness (Ra) of the insulating film 708 is 0.3 nm or less, preferably 0.1 nm or less, more preferably 0.07 nm or less. Favorable flatness of the surface of the insulating film 708 leads to an increase in crystallinity of a CAAC-OS film.

Through the above process, the oxide semiconductor film 709 can be formed.

Figure 11A:
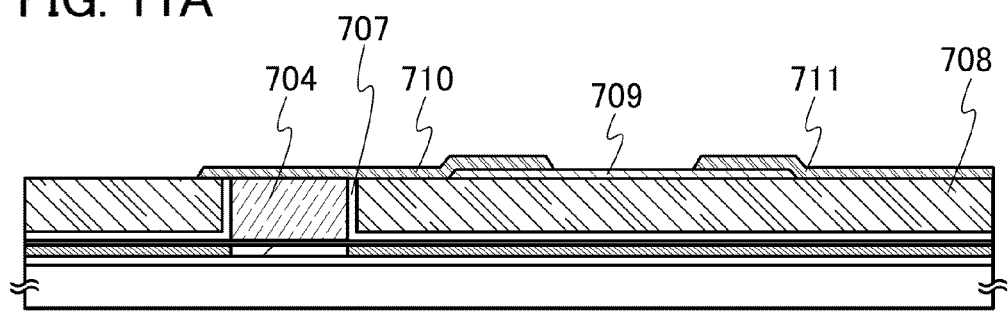
FIGS. 11A to 11C illustrate a method for forming a transistor which can be used for a memory circuit.

Then, as illustrated in FIG. 11A, the conductive film 710 which is in contact with the gate electrode 704 and the oxide semiconductor film 709, and the conductive film 711 which is in contact with the oxide semiconductor film 709 are formed. The conductive films 710 and 711 function as source and drain electrodes.

Specifically, the conductive films 710 and 711 can be formed in such a manner that a conductive film is formed so as to cover the gate electrode 704, the insulating film 707, the insulating film 708, and the oxide semiconductor film 709 by a sputtering method or a vacuum evaporation method and then is processed (patterned and etched) to have a predetermined shape.

For the conductive film for forming the conductive films 710 and 711, any of the following can be used: an element selected from aluminum, chromium, copper, tantalum, titanium, molybdenum, and tungsten; an alloy containing any of these elements; an alloy film containing the above elements in combination; and the like. Alternatively, a structure may be employed in which a film of a refractory metal such as chromium, tantalum, titanium, molybdenum, or tungsten is provided over or below a metal film of aluminum, copper, or the like. Aluminum or copper is preferably combined with a refractory metal material so as to prevent problems with heat resistance and corrosion. As the refractory metal material, molybdenum, titanium, chromium, tantalum, tungsten, neodymium, scandium, yttrium, or the like can be used.

Further, the conductive film for forming the conductive films 710 and 711 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given. A Cu—Mg—Al alloy, a Mo—Ti alloy, Ti, and Mo have high adhesion to an oxide film. Therefore, when a layered structure is employed for the conductive films 710 and 711, in which a conductive film containing a Cu—Mg—Al alloy, a Mo—Ti alloy, Ti, or Mo is used for the lower layer and a conductive film containing Cu is used for the upper layer, the adhesion between an insulating film which is an oxide film and the conductive films 710 and 711 can be increased.

In the case where heat treatment is performed after formation of the conductive film, the conductive film preferably has heat resistance high enough to withstand the heat treatment.

Note that each material and etching conditions are adjusted as appropriate so that the oxide semiconductor film 709 is not removed in etching of the conductive film as much as possible. Depending on etching conditions, an exposed portion of the oxide semiconductor film 709 may be partly etched, so that a groove (a recessed portion) is formed in some cases.

In this embodiment, a titanium film is used as the conductive film. Therefore, wet etching can be selectively performed on the conductive film with the use of a solution containing ammonia and hydrogen peroxide water (an ammonia hydrogen peroxide mixture). Specifically, an ammonia hydrogen peroxide mixture in which oxygenated water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography process, an etching step may be performed with the use of a resist mask formed with the use of a multi-tone mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing to provide different patterns. Therefore, a resist mask corresponding to two kinds or more of different patterns can be formed with one multi-tone mask. Thus, the number of light-exposure masks can be reduced and the number of corresponding photolithography steps can be also reduced, whereby simplification of a process can be achieved.

Further, an oxide conductive film functioning as a source region and a drain region may be provided between the oxide semiconductor film 709 and the conductive films 710 and 711 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 710 and 711 may be performed concurrently.

When the oxide conductive film functioning as a source region and a drain region is provided, resistance between the oxide semiconductor film 709 and the conductive films 710 and 711 can be reduced, so that the transistor can operate at high speed.

Next, plasma treatment is performed using a gas such as $N_2O$, $N_2$, or Ar. By this plasma treatment, water or the like adhering to an exposed surface of the oxide semiconductor film 709 is removed. Alternatively, plasma treatment using a mixture gas of oxygen and argon may be performed.

Figure 11B:
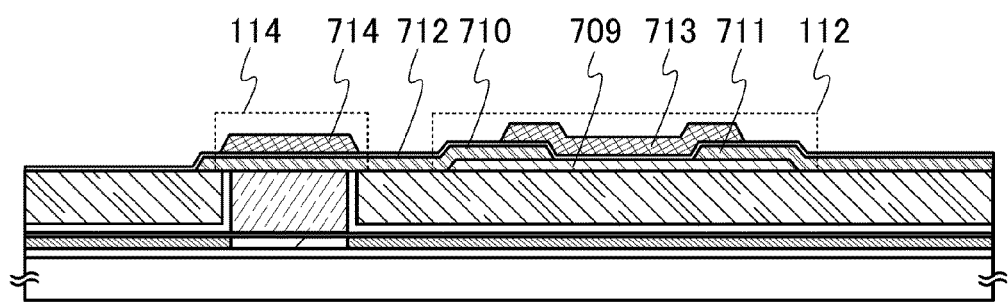

After the plasma treatment, as illustrated in FIG. 11B, the gate insulating film 712 is formed so as to cover the insulating film 708, the oxide semiconductor film 709, and the conductive films 710 and 711. Then, a gate electrode 713 is formed over the gate insulating film 712 in a position overlapping with the oxide semiconductor film 709, and a conductive film 714 is formed over the gate insulating film 712 in a position overlapping with the conductive film 710.

The gate insulating film 712 can be formed using a material and a layered structure which are similar to those of the gate insulating film 703. Note that the gate insulating film 712 preferably contains as few impurities such as moisture and hydrogen as possible, and may be formed using a single-layer insulating film or a plurality of insulating films stacked. When hydrogen is contained in the gate insulating film 712, entry of the hydrogen into the oxide semiconductor film 709 or extraction of oxygen from the oxide semiconductor film 709 by the hydrogen occurs, whereby the oxide semiconductor film 709 has low resistance (n-type conductivity); thus, a parasitic channel might be formed. Therefore, it is important that a film formation method in which hydrogen is not used is employed in order to form the gate insulating film 712 containing as little hydrogen as possible. A material having a high barrier property is preferably used for the gate insulating film 712.

For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having low proportion of nitrogen, such as a silicon oxide film or a silicon oxynitride film, is formed so that the oxide semiconductor film 709 is closer to the insulating film having low proportion of nitrogen than to the insulating film having a high barrier property. Then, the insulating film having a high barrier property is formed so as to overlap with the conductive films 710 and 711 and the oxide semiconductor film 709 with the insulating film having a low proportion of nitrogen sandwiched therebetween. By using the insulating film having a high barrier property, the impurities such as moisture and hydrogen can be prevented from entering the oxide semiconductor film 709, the gate insulating film 712, or the interface between the oxide semiconductor film 709 and another insulating film and the vicinity thereof. In addition, the insulating film having low proportion of nitrogen, such as a silicon oxide film or a silicon oxynitride film formed in contact with the oxide semiconductor film 709 can prevent the insulating film formed using a material having a high barrier property from being in contact with the oxide semiconductor film 709.

In this embodiment, the gate insulating film 712 having a structure in which a silicon nitride film having a thickness of 100 nm formed by a sputtering method is stacked over a silicon oxide film having a thickness of 200 nm formed by a sputtering method is formed. The range of the substrate temperature in film formation may be higher than or equal to room temperature and lower than or equal to 300° C. and in this embodiment, the substrate temperature in film formation is 100° C.

After the gate insulating film 712 is formed, heat treatment may be performed. The heat treatment is performed in a nitrogen atmosphere, an atmosphere of ultra-dry air, or a rare gas (e.g., argon, helium) atmosphere preferably at a temperature higher than or equal to 200° C. and lower than or equal to 400° C., for example, at a temperature higher than or equal to 250° C. and lower than or equal to 350° C. It is preferable that the water content in the gas is 20 ppm or less, preferably 1 ppm or less, more preferably 10 ppb or less.

In this embodiment, for example, heat treatment is performed at 250° C. in a nitrogen atmosphere for 1 hour. Alternatively, RTA treatment for a short time at a high temperature may be performed before the formation of the conductive films 710 and 711 in a manner similar to that of the previous heat treatment performed on the oxide semiconductor film to reduce moisture or hydrogen. Even when oxygen vacancies are generated in the oxide semiconductor film 709 by the previous heat treatment performed on the oxide semiconductor film 709, oxygen is supplied to the oxide semiconductor film 709 from the gate insulating film 712 by performing heat treatment after providing the gate insulating film 712 containing oxygen. By supplying oxygen to the oxide semiconductor film 709, oxygen vacancies can be reduced in the oxide semiconductor film 709 and the stoichiometric ratio can be satisfied. It is preferable that the proportion of oxygen in the oxide semiconductor film 709 is higher than that in the stoichiometric composition.

As a result, the oxide semiconductor film 709 can be made to be substantially i-type (intrinsic) and variations in electrical characteristics of the transistor due to oxygen vacancies can be reduced; thus, the off-state current of the transistor can be extremely low. The timing of this heat treatment is not particularly limited as long as it is after the formation of the gate insulating film 712. When this heat treatment doubles as another step such as heat treatment for formation of a resin film, the oxide semiconductor film 709 can be made to be substantially i-type without the number of steps increased.

Alternatively, oxygen may be added to the oxide semiconductor film 709 by an ion implantation method, an ion doping method, or the like to reduce oxygen vacancies. For example, oxygen which is made to be plasma with a microwave of 2.45 GHz may be added to the oxide semiconductor film 709.

The gate electrode 713 and the conductive film 714 can be formed in such a manner that a conductive film is formed over the gate insulating film 712 and then is patterned. The gate electrode 713 and the conductive film 714 can be formed using a material similar to that of the gate electrode 704 and the conductive films 710 and 711.

The thickness of each of the gate electrode 713 and the conductive film 714 is 10 nm to 400 nm, preferably 100 nm to 200 nm. In this embodiment, after a conductive film is formed to have a thickness of 150 nm by a sputtering method using a tungsten target, the conductive film is processed (patterned and etched) to have a desired shape, whereby the gate electrode 713 and the conductive film 714 are formed. Note that a resist mask may be formed by an inkjet method. Formation of the resist mask by an inkjet method needs no photomask; thus, manufacturing cost can be reduced.

Through the above steps, the first transistor 112 is formed.

Note that a portion where the conductive film 710 and the conductive film 714 overlap with each other with the gate insulating film 712 provided therebetween corresponds to the capacitor 114.

Although the first transistor 112 is described as a single-gate transistor, a multi-gate transistor including a plurality of channel formation regions when a plurality of gate electrodes is included can be formed if needed.

Note that insulating films in contact with the oxide semiconductor film 709 (corresponding to the insulating film 708 and the gate insulating film 712 in this embodiment) may be formed using an insulating material containing a Group 13 element and oxygen. Many of oxide semiconductor materials contain Group 13 elements, and an insulating material containing a Group 13 element works well with oxide semiconductors. By using such an insulating material containing a Group 13 element for the insulating film in contact with the oxide semiconductor film, an interface with the oxide semiconductor film can be kept favorable.

An insulating material containing a Group 13 element refers to an insulating material containing one or more Group 13 elements. As the insulating material containing a Group 13 element, for example, gallium oxide, aluminum oxide, aluminum gallium oxide, gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor film including gallium, a material including gallium oxide may be used for an insulating film, so that favorable characteristics can be kept at the interface between the oxide semiconductor film and the insulating film. When the oxide semiconductor film and the insulating film containing gallium oxide are provided in contact with each other, accumulation of hydrogen at the interface between the oxide semiconductor film and the insulating film can be reduced, for example. Note that a similar effect can be obtained in the case where an element in the same group as a constituent element of the oxide semiconductor is used in an insulating film. For example, it is effective to form an insulating film with the use of a material containing aluminum oxide. Note that aluminum oxide is impermeable to water; therefore, it is preferable to use a material including aluminum oxide in terms of preventing entry of water to the oxide semiconductor film.

The insulating film in contact with the oxide semiconductor film 709 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating film in contact with the oxide semiconductor film 709 is formed using gallium oxide, the composition of gallium oxide can be set to be $Ga_2O_x$ (x=3+α, 0<α<1) by heat treatment in an oxygen atmosphere or by oxygen doping.

In the case where the insulating film in contact with the oxide semiconductor film 709 is formed using aluminum oxide, the composition of aluminum oxide can be set to be $Al_2O_x$ (x=3+α, 0<α<1) by heat treatment in an oxygen atmosphere or by oxygen doping.

In the case where the insulating film in contact with the oxide semiconductor film 709 is formed using gallium aluminum oxide (or aluminum gallium oxide), the composition of gallium aluminum oxide (or aluminum gallium oxide) can be set to be $Ga_xAl_{2-x}O_{3+α}$ (0<x<2, 0<α<1) by heat treatment in an oxygen atmosphere or by oxygen doping.

By oxygen doping, an insulating film which includes a region where the proportion of oxygen is higher than that in the stoichiometric composition can be formed. When the insulating film including such a region is in contact with the oxide semiconductor film, oxygen that exists excessively in the insulating film is supplied to the oxide semiconductor film, and oxygen vacancies in the oxide semiconductor film or at an interface between the oxide semiconductor film and the insulating film are reduced. Thus, the oxide semiconductor film can be made to be i-type or substantially i-type.

Note that the insulating film including a region where the proportion of oxygen is higher than that in the stoichiometric composition may be applied to either the insulating film located on the upper side of the oxide semiconductor film 709 or the insulating film located on the lower side of the oxide semiconductor film 709 of the insulating films in contact with the oxide semiconductor film 709; however, it is preferable to apply such an insulating film to both of the insulating films in contact with the oxide semiconductor film 709. The above effect can be enhanced with a structure where the insulating films each including a region where the proportion of oxygen is higher than that in the stoichiometric composition are used as the insulating films in contact with the oxide semiconductor film 709 and placed on the upper side and the lower side of the oxide semiconductor film 709, in order that the oxide semiconductor film 709 may be sandwiched between the insulating films.

The insulating films on the upper side and the lower side of the oxide semiconductor film 709 may include the same constituent element or different constituent elements. For example, the insulating films on the upper side and the lower side may be both formed using gallium oxide whose composition is $Ga_2O_x$ (x=3+α, 0<α<1). Alternatively, one of the insulating films on the upper side and the lower side may be formed using gallium oxide whose composition is $Ga_2O_x$ (x=3+α, 0<α<1) and the other may be formed using aluminum oxide whose composition is $Al_2O_x$ (x=3+α, 0<α<1). Still alternatively, one of the insulating films on the upper side and the lower side may be formed using silicon oxide whose composition is $SiO_x$ (x=2+α, 0<α<1) and the other may be formed using aluminum oxide whose composition is $Al_2O_x$ (x=3+α, 0<α<1).

The insulating film in contact with the oxide semiconductor film 709 may be formed by stacking insulating films each including a region where the proportion of oxygen is higher than that in the stoichiometric composition. For example, the insulating film on the upper side of the oxide semiconductor film 709 may be formed as follows: gallium oxide whose composition is $Ga_2O_x$ (x=3+α, 0<α<1) is formed and gallium aluminum oxide (or aluminum gallium oxide) whose composition is $Ga_xAl_{2-x}O_{3+α}$ (0<x<2, 0<α<1) is formed thereover. Note that the insulating film on the lower side of the oxide semiconductor film 709 may be formed by stacking insulating films each including a region where the proportion of oxygen is higher than that in the stoichiometric composition. Further, both of the insulating films on the upper side and the lower side of the oxide semiconductor film 709 may be formed by stacking insulating films each including a region where the proportion of oxygen is higher than that in the stoichiometric composition.

Figure 11C:
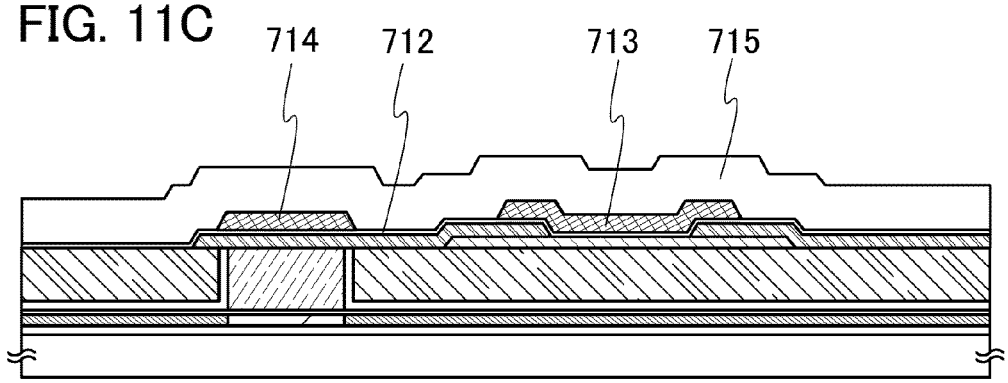

Next, as illustrated in FIG. 11C, an insulating film 715 is formed so as to cover the gate insulating film 712, the gate electrode 713, and the conductive film 714. The insulating film 715 can be formed by a sputtering method, a PE-CVD method, or the like. The insulating film 715 may be formed using a material including an inorganic insulating material such as silicon oxide, silicon oxynitride, silicon nitride, hafnium oxide, gallium oxide, or aluminum oxide. Note that for the insulating film 715, a material with a low dielectric constant or a structure with a low dielectric constant (e.g., a porous structure) is preferably used. This is because when the dielectric constant of the insulating film 715 is lowered, parasitic capacitance generated between wirings or electrodes can be reduced, which results in higher speed operation. Note that although the insulating film 715 has a single-layer structure in this embodiment, one embodiment of the present invention is not limited to this structure. The insulating film 715 may have a layered structure of two or more layers.

Through the above steps, a transistor used in a memory circuit can be manufactured. Note that in the manufacturing method described in this embodiment, the conductive films 710 and 711 functioning as source and drain electrodes are formed after the formation of the oxide semiconductor film 709. However, in the first transistor 112, the conductive films functioning as source and drain electrodes may be formed below the oxide semiconductor film 709, that is, between the oxide semiconductor film 709 and the insulating film 708.

Figure 12:
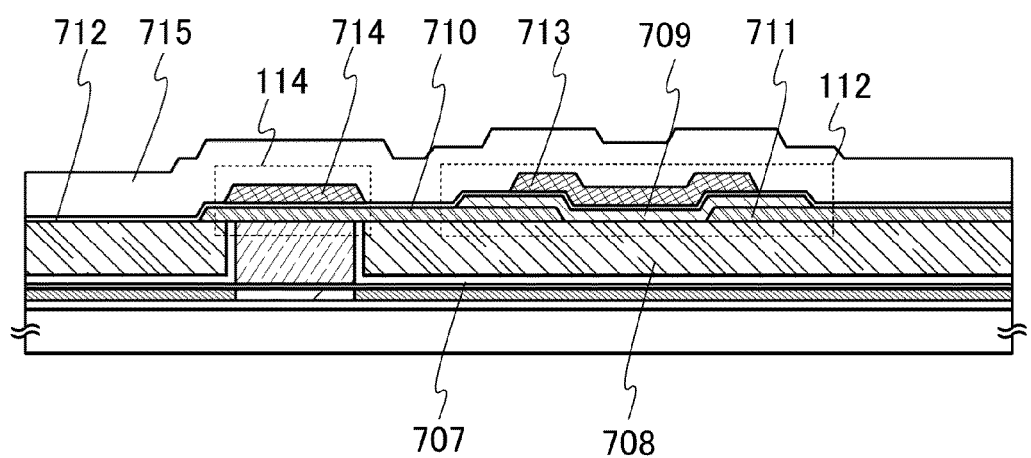
FIG. 12 is a cross-sectional view of a transistor which can be used for a memory circuit.

FIG. 12 is a cross-sectional view illustrating the first transistor 112, the capacitor 114, and the second transistor 116 in the case where the conductive films 710 and 711 functioning as source and drain electrodes are provided between the oxide semiconductor film 709 and the insulating film 708. The first transistor 112 illustrated in FIG. 12 can be obtained in such a manner that the conductive films 710 and 711 are formed after the formation of the insulating film 708, and then, the oxide semiconductor film 709 is formed.

A nonvolatile memory circuit can be formed using such a transistor formed using an oxide semiconductor. As a semiconductor device including a nonvolatile memory circuit, for example, a nonvolatile random access memory can be given.

A magnetic tunnel junction element (an MTJ element) is known as a nonvolatile random access memory. The MTJ element stores data in a low resistance state when the spin directions in films provided above and below an insulating film are parallel, and stores data in a high resistance state when the spin directions are not parallel. Thus, the principle of the MTJ element is completely different from that of the memory circuit formed using an oxide semiconductor in this embodiment. Table 1 shows comparisons between the MTJ element and the memory circuit according to this embodiment.

TABLE 1

|  | Spintronics (MTJ element) | OS/Si |
|---|---|---|
| 1) Heat Resistance | Curie Temperature | Process Temperature of 500° C. (Reliable at 150° C.) |
| 2) Driving Method | Current Drive | Voltage Drive |
| 3) Principle of Writing Operation | Change Spin Direction of Magnetic Substance | On/off of FET |
| 4) Si LSI | Suitable for Bipolar LSI (MOS Transistor is Preferred in High Integration Circuit (Bipolar Transistor is Unsuitable for High Integration), W is large) | Suitable for MOS LSI |
| 5) Overhead | Large (Due to Large Joule Heat) | 2 or 3 or More Orders of Magnitude Smaller (Charge and Discharge of Parasitic Capacitance) |
| 6) Nonvolatility | Utilizing Spin | Utilizing Small Off-State Current |
| 7) Number of Times of Reading Operation | Unlimited | Unlimited |
| 8) 3D Structure | Difficult (At Most Two Layers) | Easy (Number of Layers is Unlimited) |
| 9) Integration Degree ($F^2$) | $4F^2$ to $15F^2$ | Depending on Number of Layers for 3D Structure (Heat Resistance in Upper OSFET Process is Needed) |
| 10) Material | Magnetic Rare Earth Element | OS Material |
| 11) Cost per Bit | High | Low (Little High Depending on Material (e.g., In) of OS) |
| 12) Magnetic Field Resistance | Low | High |

The MTJ element is disadvantageous in that magnetic properties are lost when the temperature is the Curie temperature or higher because a magnetic material is used. Further, the MTJ element is compatible with a silicon bipolar device because current drive is employed. However, a silicon bipolar device is unsuitable for high integration. Furthermore, the MTJ element has a problem in that power consumption is increased by an increase in memory capacity, although the MTJ element consumes an extremely small amount of current during data writing.

In principle, the MTJ element has low resistance to a magnetic field, so that the spin direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process of forming a silicon semiconductor that avoids metal contamination. Further, the material cost per bit of the MTJ element is expensive.

On the other hand, the transistor formed using an oxide semiconductor in this embodiment has an element structure and an operation principle which are similar to those of a silicon MOSFET except that a semiconductor material of a channel is a metal oxide. Further, the transistor formed using an oxide semiconductor is not influenced by a magnetic field, and does not cause soft errors. This shows that the transistor is highly compatible with a silicon integrated circuit.

This embodiment can be implemented in combination with any of the other embodiments as appropriate.

(Embodiment 7)

In this embodiment, a transistor formed using an oxide semiconductor film, which has a structure different from that in Embodiment 6, will be described with reference to FIGS. 13A to 13D.

Figure 13A:
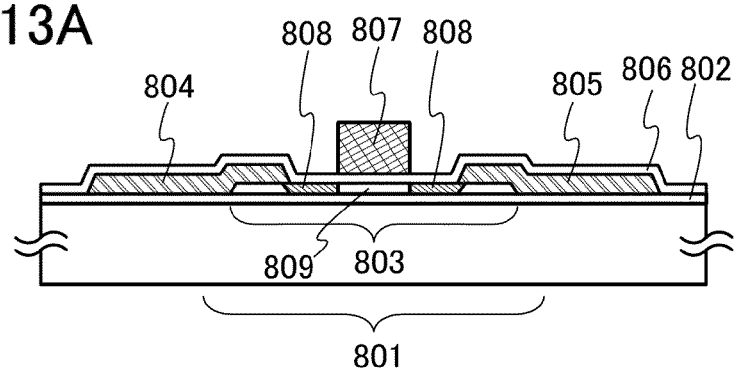
FIGS. 13A to 13D are each a cross-sectional view of a transistor which can be used for a memory circuit.

A transistor 801 illustrated in FIG. 13A includes, over an insulating film 802, an oxide semiconductor film 803 which functions as an active layer; a source electrode 804 and a drain electrode 805 which are formed over the oxide semiconductor film 803; a gate insulating film 806 over the oxide semiconductor film 803, the source electrode 804, and the drain electrode 805; and a gate electrode 807 which is provided over the gate insulating film 806 in a position overlapping with the oxide semiconductor film 803.

The transistor 801 illustrated in FIG. 13A is a top-gate transistor in which the gate electrode 807 is formed over the oxide semiconductor film 803 and also is a top-contact transistor in which the source electrode 804 and the drain electrode 805 are formed over the oxide semiconductor film 803. In the transistor 801, the source electrode 804 and the drain electrode 805 do not overlap with the gate electrode 807. That is, a distance between the source electrode 804 and the gate electrode 807 and a distance between the drain electrode 805 and the gate electrode 807 are each larger than the thickness of the gate insulating film 806. Accordingly, parasitic capacitance between the source electrode 804 and the gate electrode 807 and parasitic capacitance between the drain electrode 805 and the gate electrode 807 can be small, and thus high-speed operation can be achieved in the transistor 801.

The oxide semiconductor film 803 includes a pair of high concentration regions 808 which is obtained by addition of a dopant imparting n-type conductivity to the oxide semiconductor film 803 after the gate electrode 807 is formed. Further, in the oxide semiconductor film 803, a region which overlaps with the gate electrode 807 with the gate insulating film 806 provided therebetween is a channel formation region 809. In the oxide semiconductor film 803, the channel formation region 809 is provided between the pair of high concentration regions 808. The dopant for forming the high concentration regions 808 can be added by an ion implantation method. Nitrogen, phosphorus, boron, or the like can be used as the dopant.

For example, when nitrogen is used as the dopant, it is preferable that the high concentration regions 808 have a nitrogen atom concentration in the range of higher than or equal to $5\times10^{19}/cm^3$ and lower than or equal to $1\times10^{22}/cm^3$.

The high concentration regions 808 to which the dopant imparting n-type conductivity is added has higher conductivity than other regions in the oxide semiconductor film 803. Thus, the high concentration regions 808 are provided in the oxide semiconductor film 803, whereby the resistance between the source electrode 804 and the drain electrode 805 can be reduced.

When an In—Ga—Zn-based oxide semiconductor is used for the oxide semiconductor film 803, heat treatment is performed for approximately an hour at a temperature in the range of higher than or equal to 300° C. and lower than or equal to 600° C. after the addition of nitrogen, so that an oxide semiconductor in the high concentration regions 808 has a wurtzite crystal structure. When the oxide semiconductor in the high concentration regions 808 has a wurtzite crystal structure, the conductivity of the high concentration regions 808 can be further increased and the resistance between the source electrode 804 and the drain electrode 805 can be further reduced. Note that in order to effectively reduce the resistance between the source electrode 804 and the drain electrode 805 by forming the oxide semiconductor having a wurtzite crystal structure, when nitrogen is used as the dopant, the range of the nitrogen atom concentration in the high concentration regions 808 is preferably higher than or equal to $1 \times 10^{20}/cm^3$ and lower than or equal to 7 atoms %. However, even when the nitrogen atom concentration is lower than that in the above range, the oxide semiconductor having a wurtzite crystal structure can be obtained in some cases.

Further, the oxide semiconductor film 803 may be a CAAC-OS film. When the oxide semiconductor film 803 is a CAAC-OS film, the conductivity of the oxide semiconductor film 803 can be higher than that of an amorphous semiconductor film; therefore, the resistance between the source electrode 804 and the drain electrode 805 can be reduced.

The reduction in the resistance between the source electrode 804 and the drain electrode 805 ensures a high on-state current and high-speed operation even when the transistor 801 is miniaturized. Further, the miniaturization of the transistor 801 makes it possible to reduce an area occupied by a memory circuit including the transistor and increase memory capacity per unit area of the memory circuit.

Figure 13B:
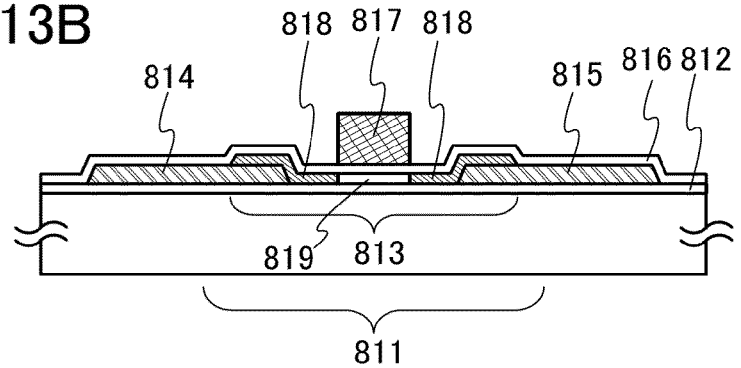

A transistor 811 illustrated in FIG. 13B includes a source electrode 814 and a drain electrode 815 which are formed over an insulating film 812; an oxide semiconductor film 813 which is formed over the source electrode 814 and the drain electrode 815 and functions as an active layer; a gate insulating film 816 over the oxide semiconductor film 813, the source electrode 814, and the drain electrode 815; and a gate electrode 817 which is provided over the gate insulating film 816 in a position overlapping with the oxide semiconductor film 813.

The transistor 811 illustrated in FIG. 13B is a top-gate transistor in which the gate electrode 817 is formed over the oxide semiconductor film 813, and also is a bottom-contact transistor in which the source electrode 814 and the drain electrode 815 are formed below the oxide semiconductor film 813. As in the transistor 801, the source electrode 814 and the drain electrode 815 do not overlap with the gate electrode 817 in the transistor 811. Thus, parasitic capacitance between the source electrode 814 and the gate electrode 817 and parasitic capacitance between the drain electrode 815 and the gate electrode 817 can be reduced and high-speed operation can be achieved.

In addition, the oxide semiconductor film 813 includes a pair of high concentration regions 818 which is obtained by addition of a dopant imparting n-type conductivity to the oxide semiconductor film 813 after the gate electrode 817 is formed. Further, in the oxide semiconductor film 813, a region which overlaps with the gate electrode 817 with the gate insulating film 816 provided therebetween is a channel formation region 819. The channel formation region 819 is provided between the pair of high concentration regions 818 in the oxide semiconductor film 813.

The high concentration regions 818 can be formed by an ion implantation method in a manner similar to that in the case of the high concentration regions 808 included in the transistor 801. The case of the high concentration regions 808 can be referred to for a kind of the dopant for forming the high concentration regions 818.

For example, when nitrogen is used as the dopant, it is preferable that the high concentration regions 818 have a nitrogen atom concentration in the range of higher than or equal to $5 \times 10^{19}/cm^3$ and lower than or equal to $1 \times 10^{22}/cm^3$.

The high concentration regions 818 to which the dopant imparting n-type conductivity is added has higher conductivity than other regions in the oxide semiconductor film 813. Thus, the high concentration regions 818 are provided in the oxide semiconductor film 813, whereby the resistance between the source electrode 814 and the drain electrode 815 can be reduced.

When an In—Ga—Zn-based oxide semiconductor is used for the oxide semiconductor film 813, heat treatment is performed at a temperature in the range of approximately higher than or equal to 300° C. and lower than or equal to 600° C. after addition of nitrogen, so that an oxide semiconductor in the high concentration regions 818 has a wurtzite crystal structure. When the oxide semiconductor in the high concentration regions 818 has a wurtzite crystal structure, the conductivity of the high concentration regions 818 can be further increased and the resistance between the source electrode 814 and the drain electrode 815 can be further reduced. Note that in order to effectively reduce the resistance between the source electrode 814 and the drain electrode 815 by forming the oxide semiconductor having a wurtzite crystal structure, when nitrogen is used as the dopant, the range of the nitrogen atom concentration in the high concentration regions 818 is preferably higher than or equal to $1 \times 10^{20}/cm^3$ and lower than or equal to 7 atoms %. However, even when the nitrogen atom concentration is lower than that in the above range, the oxide semiconductor having a wurtzite crystal structure can be obtained in some cases.

Further, the oxide semiconductor film 813 may be a CAAC-OS film. When the oxide semiconductor film 813 is a CAAC-OS film, the conductivity of the oxide semiconductor film 813 can be higher than that of an amorphous semiconductor film; therefore, the resistance between the source electrode 814 and the drain electrode 815 can be reduced.

The reduction in the resistance between the source electrode 814 and the drain electrode 815 ensures a high on-state current and high-speed operation even when the transistor 811 is miniaturized. Further, the miniaturization of the transistor 811 makes it possible to reduce an area occupied by a memory circuit including the transistor and increase memory capacity per unit area of the memory circuit.

Figure 13C:
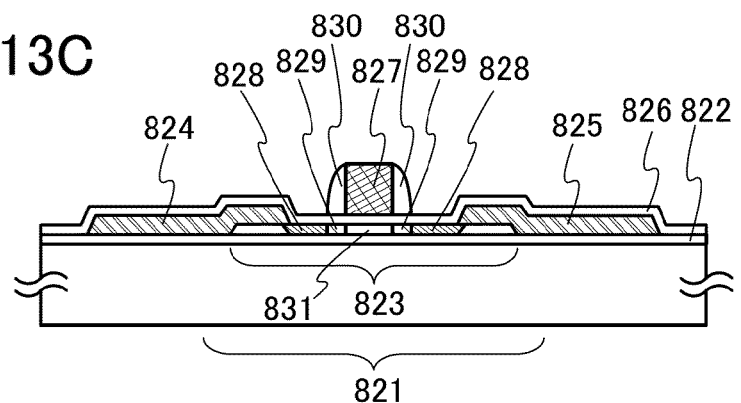

A transistor 821 illustrated in FIG. 13C includes an oxide semiconductor film 823 which is formed over an insulating film 822 and functions as an active layer; a source electrode 824 and a drain electrode 825 which are formed over the oxide semiconductor film 823; a gate insulating film 826 over the oxide semiconductor film 823, the source electrode 824, and the drain electrode 825; and a gate electrode 827 which is provided over the gate insulating film 826 in a position overlapping with the oxide semiconductor film 823. The transistor 821 further includes sidewalls 830 provided on the sides of the gate electrode 827 and formed using an insulating film.

The transistor 821 illustrated in FIG. 13C is a top-gate transistor in which the gate electrode 827 is formed over the oxide semiconductor film 823, and also is a top-contact transistor in which the source electrode 824 and the drain electrode 825 are formed over the oxide semiconductor film 823. In the transistor 821, the source electrode 824 and the drain electrode 825 do not overlap with the gate electrode 827 as in the transistor 801; thus, parasitic capacitances between the source electrode 824 and the gate electrode 827 and between the drain electrode 825 and the gate electrode 827 can be reduced, leading to high-speed operation.

Further, the oxide semiconductor film 823 includes a pair of high concentration regions 828 and a pair of low concentration regions 829 which can be obtained by addition of a dopant imparting n-type conductivity to the oxide semiconductor film 823 after the gate electrode 827 is formed. Furthermore, in the oxide semiconductor film 823, a region which overlaps with the gate electrode 827 with the gate insulating film 826 provided therebetween is a channel formation region 831. In the oxide semiconductor film 823, the pair of low concentration regions 829 is provided between the pair of high concentration regions 828, and the channel formation region 831 is provided between the pair of low concentration regions 829. The pair of low concentration regions 829 is provided in regions which are included in the oxide semiconductor film 823 and overlap with the sidewalls 830 with the gate insulating film 826 provided therebetween.

The high concentration regions 828 and the low concentration regions 829 can be formed by an ion implantation method as in the case of the high concentration regions 808 included in the transistor 801. The case of the high concentration regions 808 can be referred to for a kind of the dopant for forming the high concentration regions 828.

For example, when nitrogen is used as the dopant, it is preferable that the high concentration regions 828 have a nitrogen atom concentration in the range of higher than or equal to $5\times10^{19}/cm^3$ and lower than or equal to $1\times10^{22}/cm^3$. Further, when nitrogen is used as the dopant, for example, it is preferable that the low concentration regions 829 have a nitrogen atom concentration in the range of higher than or equal to $5\times10^{18}/cm^3$ and lower than $5\times10^{19}\ cm^3$.

The high concentration regions 828 to which the dopant imparting n-type conductivity is added have higher conductivity than other regions in the oxide semiconductor film 823. Thus, the high concentration regions 828 are provided in the oxide semiconductor film 823, whereby resistance between the source electrode 824 and the drain electrode 825 can be reduced. Further, the low concentration regions 829 are provided between the channel formation region 831 and the high concentration regions 828, which results in a reduction in negative shift of a threshold voltage due to a short-channel effect.

When an In—Ga—Zn-based oxide semiconductor is used for the oxide semiconductor film 823, heat treatment is performed for an hour at a temperature in the range of 300° C. to 600° C. after addition of nitrogen, so that an oxide semiconductor in the high concentration regions 828 has a wurtzite crystal structure. Further, the low concentration regions 829 may have a wurtzite crystal structure due to the heat treatment, depending on the concentration of the nitrogen. When the oxide semiconductor in the high concentration regions 828 has a wurtzite crystal structure, the conductivity of the high concentration regions 828 can be further increased and the resistance between the source electrode 824 and the drain electrode 825 can be further reduced. Note that in order to effectively reduce the resistance between the source electrode 824 and the drain electrode 825 by forming the oxide semiconductor having a wurtzite crystal structure, when nitrogen is used as a dopant, the range of the nitrogen atom concentration in the high concentration regions 828 is preferably higher than or equal to $1\times10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor film 823 may be a CAAC-OS film. When the oxide semiconductor film 823 is a CAAC-OS film, the conductivity of the oxide semiconductor film 823 can be higher than that of an amorphous semiconductor film; therefore, the resistance between the source electrode 824 and the drain electrode 825 can be reduced.

The reduction in the resistance between the source electrode 824 and the drain electrode 825 ensures a high on-state current and high-speed operation even when the transistor 821 is miniaturized. Further, the miniaturization of the transistor 821 makes it possible to reduce an area occupied by a memory circuit including the transistor and increase memory capacity per unit area of the memory circuit.

Figure 13D:
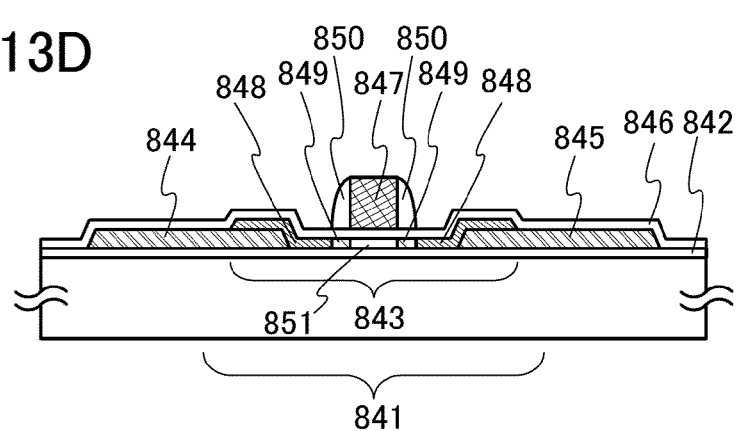

A transistor 841 illustrated in FIG. 13D includes a source electrode 844 and a drain electrode 845 which are formed over an insulating film 842; an oxide semiconductor film 843 which is formed over the source electrode 844 and the drain electrode 845 and functions as an active layer; a gate insulating film 846 over the oxide semiconductor film 843, the source electrode 844, and the drain electrode 845; and a gate electrode 847 over the gate insulating film 846 in a position overlapping with the oxide semiconductor film 843. The transistor 841 further includes sidewalls 850 provided on the sides of the gate electrode 847 and formed using an insulating film.

The transistor 841 illustrated in FIG. 13D is a top-gate transistor in which the gate electrode 847 is formed over the oxide semiconductor film 843, and is also a bottom-contact transistor in which the source electrode 844 and the drain electrode 845 are formed below the oxide semiconductor film 843. In the transistor 841, the source electrode 844 and the drain electrode 845 do not overlap with the gate electrode 847 as in the transistor 801; thus, parasitic capacitances between the source electrode 844 and the gate electrode 847 and between the drain electrode 845 and the gate electrode 847 can be reduced, leading to high-speed operation.

Further, the oxide semiconductor film 843 includes a pair of high concentration regions 848 and a pair of low concentration regions 849 which can be obtained by addition of a dopant imparting n-type conductivity to the oxide semiconductor film 843 after the gate electrode 847 is formed. Furthermore, in the oxide semiconductor film 843, a region which overlaps with the gate electrode 847 with the gate insulating film 846 provided therebetween is a channel formation region 851. In the oxide semiconductor film 843, the pair of low concentration regions 849 is provided between the pair of high concentration regions 848, and the channel formation region 851 is provided between the pair of low concentration regions 849. The pair of low concentration regions 849 is provided in a region which is included in the oxide semiconductor film 843 and overlaps with the sidewalls 850 with the gate insulating film 846 provided therebetween.

The high concentration regions 848 and the low concentration regions 849 can be formed by an ion implantation method as in the case of the high concentration regions 808 included in the transistor 801. The case of the high concentration regions 808 can be referred to for a kind of the dopant for forming the high concentration regions 848.

For example, when nitrogen is used as the dopant, it is preferable that the high concentration regions 848 have a nitrogen atom concentration in the range of higher than or equal to $5\times10^{19}/cm^3$ and lower than or equal to $1\times10^{22}/cm^3$. Further, when nitrogen is used as the dopant, for example, it is preferable that the low concentration regions 849 have a nitrogen atom concentration in the range of higher than or equal to $5\times10^{18}/cm^3$ and lower than $5\times10^{19}\ cm^3$.

The high concentration regions 848 to which the dopant imparting n-type conductivity is added has higher conductivity than other regions in the oxide semiconductor film 843. Thus, the high concentration regions 848 are included in the oxide semiconductor film 843, whereby resistance between the source electrode 844 and the drain electrode 845 can be reduced. Further, the low concentration regions 849 are provided between the channel formation region 851 and the high concentration regions 848, which result in a reduction in negative shift of a threshold voltage due to a short-channel effect.

When an In—Ga—Zn-based oxide semiconductor is used for the oxide semiconductor film 843, heat treatment at a temperature in the range of approximately 300° C. to 600° C. after addition of nitrogen enables an oxide semiconductor in the high concentration regions 848 to have a wurtzite crystal structure. Further, the low concentration regions 849 may have a wurtzite crystal structure due to the heat treatment, depending on the concentration of the nitrogen. When the oxide semiconductor in the high concentration regions 848 has a wurtzite crystal structure, the conductivity of the high concentration regions 848 can be further increased and the resistance between the source electrode 844 and the drain electrode 845 can be further reduced. Note that in order to effectively reduce the resistance between the source electrode 844 and the drain electrode 845 by forming the oxide semiconductor having a wurtzite crystal structure, when nitrogen is used as a dopant, the range of the nitrogen atom concentration in the high concentration regions 848 is preferably higher than or equal to $1 \times 10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor film 843 may be a CAAC-OS film. When the oxide semiconductor film 843 is a CAAC-OS film, the conductivity of the oxide semiconductor film 843 can be higher than that of an amorphous semiconductor film; therefore, the resistance between the source electrode 844 and the drain electrode 845 can be reduced.

The reduction in the resistance between the source electrode 844 and the drain electrode 845 ensures a high on-state current and high-speed operation even when the transistor 841 is miniaturized. Further, the miniaturization of the transistor 841 makes it possible to reduce an area occupied by a memory circuit including the transistor and increase memory capacity per unit area of the memory circuit.

Note that, as one of methods for manufacturing high concentration regions functioning as a source region and a drain region in a transistor including an oxide semiconductor through a self-aligned process, a method is disclosed in which a surface of an oxide semiconductor film is exposed and argon plasma treatment is performed to reduce the resistance of the region in the oxide semiconductor film which is exposed to plasma (S. Jeon et al. "180 nm Gate Length Amorphous InGaZnO Thin Film Transistor for High Density Image Sensor Applications", IEDM Tech. Dig., pp. 504-507, 2010).

However, in the manufacturing method, a gate insulating film needs to be partly removed after formation of the gate insulating film so that portions which are to serve as the source region and the drain region are exposed. At the time of partly removing the gate insulating film, part of an oxide semiconductor film below the gate insulating film is overetched, so that the thicknesses of the portions which are to serve as the source region and the drain region are reduced. As a result, the resistance of the source region and the drain region is increased, and a characteristic defect of the transistor due to the over-etching is likely to occur.

To miniaturize a transistor, it is necessary to employ a dry etching method with high process precision. However, the above over-etching is more likely to occur when a dry etching method is employed in which the etching rate of the oxide semiconductor film is not sufficiently different from the etching rate of the gate insulating film.

For example, no problem is caused when the oxide semiconductor film has a sufficient thickness, but in the case where the channel length is 200 nm or less, it is necessary that the thickness of a portion of the oxide semiconductor film, which is to serve as a channel formation region, be 20 nm or less, preferably 10 nm or less, in order that a short-channel effect may be prevented. When such a thin oxide semiconductor film is used, the over-etching of the oxide semiconductor film is not preferable because the resistance of the source region and the drain region is increased and a characteristic defect of the transistor is caused due to the over-etching as described above.

However, when a dopant is added to the oxide semiconductor film in the state where the oxide semiconductor film is not exposed and the gate insulating film remains, as described in this embodiment, the over-etching of the oxide semiconductor film can be prevented and excessive damage to the oxide semiconductor film can be reduced. In addition, an interface between the oxide semiconductor film and the gate insulating film is kept clean. Consequently, characteristics and reliability of the transistor can be improved.

This embodiment can be implemented in appropriate combination with any of the other embodiments.

(Embodiment 8)

In this embodiment, a transistor in which an oxide semiconductor film containing In, Sn, and Zn as main components is used for a channel formation region and characteristics of the transistor will be described with reference to FIGS. 24A and 24B, FIGS. 25A to 25C, FIGS. 26A and 26B, FIGS. 27A and 27B, FIG. 28, FIG. 29, FIG. 30, and FIGS. 31A and 31B.

Figure 24A:
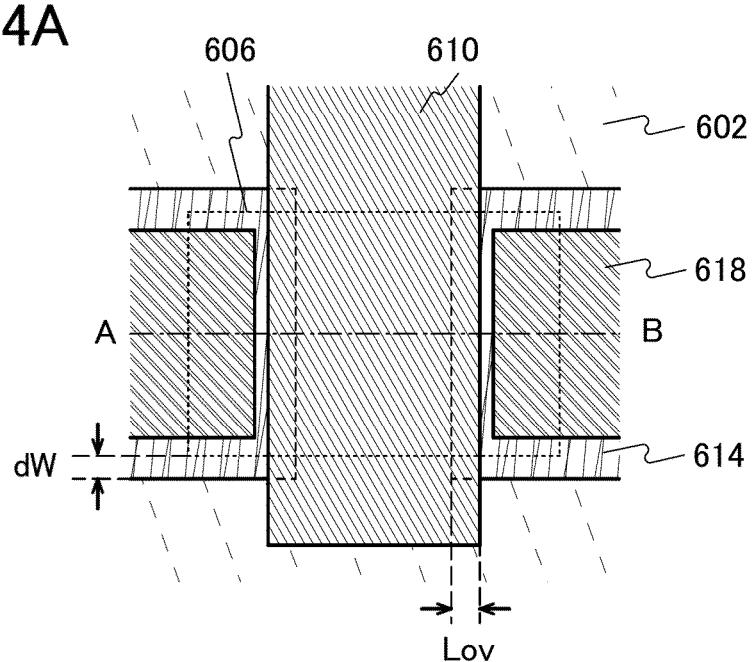
FIG. 24A is a plan view of a transistor and FIG. 24B is a cross-sectional view thereof.
Figure 24B:
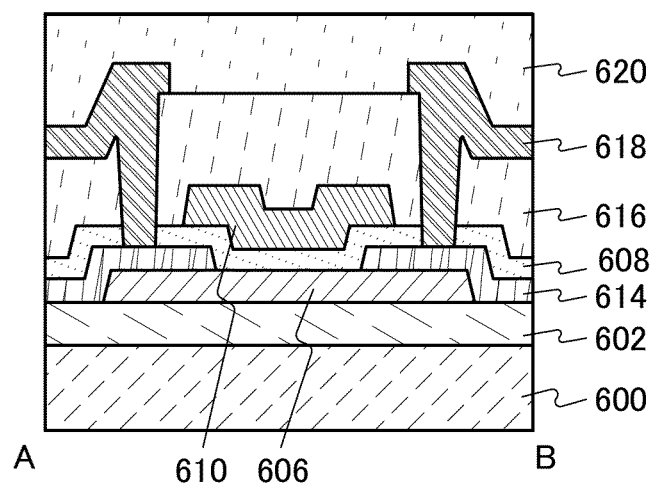

FIG. 24A is the top view of the transistor. FIG. 24B is a cross-sectional view along dashed-dotted line A-B in FIG. 24A.

The transistor illustrated in FIG. 24B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 600, a glass substrate can be used. As the base insulating film 602, a silicon oxide film can be used. As the oxide semiconductor film 606, an In—Sn—In—Mg film can be used. As the pair of electrodes 614, a tungsten film can be used. As the gate insulating film 608, a silicon oxide film can be used. The gate electrode 610 can have a layered structure of a tantalum nitride film and a tungsten film. The interlayer insulating film 616 can have a layered structure of a silicon oxynitride film and a polyimide film. The wirings 618 can each have a layered structure in which a titanium film, an aluminum film, and a titanium film are formed in this order. As the protective film 620, a polyimide film can be used.

Note that in the transistor having the structure illustrated in FIG. 24A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

In this embodiment, for the channel formation region, an oxide semiconductor film containing In, Sn, and Zn as main components can be used as the oxide semiconductor film 606.

A transistor in which an oxide semiconductor film containing In, Sn, and Zn as main components is used for a channel formation region can have favorable characteristics by forming the oxide semiconductor film while heating a substrate or by performing heat treatment after the oxide semiconductor film is formed. Note that a main component refers to an element contained in a composition at 5 atomic % or more.

When the oxide semiconductor film containing In, Sn, and Zn as main components is formed while the substrate is intentionally heated, the field-effect mobility of the transistor can be improved. Further, the threshold voltage of the transistor can be positively shifted.

Here, characteristics of the transistor in FIGS. 24A and 24B will be described below.

Figure 25A:
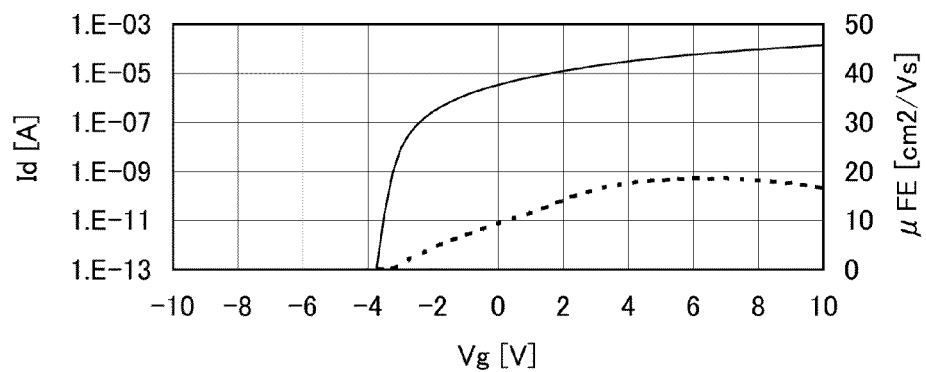
FIGS. 25A to 25C each show characteristics of a transistor.
Figure 25B:
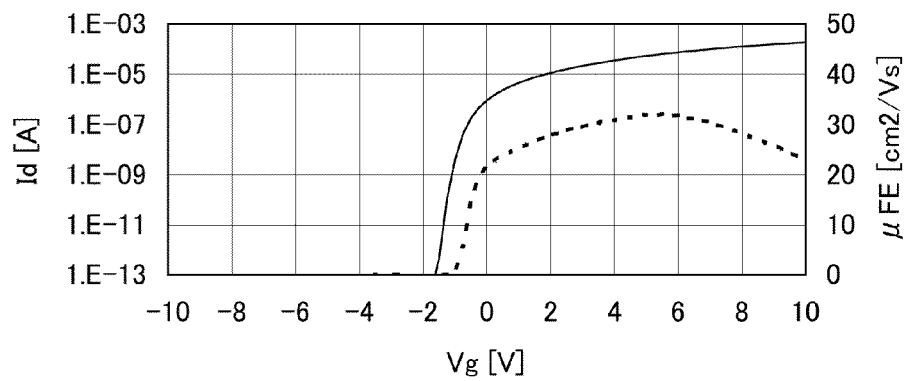
Figure 25C:
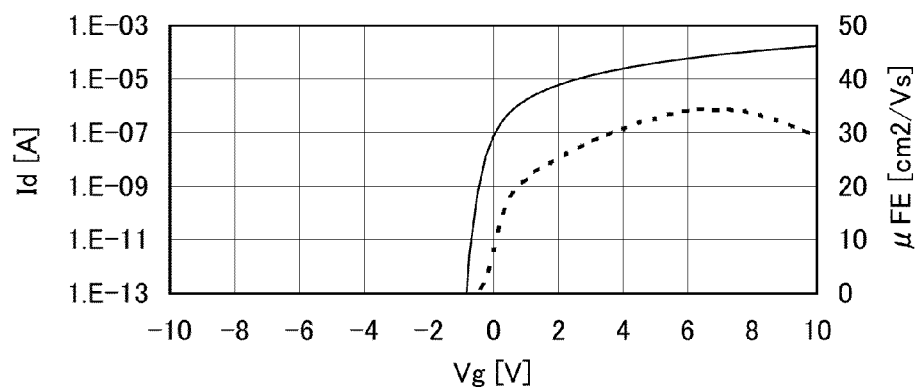

FIGS. 25A to 25C each show characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 25A shows characteristics of a transistor whose oxide semiconductor film containing In, Sn, and Zn as main components was formed by a sputtering method without heating a substrate intentionally. The field-effect mobility of the transistor is 18.8 cm$^2$/Vs. On the other hand, when the oxide semiconductor film containing In, Sn, and Zn as main components is formed while heating the substrate intentionally, the field-effect mobility can be improved. FIG. 25B shows characteristics of a transistor whose oxide semiconductor film containing In, Sn, and Zn as main components was formed while heating a substrate at 200° C. The field-effect mobility of the transistor is 32.2 cm$^2$/Vs.

The field-effect mobility can be further improved by performing heat treatment after formation of the oxide semiconductor film containing In, Sn, and Zn as main components. FIG. 25C shows characteristics of a transistor whose oxide semiconductor film containing In, Sn, and Zn as main components was formed by a sputtering method at 200° C. and then was subjected to heat treatment at 650° C. The field-effect mobility of the transistor is 34.5 cm$^2$/Vs.

It is expected that the intentional heating of the substrate can reduce moisture taken into the oxide semiconductor film during the formation by a sputtering method. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor film can be crystallized by being highly purified by removal of impurities from the oxide semiconductor film. In the case of using such a highly purified non-single-crystal oxide semiconductor film, ideally, a field-effect mobility exceeding 100 cm$^2$/Vs is expected to be achieved.

The oxide semiconductor film containing In, Sn, and Zn as main components may be crystallized in the following manner: oxygen ions are implanted into the oxide semiconductor film, hydrogen, a hydroxyl group, or moisture contained in the oxide semiconductor film is released by heat treatment, and the oxide semiconductor film is crystallized through the heat treatment or by another heat treatment performed later. By such crystallization treatment or recrystallization treatment, a non-single-crystal oxide semiconductor film having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 25A and 25B.

Note that the threshold voltage can also be controlled by changing the ratio of In, Sn, and Zn; when the composition ratio of In, Sn, and Zn is 2:1:3 in an atomic ratio, a transistor is expected to be normally off. In addition, an oxide semiconductor film having high crystallinity can be obtained when the composition ratio of a target is set as follows: In:Sn:Zn=2:1:3 (in an atomic ratio).

The temperature of the intentional heating of the substrate or the temperature of the heat treatment is 150° C. or higher, preferably 200° C. or higher, more preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Note that $V_d$ is a drain voltage (a potential difference between a drain and a source). Then, the substrate temperature was set to 150° C. and $V_d$ was set to 0.1 V. After that, 20 V of $V_g$ was applied so that the intensity of an electric field applied to the gate insulating film 608 was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, −20 V of $V_g$ was applied so that the intensity of an electric field applied to the gate insulating film 608 was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 26A:
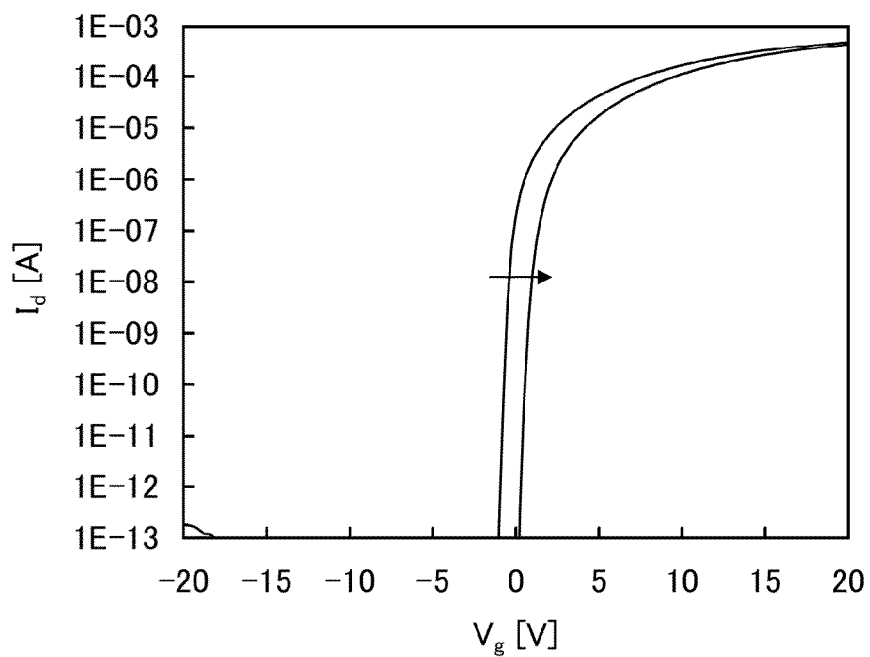
FIGS. 26A and 26B each show characteristics of a transistor.
Figure 26B:
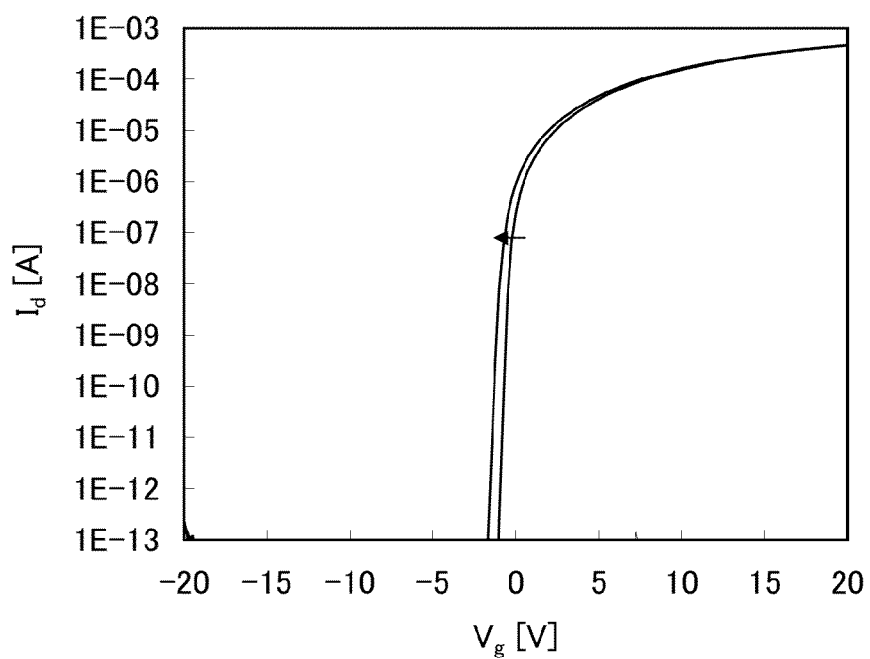
Figure 27A:
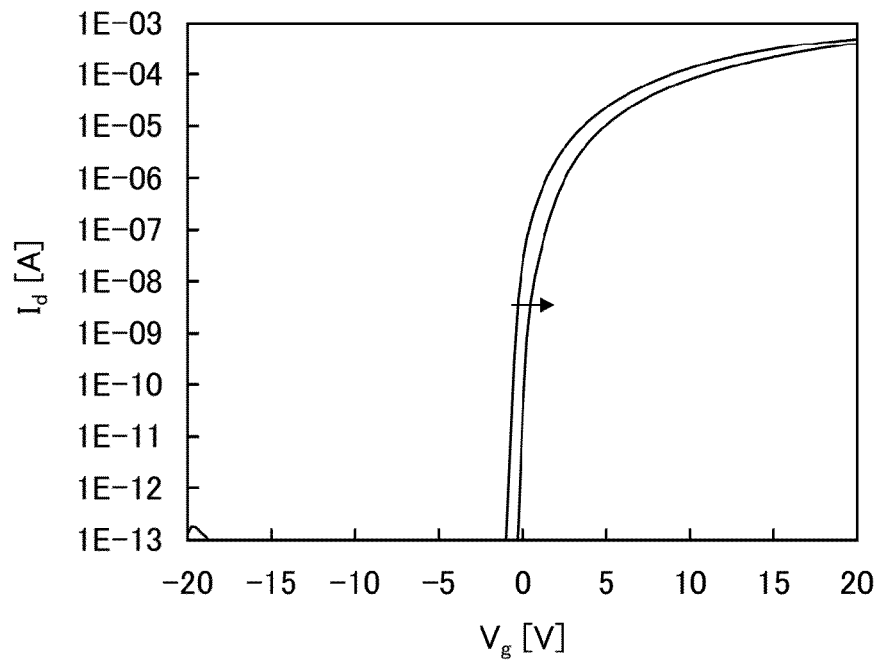
FIGS. 27A and 27B each show characteristics of a transistor.
Figure 27B:
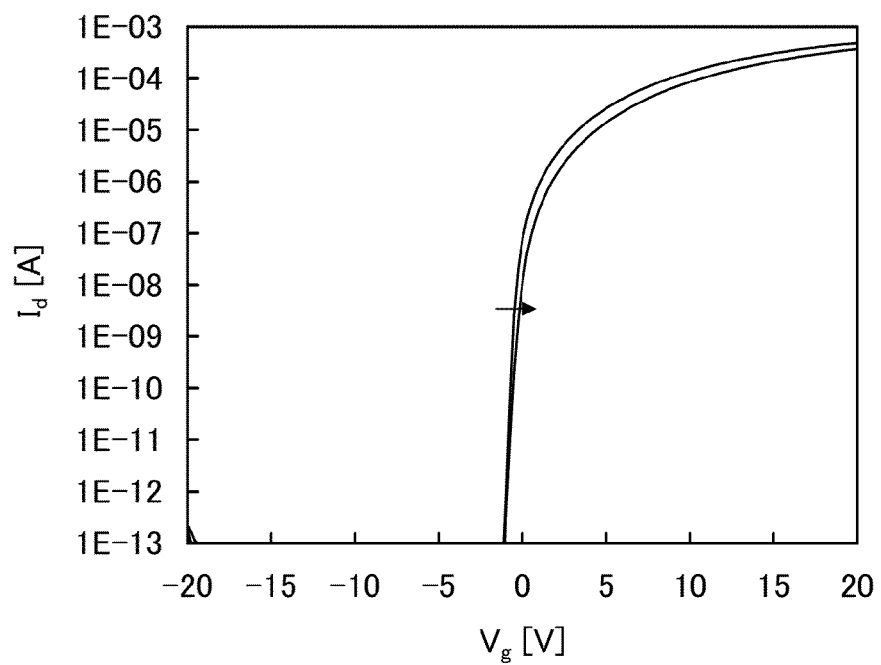

FIGS. 26A and 26B show a result of the positive BT test of Sample 1 and a result of the negative BT test of Sample 1, respectively. FIGS. 27A and 27B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere containing oxygen. Oxygen is supplied to the oxide semiconductor film after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancies is easily caused in the oxide semiconductor film or at the interface between the oxide semiconductor film and a film in contact with the oxide semiconductor film; however, when excess oxygen is contained in the oxide semiconductor film by the heat treatment, oxygen vacancies caused constantly can be filled with excess oxygen. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be contained in the oxide semiconductor film without causing crystal distortion or the like.

When heat treatment is performed so that at least part of the oxide semiconductor film includes crystal, a more stable oxide semiconductor film can be obtained. For example, when an oxide semiconductor film which is formed by a sputtering method using a target having a composition ratio of In:Sn:Zn=1:1:1 in an atomic ratio without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—In—Mg-based film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. Methods for forming Sample A and Sample B will be described below.

An In—Sn—In—Mg-based film with a thickness of 100 nm was formed over a quartz substrate subjected to dehydrogenation treatment.

The In—Sn—In—Mg-based film was formed with a sputtering apparatus with a power of 100 W (DC) in an oxygen atmosphere. An In—Sn—In—Mg-based target with an atomic ratio of In:Sn:Zn=1:1:1 was used as a target. Note that the substrate heating temperature in film formation was set to 200° C. A sample formed in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample formed in this manner was used as Sample B.

Figure 28:
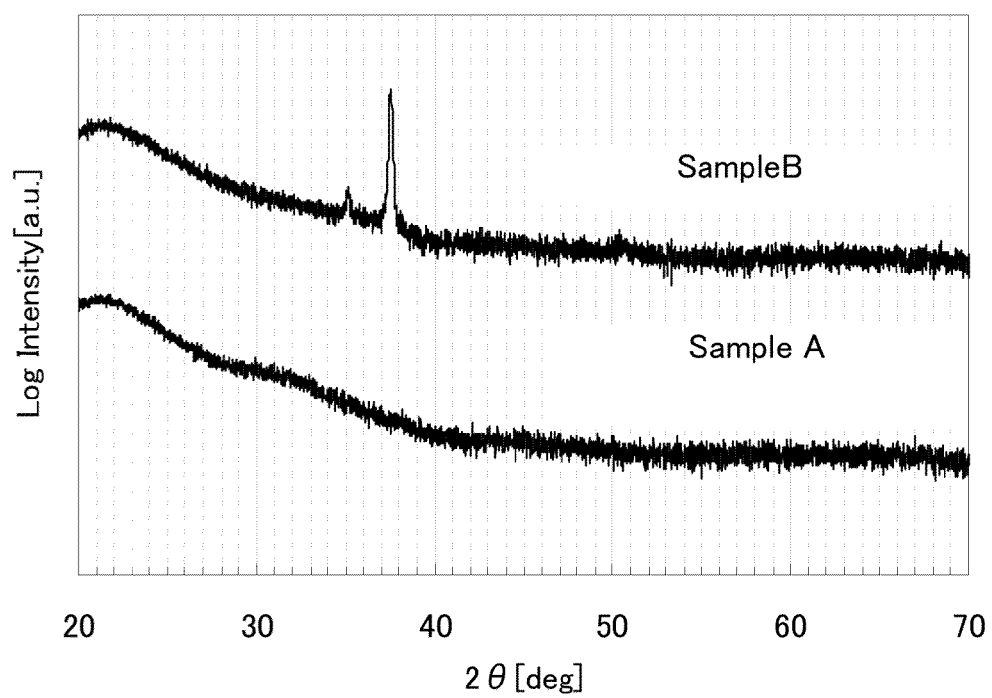
FIG. 28 shows an XRD spectrum of an oxide semiconductor film.

FIG. 28 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor film containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor film, from being included in the film or an effect of removing hydrogen and a hydroxyl group from the film. That is, an oxide semiconductor film can be highly purified by removing hydrogen serving as a donor impurity from the oxide semiconductor film. Further, even when oxygen vacancies are generated in an oxide semiconductor film, oxygen is supplied to the oxide semiconductor film by heat treatment in an oxygen atmosphere and/or supplied to the oxide semiconductor film from a base insulating film. Thus, a transistor can be normally off, and the high purification of an oxide semiconductor and the supply of oxygen enable the off-state current of the transistor to be 1 aA/μm or lower. Here, the unit of the off-state current is used to indicate current per micrometer in channel width.

Figure 29:
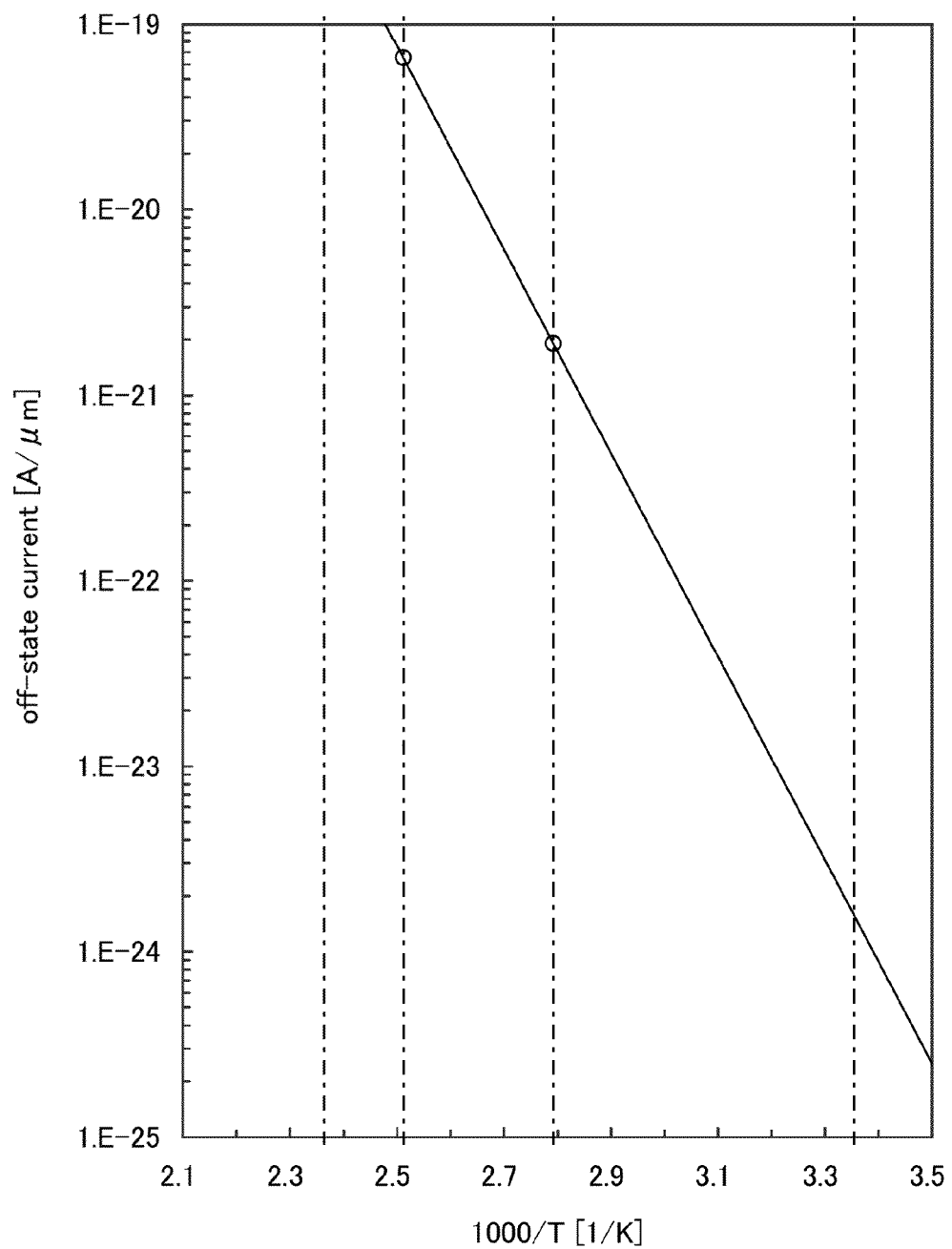
FIG. 29 shows off-state current of a transistor.

FIG. 29 shows the relation between the off-state current of a transistor and the inverse of substrate temperature (absolute temperature) at measurement of the off-state current. In FIG. 29, the horizontal axis represents a value (1000/T) obtained by multiplying an inverse of substrate temperature at measurement by 1000, for the sake of simplicity.

Specifically, as shown in FIG. 29, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively.

In order to prevent hydrogen and moisture from being contained in the oxide semiconductor film during formation thereof, it is naturally preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being contained in the film. In addition, it is preferable to use a target which is highly purified so as not to contain impurities such as hydrogen and moisture. Although it is possible to remove moisture from a film of an oxide semiconductor film containing In, Sn, and Zn as main components by heat treatment, a film which does not contain moisture originally is preferably formed because moisture is released from the oxide semiconductor film containing In, Sn, and Zn as main components at a higher temperature than from an oxide semiconductor film containing In, Ga, and Zn as main components.

The relation between the substrate temperature and electric characteristics of a transistor formed using Sample B, on which heat treatment at 650° C. was performed after formation of the oxide semiconductor film, was evaluated.

The transistor having the structure illustrated in FIG. 24A is used for the measurement. The transistor has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C.

Figure 30:
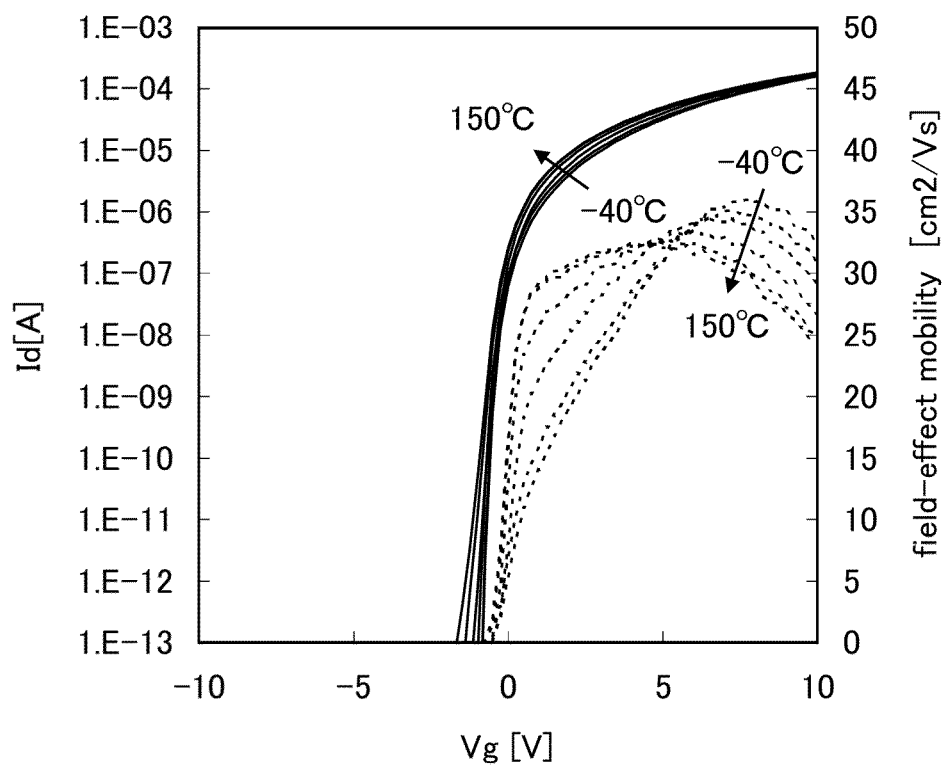
FIG. 30 shows characteristics of a transistor.
Figure 31A:
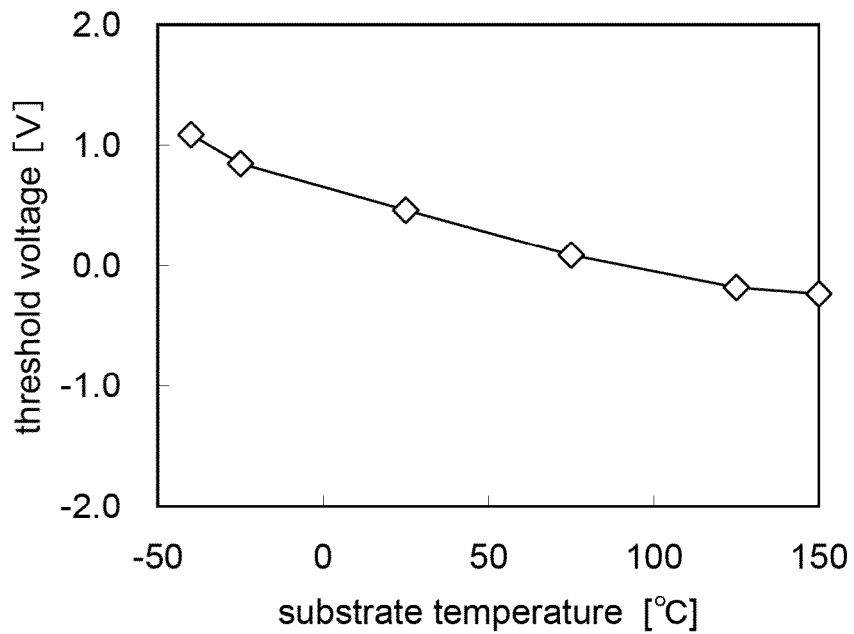
FIGS. 31A and 31B each show the relation between substrate temperature and field-effect mobility.

FIG. 30 shows the $V_g$ dependence of $I_d$ (solid line) and field-effect mobility (dotted line). FIG. 31A shows the relation between the substrate temperature and the threshold voltage, and FIG. 31B shows the relation between the substrate temperature and the field-effect mobility.

From FIG. 31A, it is found that the threshold voltage gets lower as the substrate temperature increases. Note that the threshold voltage is decreased from 1.09 V to −0.23 V in the range from −40° C. to 150° C.

Figure 31B:
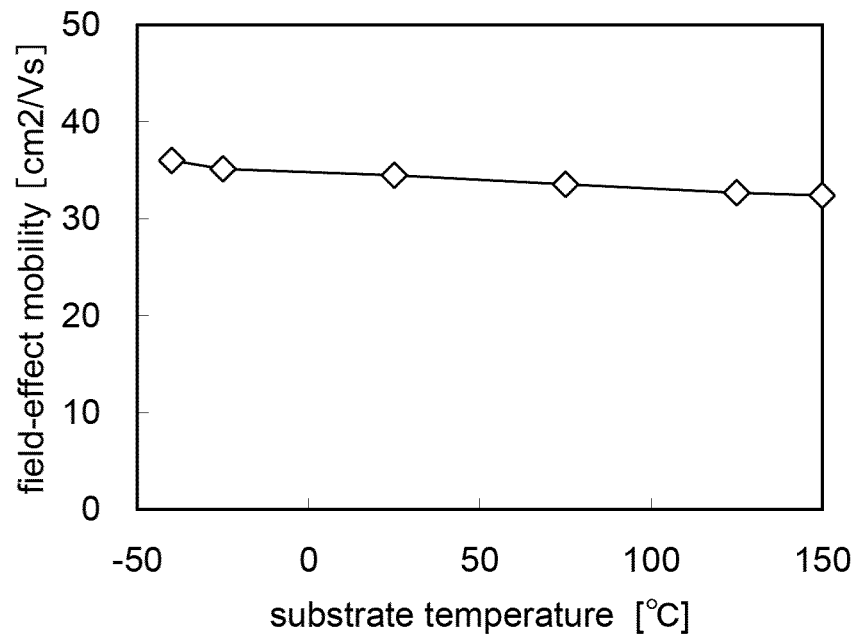

From FIG. 31B, it is found that the field-effect mobility gets lower as the substrate temperature increases. Note that the mobility is decreased from 36 cm²/Vs to 32 cm²/Vs in the range from −40° C. to 150° C. Thus, it is found that variation in electric characteristics is small in the above temperature range.

In a transistor in which such an oxide semiconductor containing In, Sn, and Zn as main components is used for a channel formation region, a field-effect mobility of 30 cm²/Vs or higher, preferably 40 cm²/Vs or higher, more preferably 60 cm²/Vs or higher can be obtained with the off-state current maintained at 1 aA/μm or lower, which makes it possible to achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. When a transistor with such characteristics is used as a transistor of a memory circuit, sufficiently high operation speed can be achieved.

This embodiment can be implemented in appropriate combination with any of the other embodiments.

(Embodiment 9)

In this embodiment, description will be given of an electronic device including the memory circuit according to one embodiment of the present invention so that power consumption is low. Particularly in the case of a portable electronic device which has difficulty in continuously receiving power, addition of the memory circuit with low power consumption according to one embodiment of the present invention as a component of the device makes it possible to obtain an advantage of increasing the continuous operation time.

The memory circuit according to one embodiment of the present invention can be used for a display device, a personal computer, or an image reproducing device provided with recording media (typically, a device which reproduces the content of recording media such as a digital versatile disc (DVD) and has a display for displaying the reproduced image). Other examples of electronic devices each of which can be provided with the memory circuit, according to one embodiment of the present invention, include a mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like.

Description will be given of the cases in which the memory circuit according to one embodiment of the present invention is applied to portable electronic devices such as a mobile phone, a smartphone, and an e-book reader, with reference to FIG. 14 and FIG. 15.

Figure 14:
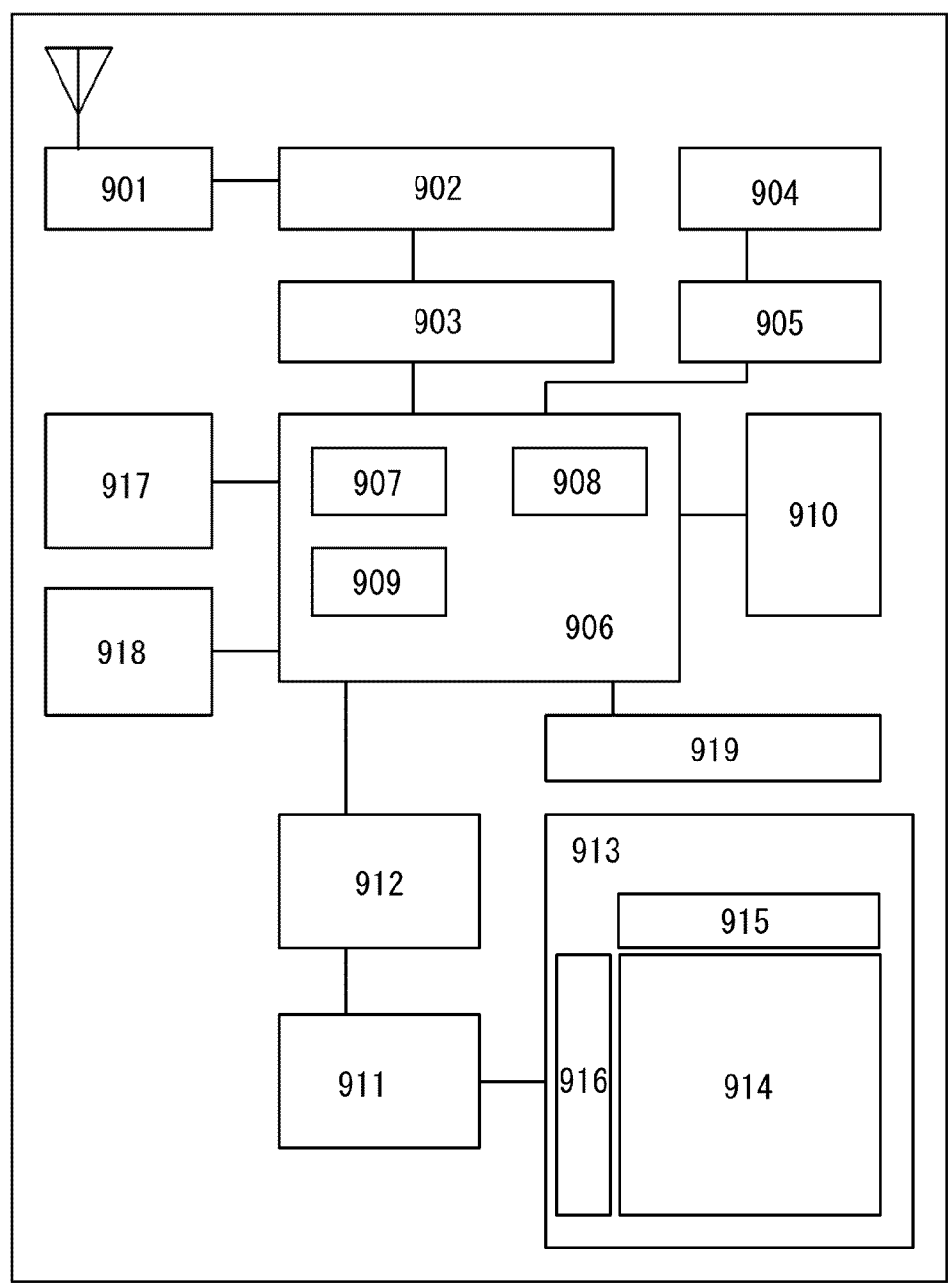
FIG. 14 is a block diagram of a portable electronic device.

FIG. 14 is a block diagram of a portable electronic device. The portable electronic device illustrated in FIG. 14 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. The use of the memory circuit described in the above embodiment for, for example, the CPU 907 allows reduction in power consumption.

Figure 15:
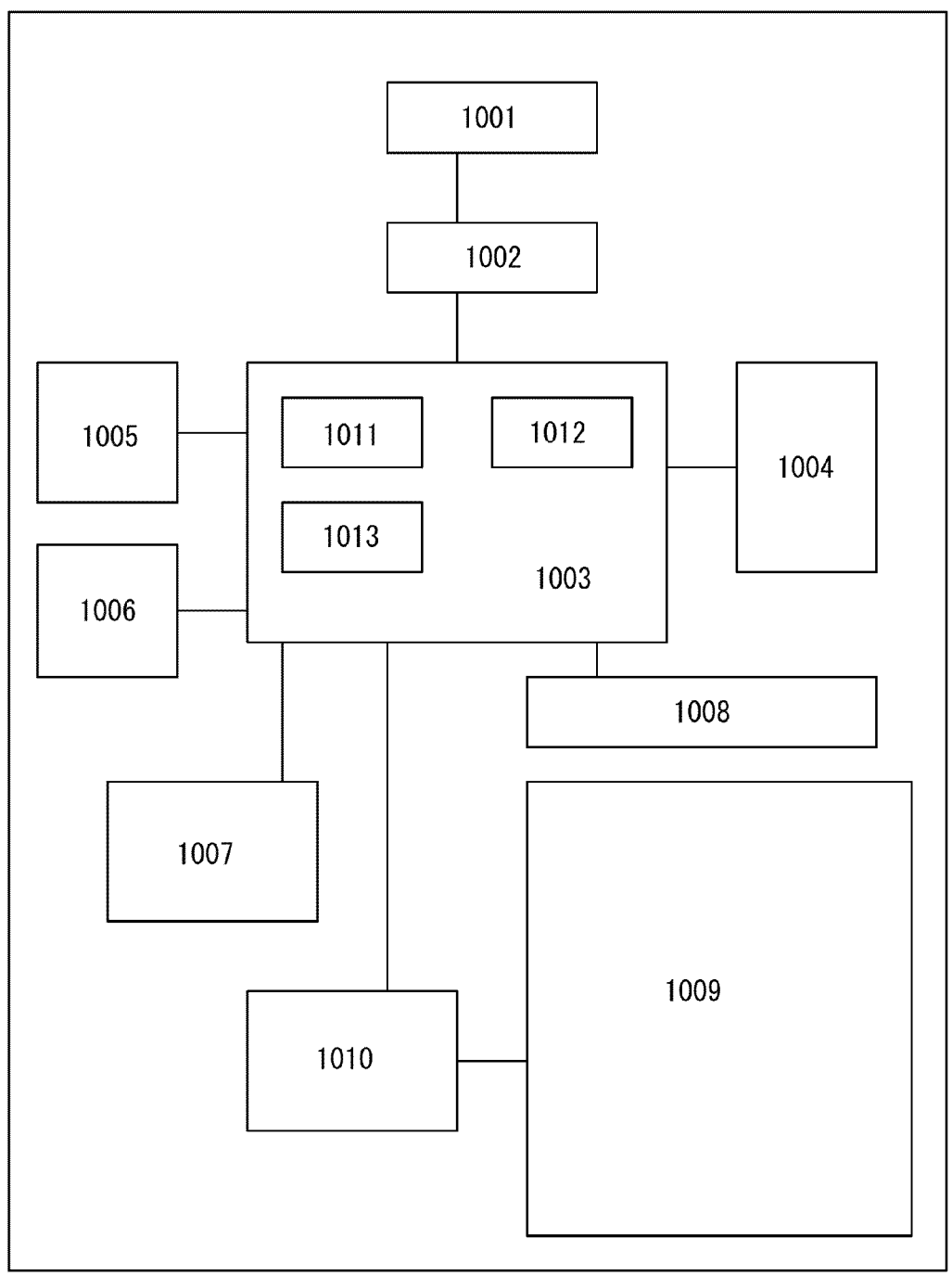
FIG. 15 is a block diagram of a portable electronic device.

FIG. 15 is a block diagram of an e-book reader. The electronic book reader includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010. The microprocessor 1003 includes a CPU 1011, a DSP 1012, and an interface 1013. Further, the use of the memory circuit described in the above embodiment for, for example, the CPU 1011 allows reduction in power consumption.

This embodiment can be implemented in appropriate combination with any of the other embodiments.

This application is based on Japanese Patent Application serial no. 2011-107831 filed with the Japan Patent Office on May 13, 2011, the entire contents of which are hereby incorporated by reference.

What is claimed is:

1. A memory circuit comprising:
a first memory circuit;
a second memory circuit;
a first switch;
a second switch; and
a phase inverter circuit,
wherein the first memory circuit comprises a first transistor, a second transistor, a third transistor, and a capacitor,
wherein the first transistor comprises an oxide semiconductor film,
wherein one of a source and a drain of the first transistor is connected to a first signal line, and the other of the source and the drain of the first transistor is connected to one electrode of the capacitor and a gate of the second transistor,
wherein the other electrode of the capacitor is grounded,
wherein a gate of the first transistor is connected to a second signal line,
wherein an input terminal of the phase inverter circuit is connected to the second signal line, and an output terminal of the phase inverter circuit is connected to an input terminal of the first switch,
wherein a first terminal of the phase inverter circuit is connected to a power supply line, and a second terminal of the phase inverter circuit is grounded,
wherein a first terminal of the first switch is connected to the power supply line, a second terminal of the first switch is connected to one of a source and a drain of the second transistor, and the other of the source and the drain of the second transistor is grounded,
wherein a gate of the third transistor is connected to a gate of the second transistor, one of a source and a drain of the third transistor is connected to the power supply line, and the other of the source and the drain of the third transistor is connected to an output terminal of the first switch, wherein a first terminal of the second switch is connected to the output terminal of the phase inverter circuit, and a second terminal of the second switch is connected to the second signal line, and wherein the output terminal of the first switch is connected to the second memory circuit through the second switch.

2. The memory circuit according to claim 1,
wherein the first transistor comprises an oxide semiconductor material containing In, Ga, and Zn.

3. The memory circuit according to claim 1,
wherein the first transistor comprises an oxide semiconductor material containing In, Sn, and Zn.

4. An electronic device comprising:
the memory circuit according to claim 1.

5. A memory circuit comprising:
a first memory circuit;
a second memory circuit;
a first switch;
a second switch; and
a phase inverter circuit,
wherein the first memory circuit comprises a first transistor, a capacitor, a second transistor, and a third transistor,
wherein the first switch comprises a fourth transistor and a fifth transistor,
wherein the first transistor comprises an oxide semiconductor,
wherein one of a source and a drain of the first transistor is connected to a first signal line, and the other of the source and the drain of the first transistor is connected to one electrode of the capacitor and a gate of the second transistor,
wherein the other electrode of the capacitor is grounded,
wherein a gate of the first transistor is connected to a second signal line,
wherein an input terminal of the phase inverter circuit is connected to the second signal line, and an output terminal of the phase inverter circuit is connected to a gate of the fourth transistor and a gate of the fifth transistor,
wherein a first terminal of the phase inverter circuit is connected to a power supply line, and a second terminal of the phase inverter circuit is grounded,
wherein one of a source and a drain of the fourth transistor is connected to the power supply line, the other of the source and the drain of the fourth transistor is connected to one of a source and a drain of the fifth transistor, the other of the source and the drain of the fifth transistor is connected to one of a source and a drain of the second transistor, and the other of the source and the drain of the second transistor is grounded,
wherein a gate of the third transistor is connected to a gate of the second transistor, one of a source and a drain of the third transistor is connected to the power supply line, and the other of the source and the drain of the third transistor is connected to the other of the source and the drain of the fourth transistor and the one of the source and the drain of the fifth transistor,
wherein a first terminal of the second switch is connected to the output terminal of the phase inverter circuit, and a second terminal of the second switch is connected to the second signal line, and
wherein the other of the source and the drain of the fourth transistor and the one of the source and the drain of the fifth transistor are connected to the second memory circuit through the second switch.

6. The memory circuit according to claim 5,
wherein the first transistor comprises an oxide semiconductor material containing In, Ga, and Zn.

7. The memory circuit according to claim 5,
wherein the first transistor comprises an oxide semiconductor material containing In, Sn, and Zn.

8. An electronic device comprising:
the memory circuit according to claim 5.

9. A memory circuit comprising:
a first transistor comprising an oxide semiconductor, wherein one of a source and a drain of the first transistor is electrically connected to a first signal line, and a gate of the first transistor is electrically connected to a second signal line;
a second transistor, wherein a gate of the second transistor is electrically connected to the other of the source and the drain of the first transistor, and one of a source and a drain of the second transistor is electrically connected to a first power supply line;
a third transistor, wherein a gate of the third transistor is electrically connected to the other of the source and the drain of the first transistor, and one of a source and a drain of the third transistor is electrically connected to a second power supply line;
a fourth transistor, wherein one of a source and a drain of the fourth transistor is electrically connected to the second power supply line;
a fifth transistor, wherein a gate of the fifth transistor is electrically connected to a gate of the fourth transistor, one of a source and a drain of the fifth transistor is electrically connected to the other of the source and the drain of the third transistor and the other of the source and the drain of the fourth transistor, and the other of the source and the drain of the fifth transistor is electrically connected to the other of the source and the drain of the second transistor; and
a capacitor, wherein one electrode of the capacitor is electrically connected to the other of the source and the drain of the first transistor, and the other electrode of the capacitor is electrically connected to the first power supply line.

10. The memory circuit according to claim 9,
wherein the first transistor comprises an oxide semiconductor material containing In, Ga, and Zn.

11. The memory circuit according to claim 9,
wherein the first transistor comprises an oxide semiconductor material containing In, Sn, and Zn.

12. The memory circuit according to claim 9, further comprising a switch and a memory circuit electrically connected to the other of the source and the drain of the third transistor through the switch.

13. The memory circuit according to claim 9, further comprising a phase inverter circuit electrically connected to the gate of the fourth transistor and the gate of the fifth transistor.

14. The memory circuit according to claim 9,
wherein the second transistor and the fourth transistor are n-channel transistors, and
wherein the third transistor and the fifth transistor are p-channel transistors.

15. An electronic device comprising:
the memory circuit according to claim 9.

* * * * *

UNITED STATES PATENT AND TRADEMARK OFFICE
CERTIFICATE OF CORRECTION

PATENT NO.        : 8,705,292 B2
APPLICATION NO.   : 13/466842
DATED             : April 22, 2014
INVENTOR(S)       : Masashi Fujita Page 1 of 1

It is certified that error appears in the above-identified patent and that said Letters Patent is hereby corrected as shown below:

In the Specification

Column 22, line 45, replace "In-Sn-In-Mg" with --In-Sn-Zn-O--;

Column 24, line 58, after "and" replace "1" with --l--;

Column 30, line 10, after "lower half" insert --.--;

Column 30, line 18, after "lower half" insert --.--;

Column 30, line 22, after "lower half" insert --.--;

Column 30, line 65, replace "In-Sn-In-Mg" with --In-Sn-Zn-O--;

Column 31, line 17, replace "In-Sn-In-Mg" with --In-Sn-Zn-O--;

Column 31, line 51, replace "In-Sn-In-Mg" with --In-Sn-Zn-O--;

Column 31, line 53, replace "In-Sn-In-Mg" with --In-Sn-Zn-O--;

Column 32, line 8, replace "In-Ga-In-Mg" with --In-Ga-Zn-O--;

Column 32, line 11, replace "In-Ga-In-Mg" with --In-Ga-Zn-O--;

Column 32, lines 35-36, replace "In-Ga-In-Mg" with --In-Ga-Zn-O--;

Column 46, line 52, replace "In-Sn-In-Mg" with --In-Sn-Zn-O--;

Column 49, line 47, replace "In-Sn-In-Mg" with --In-Sn-Zn-O--;

Column 49, line 54, replace "In-Sn-In-Mg" with --In-Sn-Zn-O--;

Column 49, line 57, replace "In-Sn-In-Mg" with --In-Sn-Zn-O--;

Column 49, line 59, replace "In-Sn-In-Mg" with --In-Sn-Zn-O--.

Signed and Sealed this
Twenty-fifth Day of November, 2014

Michelle K. Lee
*Deputy Director of the United States Patent and Trademark Office*